(12) United States Patent
Brych

(10) Patent No.: US 11,832,410 B2
(45) Date of Patent: Nov. 28, 2023

(54) MECHANICAL ENERGY ABSORBING BRACKET APPARATUS

(71) Applicant: PURE STORAGE, INC., Mountain View, CA (US)

(72) Inventor: Dominique Brych, Mountain View, CA (US)

(73) Assignee: PURE STORAGE, INC., Santa Clara, CA (US)

( * ) Notice: Subject to any disclaimer, the term of this patent is extended or adjusted under 35 U.S.C. 154(b) by 35 days.

(21) Appl. No.: 17/474,491

(22) Filed: Sep. 14, 2021

(65) Prior Publication Data

US 2023/0081851 A1 Mar. 16, 2023

(51) Int. Cl.
H05K 7/14 (2006.01)
H05K 1/02 (2006.01)
H04L 67/1097 (2022.01)

(52) U.S. Cl.
CPC .............. *H05K 7/14* (2013.01); *H05K 1/0271* (2013.01); *H04L 67/1097* (2013.01); *H05K 2201/2045* (2013.01)

(58) Field of Classification Search
CPC ....... G11B 33/124; F16F 15/04; F16F 15/022; F16F 15/00; H05K 1/0271; H05K 2201/2045; H05K 7/14
See application file for complete search history.

(56) References Cited

U.S. PATENT DOCUMENTS

| | | | |
|---|---|---|---|
| 4,030,000 A | * | 6/1977 | Stewart ................... H05K 7/142 174/138 D |
| 4,200,841 A | | 4/1980 | Nagata et al. |
| 5,390,327 A | | 2/1995 | Lubbers et al. |
| 5,479,653 A | | 12/1995 | Jones |
| 5,649,093 A | | 7/1997 | Hanko et al. |
| 5,715,193 A | | 2/1998 | Norman |
| 5,764,767 A | | 6/1998 | Beimel et al. |
| 5,912,595 A | | 6/1999 | Ma et al. |
| 5,920,501 A | | 7/1999 | Norman |
| 5,953,255 A | | 9/1999 | Lee |
| 6,182,214 B1 | | 1/2001 | Hardjono |
| 6,275,898 B1 | | 8/2001 | DeKoning |

(Continued)

FOREIGN PATENT DOCUMENTS

| | | |
|---|---|---|
| EP | 2164006 A2 | 3/2010 |
| WO | 2008157081 A2 | 12/2008 |
| WO | 2002013033 | 9/2013 |

OTHER PUBLICATIONS

Hwang et al., "RAID-x: A New Distributed Disk Array for I/O-Centric Cluster Computing," HPDC '00 Proceedings of the 9th IEEE International Symposium on High Performance Distributed Computing, IEEE, 2000, pp. 279-286.

(Continued)

*Primary Examiner* — James Wu

(57) ABSTRACT

An apparatus includes a body having one or more protrusions from a surface of the body, wherein each of the protrusions has a corresponding coupling positioned at a corresponding end of each of the protrusions. The apparatus further includes one or more mechanical energy storage components, wherein each of the one or more mechanical energy storage components provide a force that is greater than an external force exerted on the apparatus.

11 Claims, 18 Drawing Sheets

(56) References Cited

U.S. PATENT DOCUMENTS

| | | | |
|---|---|---|---|
| 6,535,417 B2 | 3/2003 | Tsuda et al. |
| 6,643,748 B1 | 11/2003 | Wieland |
| 6,725,392 B1 | 4/2004 | Frey et al. |
| 6,836,816 B2 | 12/2004 | Kendall |
| 6,859,112 B2 | 2/2005 | Mason |
| 6,985,995 B2 | 1/2006 | Holland et al. |
| 7,032,125 B2 | 4/2006 | Holt et al. |
| 7,051,155 B2 | 5/2006 | Talagala et al. |
| 7,065,617 B2 | 6/2006 | Wang |
| 7,069,383 B2 | 6/2006 | Yamamoto et al. |
| 7,076,606 B2 | 7/2006 | Orsley |
| 7,107,480 B1 | 9/2006 | Moshayedi et al. |
| 7,159,150 B2 | 1/2007 | Kenchammana-Hosekote et al. |
| 7,162,575 B2 | 1/2007 | Dalal et al. |
| 7,164,608 B2 | 1/2007 | Lee |
| 7,334,156 B2 | 2/2008 | Land et al. |
| 7,370,220 B1 | 5/2008 | Nguyen et al. |
| 7,424,498 B1 | 9/2008 | Patterson |
| 7,424,592 B1 | 9/2008 | Karr et al. |
| 7,444,532 B2 | 10/2008 | Masuyama et al. |
| 7,480,658 B2 | 1/2009 | Heinla et al. |
| 7,515,407 B2 * | 4/2009 | Goodman ............ G11B 33/124 |
| | | | 248/634 |
| 7,536,506 B2 | 5/2009 | Ashmore et al. |
| 7,558,859 B2 | 7/2009 | Kasiolas et al. |
| 7,565,446 B2 | 7/2009 | Talagala et al. |
| 7,613,947 B1 | 11/2009 | Coatney et al. |
| 7,619,932 B2 | 11/2009 | Jones et al. |
| 7,681,104 B1 | 3/2010 | Sim-Tang et al. |
| 7,681,105 B1 | 3/2010 | Sim-Tang et al. |
| 7,730,258 B1 | 6/2010 | Smith et al. |
| 7,743,276 B2 | 6/2010 | Jacobson et al. |
| 7,757,038 B2 | 7/2010 | Kitahara |
| 7,778,960 B1 | 8/2010 | Chatterjee et al. |
| 7,814,272 B2 | 10/2010 | Barrall et al. |
| 7,814,273 B2 | 10/2010 | Barrall |
| 7,818,531 B2 | 10/2010 | Barrall |
| 7,827,351 B2 | 11/2010 | Suetsugu et al. |
| 7,827,439 B2 | 11/2010 | Mathew et al. |
| 7,870,105 B2 | 1/2011 | Arakawa et al. |
| 7,885,938 B1 | 2/2011 | Greene et al. |
| 7,886,111 B2 | 2/2011 | Klemm et al. |
| 7,908,448 B1 | 3/2011 | Chatterjee et al. |
| 7,916,538 B2 | 3/2011 | Jeon et al. |
| 7,941,697 B2 | 5/2011 | Mathew et al. |
| 7,958,303 B2 | 6/2011 | Shuster |
| 7,971,129 B2 | 6/2011 | Watson et al. |
| 7,991,822 B2 | 8/2011 | Bish et al. |
| 8,010,485 B1 | 8/2011 | Chatterjee et al. |
| 8,010,829 B1 | 8/2011 | Chatterjee et al. |
| 8,020,047 B2 | 9/2011 | Courtney |
| 8,046,548 B1 | 10/2011 | Chatterjee et al. |
| 8,051,361 B2 | 11/2011 | Sim-Tang et al. |
| 8,051,362 B2 | 11/2011 | Li et al. |
| 8,060,798 B2 | 11/2011 | Roohparvar et al. |
| 8,082,393 B2 | 12/2011 | Galloway et al. |
| 8,086,634 B2 | 12/2011 | Mimatsu |
| 8,086,911 B1 | 12/2011 | Taylor |
| 8,090,837 B2 | 1/2012 | Shin et al. |
| 8,108,502 B2 | 1/2012 | Tabbara et al. |
| 8,117,388 B2 | 2/2012 | Jernigan, IV |
| 8,120,959 B2 | 2/2012 | Lee et al. |
| 8,140,821 B1 | 3/2012 | Raizen et al. |
| 8,145,736 B1 | 3/2012 | Tewari et al. |
| 8,145,838 B1 | 3/2012 | Miller et al. |
| 8,145,840 B2 | 3/2012 | Koul et al. |
| 8,176,360 B2 | 5/2012 | Frost et al. |
| 8,180,855 B2 | 5/2012 | Aiello et al. |
| 8,200,922 B2 | 6/2012 | McKean et al. |
| 8,225,006 B1 | 7/2012 | Karamcheti |
| 8,239,618 B2 | 8/2012 | Kotzur et al. |
| 8,244,999 B1 | 8/2012 | Chatterjee et al. |
| 8,305,811 B2 | 11/2012 | Jeon |
| 8,315,999 B2 | 11/2012 | Chatley et al. |
| 8,316,173 B2 | 11/2012 | Hetzler et al. |
| 8,327,080 B1 | 12/2012 | Der |
| 8,351,290 B1 | 1/2013 | Huang et al. |
| 8,375,146 B2 | 2/2013 | Sinclair |
| 8,397,016 B2 | 3/2013 | Talagala et al. |
| 8,402,152 B2 | 3/2013 | Duran |
| 8,412,880 B2 | 4/2013 | Eibowitz et al. |
| 8,423,739 B2 | 4/2013 | Ash et al. |
| 8,429,436 B2 | 4/2013 | Fillingim et al. |
| 8,473,778 B2 | 6/2013 | Simitci et al. |
| 8,479,037 B1 | 7/2013 | Chatterjee et al. |
| 8,498,967 B1 | 7/2013 | Chatterjee et al. |
| 8,522,073 B2 | 8/2013 | Cohen |
| 8,533,527 B2 | 9/2013 | Daikokuya et al. |
| 8,544,029 B2 | 9/2013 | Bakke et al. |
| 8,589,625 B2 | 11/2013 | Colgrove et al. |
| 8,595,455 B2 | 11/2013 | Chatterjee et al. |
| 8,615,599 B1 | 12/2013 | Takefman et al. |
| 8,627,136 B2 | 1/2014 | Shankar et al. |
| 8,627,138 B1 | 1/2014 | Clark et al. |
| 8,638,602 B1 | 1/2014 | Horn |
| 8,660,131 B2 | 2/2014 | Vermunt et al. |
| 8,661,218 B1 | 2/2014 | Piszczek et al. |
| 8,694,719 B2 | 4/2014 | Lassa et al. |
| 8,700,875 B1 | 4/2014 | Barron et al. |
| 8,706,694 B2 | 4/2014 | Chatterjee et al. |
| 8,706,914 B2 | 4/2014 | Duchesneau |
| 8,707,112 B2 | 4/2014 | Roohparvar et al. |
| 8,713,405 B2 | 4/2014 | Healey, Jr. et al. |
| 8,725,730 B2 | 5/2014 | Keeton et al. |
| 8,737,136 B2 | 5/2014 | Cometti |
| 8,756,387 B2 | 6/2014 | Frost et al. |
| 8,762,793 B2 | 6/2014 | Grube et al. |
| 8,773,903 B2 | 7/2014 | Lee et al. |
| 8,775,868 B2 | 7/2014 | Colgrove et al. |
| 8,782,881 B2 * | 7/2014 | Rummler ............ H05K 5/0069 |
| | | | 29/842 |
| 8,788,913 B1 | 7/2014 | Xin et al. |
| 8,799,746 B2 | 8/2014 | Baker et al. |
| 8,819,311 B2 | 8/2014 | Liao |
| 8,819,383 B1 | 8/2014 | Jobanputra et al. |
| 8,819,503 B2 | 8/2014 | Melik-Martirosian |
| 8,824,261 B1 | 9/2014 | Miller et al. |
| 8,838,883 B2 | 9/2014 | DAbreu et al. |
| 8,843,700 B1 | 9/2014 | Salessi et al. |
| 8,850,108 B1 | 9/2014 | Hayes et al. |
| 8,850,288 B1 | 9/2014 | Lazier et al. |
| 8,856,593 B2 | 10/2014 | Eckhardt et al. |
| 8,856,619 B1 | 10/2014 | Cypher |
| 8,862,847 B2 | 10/2014 | Feng et al. |
| 8,862,928 B2 | 10/2014 | Xavier et al. |
| 8,868,825 B1 | 10/2014 | Hayes et al. |
| 8,874,836 B1 | 10/2014 | Hayes et al. |
| 8,886,778 B2 | 11/2014 | Nedved et al. |
| 8,898,383 B2 | 11/2014 | Yamamoto et al. |
| 8,898,388 B1 | 11/2014 | Kimmel |
| 8,904,231 B2 | 12/2014 | Coatney et al. |
| 8,918,478 B2 | 12/2014 | Ozzie et al. |
| 8,930,307 B2 | 1/2015 | Colgrove et al. |
| 8,930,633 B2 | 1/2015 | Amit et al. |
| 8,949,502 B2 | 2/2015 | McKnight et al. |
| 8,959,110 B2 | 2/2015 | Smith et al. |
| 8,966,343 B2 | 2/2015 | Syu et al. |
| 8,972,818 B2 | 3/2015 | Strauss et al. |
| 8,977,597 B2 | 3/2015 | Ganesh et al. |
| 9,003,144 B1 | 4/2015 | Hayes et al. |
| 9,009,724 B2 | 4/2015 | Gold et al. |
| 9,021,053 B2 | 4/2015 | Bernbo et al. |
| 9,021,215 B2 | 4/2015 | Meir et al. |
| 9,025,393 B2 | 5/2015 | Wu et al. |
| 9,043,372 B2 | 5/2015 | Makkar et al. |
| 9,053,808 B2 | 6/2015 | Sprouse et al. |
| 9,058,155 B2 | 6/2015 | Cepulis et al. |
| 9,116,819 B2 | 8/2015 | Cope et al. |
| 9,117,536 B2 | 8/2015 | Yoon et al. |
| 9,122,401 B2 | 9/2015 | Zaltsman et al. |
| 9,134,908 B2 | 9/2015 | Horn et al. |
| 9,153,337 B2 | 10/2015 | Sutardja |
| 9,158,612 B2 | 10/2015 | Roohparvar et al. |
| 9,171,627 B2 | 10/2015 | Lee et al. |

(56) References Cited

U.S. PATENT DOCUMENTS

| | | |
|---|---|---|
| 9,189,650 B2 | 11/2015 | Jaye et al. |
| 9,201,733 B2 | 12/2015 | Verma et al. |
| 9,207,876 B2 | 12/2015 | Shu et al. |
| 9,251,066 B2 | 2/2016 | Colgrove et al. |
| 9,274,893 B2 | 3/2016 | Chen |
| 9,304,856 B2 | 4/2016 | Tressler et al. |
| 9,323,667 B2 | 4/2016 | Bennett |
| 9,323,681 B2 | 4/2016 | Apostolides et al. |
| 9,348,538 B2 | 5/2016 | Mallaiah et al. |
| 9,384,082 B1 | 7/2016 | Lee et al. |
| 9,390,019 B2 | 7/2016 | Patterson et al. |
| 9,405,478 B2 | 8/2016 | Koseki et al. |
| 9,412,471 B2 | 8/2016 | Kim et al. |
| 9,432,541 B2 | 8/2016 | Ishida |
| 9,477,632 B2 | 10/2016 | Du |
| 9,552,299 B2 | 1/2017 | Stalzer |
| 9,613,704 B2 | 4/2017 | Lee |
| 9,720,754 B2 | 8/2017 | Karakulak et al. |
| 9,785,357 B2 | 10/2017 | Raghu et al. |
| 9,792,998 B1 | 10/2017 | Yang et al. |
| 9,818,478 B2 | 11/2017 | Chung |
| 9,829,066 B2 | 11/2017 | Thomas et al. |
| 9,857,992 B2 | 1/2018 | Pangal et al. |
| 9,934,872 B2 | 4/2018 | Magia et al. |
| 9,972,396 B1 | 5/2018 | Naik et al. |
| 10,073,626 B2 | 9/2018 | Karamcheti et al. |
| 10,191,662 B2 | 1/2019 | Brennan et al. |
| 10,223,028 B2 | 3/2019 | Gorobets et al. |
| 10,283,205 B2 | 5/2019 | Malshe et al. |
| 10,296,231 B2 | 5/2019 | Tsou et al. |
| 10,347,330 B2 | 7/2019 | Zeng et al. |
| 10,347,344 B2 | 7/2019 | Malshe et al. |
| 10,430,376 B1 | 10/2019 | Armangau et al. |
| 10,482,983 B2 | 11/2019 | Alhussien et al. |
| 10,489,075 B2 | 11/2019 | Choi et al. |
| 10,521,287 B2 | 12/2019 | Khoueir et al. |
| 10,521,353 B2 | 12/2019 | Lim |
| 2002/0144059 A1 | 10/2002 | Kendall |
| 2003/0105984 A1 | 6/2003 | Masuyama et al. |
| 2003/0110205 A1 | 6/2003 | Johnson |
| 2003/0231072 A1 | 12/2003 | Mason |
| 2004/0161086 A1 | 8/2004 | Buntin et al. |
| 2005/0001652 A1 | 1/2005 | Malik et al. |
| 2005/0076228 A1 | 4/2005 | Davis et al. |
| 2005/0235132 A1 | 10/2005 | Karr et al. |
| 2005/0273310 A1 | 12/2005 | Newburn |
| 2005/0278460 A1 | 12/2005 | Shin et al. |
| 2005/0283649 A1 | 12/2005 | Turner et al. |
| 2006/0015683 A1 | 1/2006 | Ashmore et al. |
| 2006/0061954 A1* | 3/2006 | Lam .................. G06F 1/184 361/679.35 |
| 2006/0114930 A1 | 6/2006 | Lucas et al. |
| 2006/0143648 A1 | 6/2006 | Shinokawa |
| 2006/0174157 A1 | 8/2006 | Barrall et al. |
| 2006/0248294 A1 | 11/2006 | Nedved et al. |
| 2007/0079068 A1 | 4/2007 | Draggon |
| 2007/0214194 A1 | 9/2007 | Reuter |
| 2007/0214314 A1 | 9/2007 | Reuter |
| 2007/0234016 A1 | 10/2007 | Davis et al. |
| 2007/0268905 A1 | 11/2007 | Baker et al. |
| 2007/0285986 A1 | 12/2007 | Eguchi et al. |
| 2008/0080709 A1 | 4/2008 | Michtchenko et al. |
| 2008/0095375 A1 | 4/2008 | Tateoka et al. |
| 2008/0107274 A1 | 5/2008 | Worthy |
| 2008/0133851 A1 | 6/2008 | Miyazaki et al. |
| 2008/0155191 A1 | 6/2008 | Anderson et al. |
| 2008/0295118 A1 | 11/2008 | Liao |
| 2009/0043958 A1 | 2/2009 | Kaneda et al. |
| 2009/0077208 A1 | 3/2009 | Nguyen et al. |
| 2009/0138654 A1 | 5/2009 | Sutardja |
| 2009/0216910 A1 | 8/2009 | Duchesneau |
| 2009/0216920 A1 | 8/2009 | Lauterbach et al. |
| 2010/0017444 A1 | 1/2010 | Chatterjee et al. |
| 2010/0017650 A1 | 1/2010 | Chin et al. |
| 2010/0042636 A1 | 2/2010 | Lu |
| 2010/0094806 A1 | 4/2010 | Apostolides et al. |
| 2010/0115070 A1 | 5/2010 | Missimilly |
| 2010/0125695 A1 | 5/2010 | Wu et al. |
| 2010/0162076 A1 | 6/2010 | Sim-Tang et al. |
| 2010/0169707 A1 | 7/2010 | Mathew et al. |
| 2010/0174576 A1 | 7/2010 | Naylor |
| 2010/0268908 A1 | 10/2010 | Ouyang et al. |
| 2010/0293420 A1 | 11/2010 | Kapil et al. |
| 2010/0312915 A1 | 12/2010 | Marowsky-Bree et al. |
| 2011/0035540 A1 | 2/2011 | Fitzgerald et al. |
| 2011/0040925 A1 | 2/2011 | Frost et al. |
| 2011/0060927 A1 | 3/2011 | Fillingim et al. |
| 2011/0119462 A1 | 5/2011 | Leach et al. |
| 2011/0219170 A1 | 9/2011 | Frost et al. |
| 2011/0238625 A1 | 9/2011 | Hamaguchi et al. |
| 2011/0264843 A1 | 10/2011 | Haines et al. |
| 2011/0302369 A1 | 12/2011 | Goto et al. |
| 2011/0320688 A1 | 12/2011 | Lee et al. |
| 2012/0011398 A1 | 1/2012 | Eckhardt et al. |
| 2012/0030529 A1 | 2/2012 | Roohparvar et al. |
| 2012/0079318 A1 | 3/2012 | Colgrove et al. |
| 2012/0110249 A1 | 5/2012 | Jeong et al. |
| 2012/0131253 A1 | 5/2012 | McKnight et al. |
| 2012/0150826 A1 | 6/2012 | Vijayan Retnamma et al. |
| 2012/0158923 A1 | 6/2012 | Mohamed et al. |
| 2012/0191900 A1 | 7/2012 | Kunimatsu et al. |
| 2012/0198152 A1 | 8/2012 | Terry et al. |
| 2012/0198261 A1 | 8/2012 | Brown et al. |
| 2012/0209943 A1 | 8/2012 | Jung |
| 2012/0226934 A1 | 9/2012 | Rao |
| 2012/0239976 A1 | 9/2012 | Cometti et al. |
| 2012/0239991 A1 | 9/2012 | Melik-Martirosian |
| 2012/0246435 A1 | 9/2012 | Meir et al. |
| 2012/0260055 A1 | 10/2012 | Murase |
| 2012/0284587 A1 | 11/2012 | Yu et al. |
| 2012/0311557 A1 | 12/2012 | Resch |
| 2013/0022201 A1 | 1/2013 | Glew et al. |
| 2013/0036314 A1 | 2/2013 | Glew et al. |
| 2013/0042056 A1 | 2/2013 | Shats et al. |
| 2013/0060884 A1 | 3/2013 | Bernbo et al. |
| 2013/0067188 A1 | 3/2013 | Mehra et al. |
| 2013/0073894 A1 | 3/2013 | Xavier et al. |
| 2013/0124776 A1 | 5/2013 | Hallak et al. |
| 2013/0132800 A1 | 5/2013 | Healey, Jr. et al. |
| 2013/0151653 A1 | 6/2013 | Sawicki et al. |
| 2013/0151771 A1 | 6/2013 | Tsukahara et al. |
| 2013/0173853 A1 | 7/2013 | Ungureanu et al. |
| 2013/0185612 A1 | 7/2013 | Lee et al. |
| 2013/0238554 A1 | 9/2013 | Yucel et al. |
| 2013/0259234 A1 | 10/2013 | Acar et al. |
| 2013/0262758 A1 | 10/2013 | Smith et al. |
| 2013/0339314 A1 | 12/2013 | Carpentier et al. |
| 2013/0339635 A1 | 12/2013 | Amit et al. |
| 2013/0339818 A1 | 12/2013 | Baker et al. |
| 2014/0006688 A1 | 1/2014 | Yu et al. |
| 2014/0040535 A1 | 2/2014 | Lee et al. |
| 2014/0040683 A1 | 2/2014 | Roohparvar et al. |
| 2014/0040702 A1 | 2/2014 | He et al. |
| 2014/0047263 A1 | 2/2014 | Coatney et al. |
| 2014/0047269 A1 | 2/2014 | Kim |
| 2014/0059405 A1 | 2/2014 | Syu et al. |
| 2014/0063721 A1 | 3/2014 | Herman et al. |
| 2014/0064048 A1 | 3/2014 | Cohen et al. |
| 2014/0068224 A1 | 3/2014 | Fan et al. |
| 2014/0075252 A1 | 3/2014 | Luo et al. |
| 2014/0101511 A1 | 4/2014 | Strauss et al. |
| 2014/0136880 A1 | 5/2014 | Shankar et al. |
| 2014/0164881 A1 | 6/2014 | Chen et al. |
| 2014/0181402 A1 | 6/2014 | White |
| 2014/0237164 A1 | 8/2014 | Le et al. |
| 2014/0279936 A1 | 9/2014 | Bernbo et al. |
| 2014/0280025 A1 | 9/2014 | Eidson et al. |
| 2014/0281770 A1 | 9/2014 | Kim et al. |
| 2014/0289588 A1 | 9/2014 | Nagadomi et al. |
| 2014/0359202 A1 | 12/2014 | Sun et al. |
| 2014/0359346 A1 | 12/2014 | Chen |
| 2014/0380125 A1 | 12/2014 | Calder et al. |
| 2014/0380126 A1 | 12/2014 | Yekhanin et al. |
| 2015/0032720 A1 | 1/2015 | James |

(56) References Cited

U.S. PATENT DOCUMENTS

| | | |
|---|---|---|
| 2015/0039645 A1 | 2/2015 | Lewis |
| 2015/0039849 A1 | 2/2015 | Lewis |
| 2015/0089283 A1 | 3/2015 | Kermarrec et al. |
| 2015/0089623 A1 | 3/2015 | Sondhi et al. |
| 2015/0100746 A1 | 4/2015 | Rychlik et al. |
| 2015/0134824 A1 | 5/2015 | Mickens et al. |
| 2015/0153800 A1 | 6/2015 | Lucas et al. |
| 2015/0180714 A1 | 6/2015 | Chunn et al. |
| 2015/0199232 A1 | 7/2015 | Tressler et al. |
| 2015/0280959 A1 | 10/2015 | Vincent |
| 2016/0070474 A1 | 3/2016 | Yu et al. |
| 2016/0125956 A1 | 5/2016 | Magia et al. |
| 2016/0147582 A1 | 5/2016 | Karakulak et al. |
| 2016/0179597 A1 | 6/2016 | Gorobets et al. |
| 2016/0357458 A1 | 12/2016 | Pangal et al. |
| 2017/0109040 A1 | 4/2017 | Raghu et al. |
| 2017/0123699 A1 | 5/2017 | Ohyama et al. |
| 2017/0235673 A1 | 8/2017 | Patel et al. |
| 2017/0287568 A1 | 10/2017 | Yang et al. |
| 2018/0373437 A1 | 12/2018 | Navon et al. |
| 2019/0042343 A1 | 2/2019 | Khoueir et al. |
| 2019/0056994 A1 | 2/2019 | Shulkin et al. |
| 2019/0066802 A1 | 2/2019 | Malshe et al. |
| 2019/0103164 A1 | 4/2019 | Malshe et al. |
| 2019/0237146 A1 | 8/2019 | Malshe et al. |
| 2019/0295660 A1 | 9/2019 | Malshe et al. |

OTHER PUBLICATIONS

International Search Report and the Written Opinion of the International Searching Authority, PCT/US2016/024391, dated Jul. 12, 2016.

International Search Report, PCT/US2015/034291, dated Sep. 30, 2015.

Kim et al., "Data Access Frequency based Data Replication Method using Erasure Codes in Cloud Storage System," Journal of the Institute of Electronics and Information Engineers, Feb. 2014, vol. 51, No. 2, pp. 85-91.

* cited by examiner

MECHANICAL ENERGY ABSORBING BRACKET APPARATUS

BACKGROUND

Storage systems, such as enterprise storage systems, may include a centralized or decentralized repository for data that provides common data management, data protection, and data sharing functions, for example, through connections to computer systems.

DETAILED DESCRIPTION

Figure 1A:
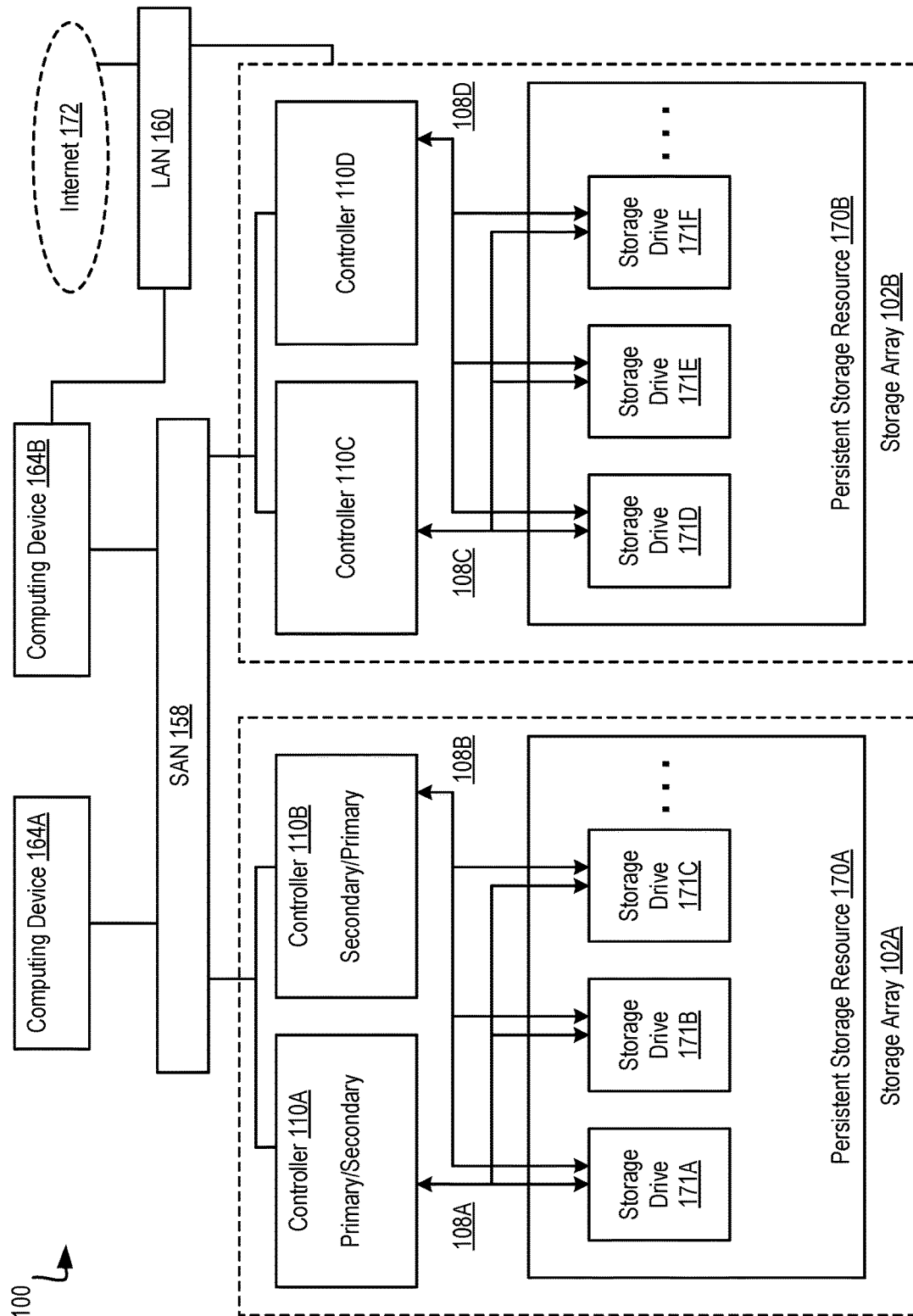
FIG. 1A illustrates a first example system for data storage in accordance with some implementations.

A computer system may include one or more printed circuit boards (PCBs) that may be coupled to a chassis of the computer system. For example, a storage system may include one or more chassis that each include one or more PCBs. The PCBs may include multiple integrated components, such as surface mounted components, as well as solder joints that physically and electrically couple the components to the PCB substrate. The chassis may serve as a structure to which the PCBs are mounted to provide rigidity and to protect the components of the PCBs from external forces.

The components and solder joints of the PCBs may be sensitive to these external forces and excessive amounts of external force being applied to the PCBs may result in damage to one or more of the components and/or the solder joints of the PCBs. For example, excessive shock or vibration forces being exerted on the PCBs may damage the components or break the solder joints, rendering the PCBs inoperable. To minimize the external forces that are experienced by the PCBs, the PCBs may be tightly coupled to the chassis so that the PCBs are not loose and do not jiggle when the computer system is subject to external forces.

In a conventional computer system, screws and nuts may be used to couple the PCBs to the chassis. However, as computer systems continue to get smaller, it becomes increasingly difficult to use the tools needed to secure the PCBs to the chassis using screws and nuts, and in some cases the use of tools may not be possible at all. Furthermore, as computer systems continue to get smaller, the size of the screws and nuts that may be used must also decrease in size. The smaller screws and nuts may be difficult to handle by an assembler of the computer system, which may result in these pieces being dropped into inaccessible areas of the computer system during assembly and decrease the manufacturability of the computer system.

In some conventional computer systems, brackets may be used to couple the PCBs to the chassis instead of screws and nuts (or other types of couplings). The bracket may be formed of a rigid material that is inserted through an opening in the PCB and the chassis to couple the PCB to the chassis and may be used to couple the PCB to the chassis without tooling. However, because the bracket is formed of a rigid material, the dimensions of the bracket cannot be adjusted to compensate for the differences in thickness of the PCB and/or chassis due to manufacturing tolerances. This may result in a PCB being loose or jiggling when coupled to the chassis, increasing the amount of external force experience by the PCB.

Aspects of the disclosure remedy the above and other deficiencies by providing a bracket that includes one or more mechanical energy absorbing components. The bracket may include one or more protrusions that each have a coupling, such as a pressure fit coupling, that are inserted through corresponding openings of a PCB and a chassis of a computer system. The bracket may also include one or more mechanical energy absorbing components to absorb mechanical energy exerted on the bracket, the PCB, and the chassis by external forces. The one or more mechanical energy absorbing components may also exert a force on the PCB and chassis to compensate for the differences in the thicknesses of the PCB and/or chassis, reducing or eliminating any jiggling of the PCB while it is coupled to the chassis.

In some embodiments, the mechanical energy absorbing component may be a leaf spring that is integrated into the body of the bracket. In an embodiment, the mechanical energy absorbing component may be one or more helical springs that are positioned on each of the one or more protrusions. In embodiments, the mechanical energy absorbing component may have a force value that is greater than the maximum external force that is to be exerted on the bracket, PCB, and/or the chassis. By having the force value being greater than the maximum external force, the bracket will reduce or eliminate any jiggling or movement of the PCB when the computer system is subject to an external force. For example, the force value of the mechanical energy absorbing component may be greater than a maximum vibration force that may be experienced by computer system, which prevents the PCB from jiggling when the maximum vibration force is applied to the computer system.

By providing a bracket with mechanical energy absorbing components, the coupling of the PCB to the chassis can be performed quickly and easily without the use of tools, improving the manufacturability of the computer system. Furthermore, the integration of one or more mechanical energy absorbing components reduces the external forces experienced by the PCB, which reduces the chances of a component and/or solder joint on the PCB becoming damaged from these external forces, improving the performance and reliability of the storage system.

Example methods, apparatus, and products for incorporation of a mechanical energy absorbing bracket in accordance with embodiments of the present disclosure are described with reference to the accompanying drawings, beginning with FIG. 1A. FIG. 1A illustrates an example system for data storage, in accordance with some implementations. System 100 (also referred to as "storage system" herein) includes numerous elements for purposes of illustration rather than limitation. It may be noted that system 100 may include the same, more, or fewer elements configured in the same or different manner in other implementations.

System 100 includes a number of computing devices 164A-B. Computing devices (also referred to as "client devices" herein) may be embodied, for example, a server in a data center, a workstation, a personal computer, a notebook, or the like. Computing devices 164A-B may be coupled for data communications to one or more storage arrays 102A-B through a storage area network ('SAN') 158 or a local area network ('LAN') 160.

The SAN 158 may be implemented with a variety of data communications fabrics, devices, and protocols. For example, the fabrics for SAN 158 may include Fibre Channel, Ethernet, Infiniband, Serial Attached Small Computer System Interface ('SAS'), or the like. Data communications protocols for use with SAN 158 may include Advanced Technology Attachment ('ATA'), Fibre Channel Protocol, Small Computer System Interface ('SCSI'), Internet Small Computer System Interface ('iSCSI'), HyperSCSI, Non-Volatile Memory Express ('NVMe') over Fabrics, or the like. It may be noted that SAN 158 is provided for illustration, rather than limitation. Other data communication couplings may be implemented between computing devices 164A-B and storage arrays 102A-B.

The LAN 160 may also be implemented with a variety of fabrics, devices, and protocols. For example, the fabrics for LAN 160 may include Ethernet (802.3), wireless (802.11), or the like. Data communication protocols for use in LAN 160 may include Transmission Control Protocol ('TCP'), User Datagram Protocol ('UDP'), Internet Protocol ('IP'), HyperText Transfer Protocol ('HTTP'), Wireless Access Protocol ('WAP'), Handheld Device Transport Protocol ('HDTP'), Session Initiation Protocol ('SIP'), Real Time Protocol ('RTP'), or the like.

Storage arrays 102A-B may provide persistent data storage for the computing devices 164A-B. Storage array 102A may be contained in a chassis (not shown), and storage array 102B may be contained in another chassis (not shown), in implementations. Storage array 102A and 102B may include one or more storage array controllers 110A-D (also referred to as "controller" herein). A storage array controller 110A-D may be embodied as a module of automated computing machinery comprising computer hardware, computer software, or a combination of computer hardware and software. In some implementations, the storage array controllers 110A-D may be configured to carry out various storage tasks. Storage tasks may include writing data received from the computing devices 164A-B to storage array 102A-B, erasing data from storage array 102A-B, retrieving data from storage array 102A-B and providing data to computing devices 164A-B, monitoring and reporting of disk utilization and performance, performing redundancy operations, such as Redundant Array of Independent Drives ('RAID') or RAID-like data redundancy operations, compressing data, encrypting data, and so forth.

Storage array controller 110A-D may be implemented in a variety of ways, including as a Field Programmable Gate Array ('FPGA'), a Programmable Logic Chip ('PLC'), an Application Specific Integrated Circuit ('ASIC'), System-on-Chip ('SOC'), or any computing device that includes discrete components such as a processing device, central processing unit, computer memory, or various adapters. Storage array controller 110A-D may include, for example, a data communications adapter configured to support communications via the SAN 158 or LAN 160. In some implementations, storage array controller 110A-D may be independently coupled to the LAN 160. In implementations, storage array controller 110A-D may include an I/O controller or the like that couples the storage array controller 110A-D for data communications, through a midplane (not shown), to a persistent storage resource 170A-B (also referred to as a "storage resource" herein). The persistent storage resource 170A-B main include any number of storage drives 171A-F (also referred to as "storage devices" herein) and any number of non-volatile Random Access Memory ('NVRAM') devices (not shown).

In some implementations, the NVRAM devices of a persistent storage resource 170A-B may be configured to receive, from the storage array controller 110A-D, data to be stored in the storage drives 171A-F. In some examples, the data may originate from computing devices 164A-B. In some examples, writing data to the NVRAM device may be carried out more quickly than directly writing data to the storage drive 171A-F. In implementations, the storage array controller 110A-D may be configured to utilize the NVRAM devices as a quickly accessible buffer for data destined to be written to the storage drives 171A-F. Latency for write requests using NVRAM devices as a buffer may be improved relative to a system in which a storage array controller 110A-D writes data directly to the storage drives 171A-F. In some implementations, the NVRAM devices may be implemented with computer memory in the form of high bandwidth, low latency RAM. The NVRAM device is referred to as "non-volatile" because the NVRAM device may receive or include a unique power source that maintains the state of the RAM after main power loss to the NVRAM device. Such a power source may be a battery, one or more capacitors, or the like. In response to a power loss, the NVRAM device may be configured to write the contents of the RAM to a persistent storage, such as the storage drives 171A-F.

In implementations, storage drive 171A-F may refer to any device configured to record data persistently, where "persistently" or "persistent" refers as to a device's ability to maintain recorded data after loss of power. In some implementations, storage drive 171A-F may correspond to non-disk storage media. For example, the storage drive 171A-F may be one or more solid-state drives ('SSDs'), flash memory based storage, any type of solid-state non-volatile memory, or any other type of non-mechanical storage device. In other implementations, storage drive 171A-F may include mechanical or spinning hard disk, such as hard-disk drives ('HDD').

In some implementations, the storage array controllers 110A-D may be configured for offloading device management responsibilities from storage drive 171A-F in storage array 102A-B. For example, storage array controllers 110A-D may manage control information that may describe the state of one or more memory blocks in the storage drives 171A-F. The control information may indicate, for example, that a particular memory block has failed and should no longer be written to, that a particular memory block contains boot code for a storage array controller 110A-D, the number of program-erase ('PIE') cycles that have been performed on a particular memory block, the age of data stored in a particular memory block, the type of data that is stored in a particular memory block, and so forth. In some implementations, the control information may be stored with an associated memory block as metadata. In other implementations, the control information for the storage drives 171A-F may be stored in one or more particular memory blocks of the storage drives 171A-F that are selected by the storage array controller 110A-D. The selected memory blocks may be tagged with an identifier indicating that the selected memory block contains control information. The identifier may be utilized by the storage array controllers 110A-D in conjunction with storage drives 171A-F to quickly identify the memory blocks that contain control information. For example, the storage controllers 110A-D may issue a command to locate memory blocks that contain control information. It may be noted that control information may be so large that parts of the control information may be stored in multiple locations, that the control information may be stored in multiple locations for purposes of redundancy, for example, or that the control information may otherwise be distributed across multiple memory blocks in the storage drive 171A-F.

In implementations, storage array controllers 110A-D may offload device management responsibilities from storage drives 171A-F of storage array 102A-B by retrieving, from the storage drives 171A-F, control information describing the state of one or more memory blocks in the storage drives 171A-F. Retrieving the control information from the storage drives 171A-F may be carried out, for example, by the storage array controller 110A-D querying the storage drives 171A-F for the location of control information for a particular storage drive 171A-F. The storage drives 171A-F may be configured to execute instructions that enable the storage drive 171A-F to identify the location of the control information. The instructions may be executed by a controller (not shown) associated with or otherwise located on the storage drive 171A-F and may cause the storage drive 171A-F to scan a portion of each memory block to identify the memory blocks that store control information for the storage drives 171A-F. The storage drives 171A-F may respond by sending a response message to the storage array controller 110A-D that includes the location of control information for the storage drive 171A-F. Responsive to receiving the response message, storage array controllers 110A-D may issue a request to read data stored at the address associated with the location of control information for the storage drives 171A-F.

In other implementations, the storage array controllers 110A-D may further offload device management responsibilities from storage drives 171A-F by performing, in response to receiving the control information, a storage drive management operation. A storage drive management operation may include, for example, an operation that is typically performed by the storage drive 171A-F (e.g., the controller (not shown) associated with a particular storage drive 171A-F). A storage drive management operation may include, for example, ensuring that data is not written to failed memory blocks within the storage drive 171A-F, ensuring that data is written to memory blocks within the storage drive 171A-F in such a way that adequate wear leveling is achieved, and so forth.

In implementations, storage array 102A-B may implement two or more storage array controllers 110A-D. For example, storage array 102A may include storage array controllers 110A and storage array controllers 110B. At a given instance, a single storage array controller 110A-D (e.g., storage array controller 110A) of a storage system 100 may be designated with primary status (also referred to as "primary controller" herein), and other storage array controllers 110A-D (e.g., storage array controller 110A) may be designated with secondary status (also referred to as "secondary controller" herein). The primary controller may have particular rights, such as permission to alter data in persistent storage resource 170A-B (e.g., writing data to persistent storage resource 170A-B). At least some of the rights of the primary controller may supersede the rights of the secondary controller. For instance, the secondary controller may not have permission to alter data in persistent storage resource 170A-B when the primary controller has the right. The status of storage array controllers 110A-D may change. For example, storage array controller 110A may be designated with secondary status, and storage array controller 110B may be designated with primary status.

In some implementations, a primary controller, such as storage array controller 110A, may serve as the primary controller for one or more storage arrays 102A-B, and a second controller, such as storage array controller 110B, may serve as the secondary controller for the one or more storage arrays 102A-B. For example, storage array controller 110A may be the primary controller for storage array 102A and storage array 102B, and storage array controller 110B may be the secondary controller for storage array 102A and 102B. In some implementations, storage array controllers 110C and 110D (also referred to as "storage processing modules") may neither have primary or secondary status. Storage array controllers 110C and 110D, implemented as storage processing modules, may act as a communication interface between the primary and secondary controllers (e.g., storage array controllers 110A and 110B, respectively) and storage array 102B. For example, storage array controller 110A of storage array 102A may send a write request, via SAN 158, to storage array 102B. The write request may be received by both storage array controllers 110C and 110D of storage array 102B. Storage array controllers 110C and 110D facilitate the communication, e.g., send the write request to the appropriate storage drive 171A-F. It may be noted that in some implementations storage processing modules may be used to increase the number of storage drives controlled by the primary and secondary controllers.

In implementations, storage array controllers 110A-D are communicatively coupled, via a midplane (not shown), to one or more storage drives 171A-F and to one or more NVRAM devices (not shown) that are included as part of a storage array 102A-B. The storage array controllers 110A-D may be coupled to the midplane via one or more data communication links and the midplane may be coupled to the storage drives 171A-F and the NVRAM devices via one or more data communications links. The data communications links described herein are collectively illustrated by data communications links 108A-D and may include a Peripheral Component Interconnect Express ('PCIe') bus, for example.

Figure 1B:
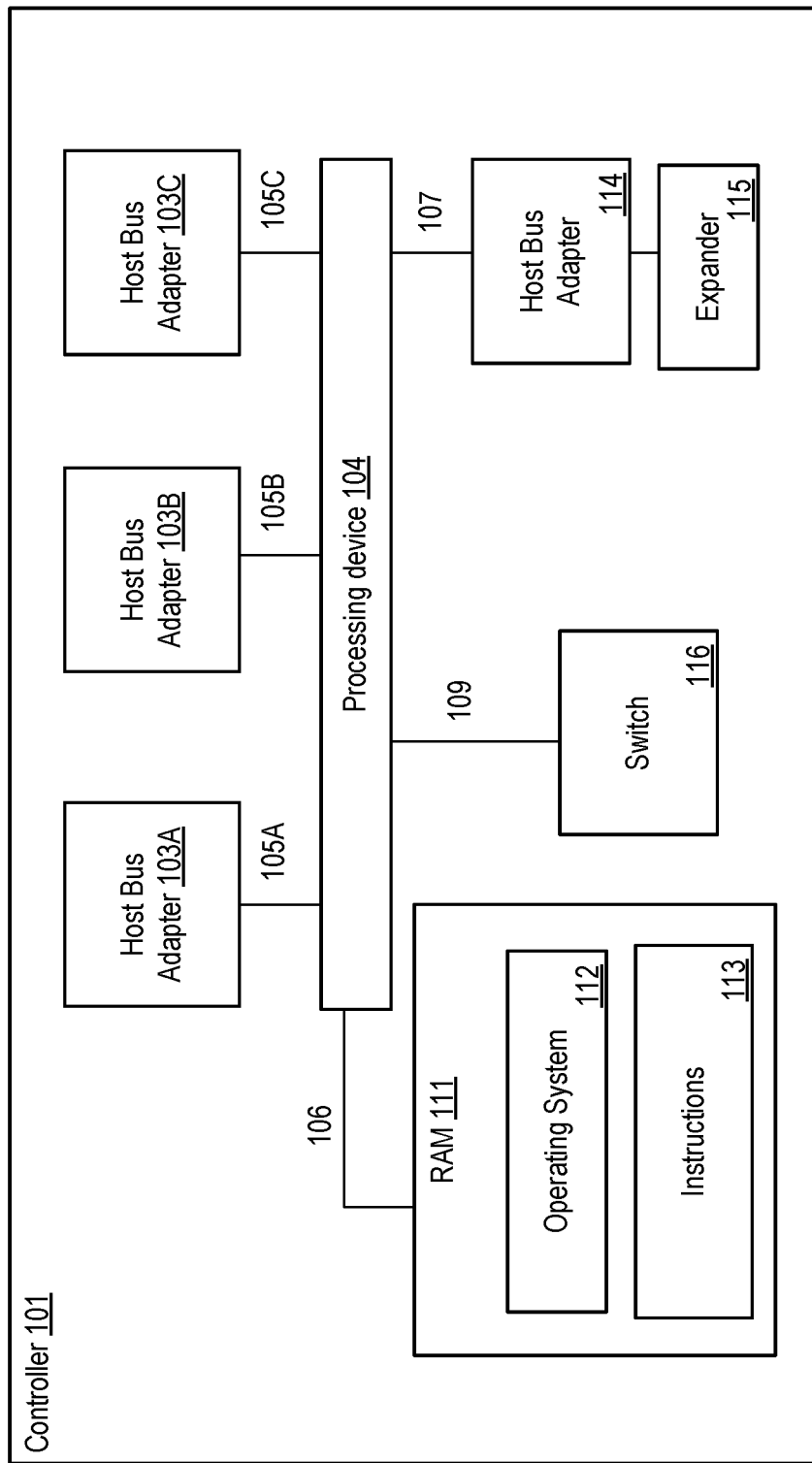
FIG. 1B illustrates a second example system for data storage in accordance with some implementations.

FIG. 1B illustrates an example system for data storage, in accordance with some implementations. Storage array controller 101 illustrated in FIG. 1B may be similar to the storage array controllers 110A-D described with respect to FIG. 1A. In one example, storage array controller 101 may be similar to storage array controller 110A or storage array controller 110B. Storage array controller 101 includes numerous elements for purposes of illustration rather than limitation. It may be noted that storage array controller 101 may include the same, more, or fewer elements configured in the same or different manner in other implementations. It may be noted that elements of FIG. 1A may be included below to help illustrate features of storage array controller 101.

Storage array controller 101 may include one or more processing devices 104 and random access memory ('RAM') 111. Processing device 104 (or controller 101) represents one or more general-purpose processing devices such as a microprocessor, central processing unit, or the like. More particularly, the processing device 104 (or controller 101) may be a complex instruction set computing ('CISC') microprocessor, reduced instruction set computing ('RISC') microprocessor, very long instruction word ('VLIW') microprocessor, or a processor implementing other instruction sets or processors implementing a combination of instruction sets. The processing device 104 (or controller 101) may also be one or more special-purpose processing devices such as an ASIC, an FPGA, a digital signal processor ('DSP'), network processor, or the like.

The processing device 104 may be connected to the RAM 111 via a data communications link 106, which may be embodied as a high speed memory bus such as a Double-Data Rate 4 ('DDR4') bus. Stored in RAM 111 is an operating system 112. In some implementations, instructions 113 are stored in RAM 111. Instructions 113 may include computer program instructions for performing operations in a direct-mapped flash storage system. In one embodiment, a direct-mapped flash storage system is one that addresses data blocks within flash drives directly and without an address translation performed by the storage controllers of the flash drives.

In implementations, storage array controller 101 includes one or more host bus adapters 103A-C that are coupled to the processing device 104 via a data communications link 105A-C. In implementations, host bus adapters 103A-C may be computer hardware that connects a host system (e.g., the storage array controller) to other network and storage arrays. In some examples, host bus adapters 103A-C may be a Fibre Channel adapter that enables the storage array controller 101 to connect to a SAN, an Ethernet adapter that enables the storage array controller 101 to connect to a LAN, or the like. Host bus adapters 103A-C may be coupled to the processing device 104 via a data communications link 105A-C such as, for example, a PCIe bus.

In implementations, storage array controller 101 may include a host bus adapter 114 that is coupled to an expander 115. The expander 115 may be used to attach a host system to a larger number of storage drives. The expander 115 may, for example, be a SAS expander utilized to enable the host bus adapter 114 to attach to storage drives in an implementation where the host bus adapter 114 is embodied as a SAS controller.

In implementations, storage array controller 101 may include a switch 116 coupled to the processing device 104 via a data communications link 109. The switch 116 may be a computer hardware device that can create multiple endpoints out of a single endpoint, thereby enabling multiple devices to share a single endpoint. The switch 116 may, for example, be a PCIe switch that is coupled to a PCIe bus (e.g., data communications link 109) and presents multiple PCIe connection points to the midplane.

In implementations, storage array controller 101 includes a data communications link 107 for coupling the storage array controller 101 to other storage array controllers. In some examples, data communications link 107 may be a QuickPath Interconnect (QPI) interconnect.

A traditional storage system that uses traditional flash drives may implement a process across the flash drives that are part of the traditional storage system. For example, a higher level process of the storage system may initiate and control a process across the flash drives. However, a flash drive of the traditional storage system may include its own storage controller that also performs the process. Thus, for the traditional storage system, a higher level process (e.g., initiated by the storage system) and a lower level process (e.g., initiated by a storage controller of the storage system) may both be performed.

To resolve various deficiencies of a traditional storage system, operations may be performed by higher level processes and not by the lower level processes. For example, the flash storage system may include flash drives that do not include storage controllers that provide the process. Thus, the operating system of the flash storage system itself may initiate and control the process. This may be accomplished by a direct-mapped flash storage system that addresses data blocks within the flash drives directly and without an address translation performed by the storage controllers of the flash drives.

In implementations, storage drive 171A-F may be one or more zoned storage devices. In some implementations, the one or more zoned storage devices may be a shingled HDD. In implementations, the one or more storage devices may be a flash-based SSD. In a zoned storage device, a zoned namespace on the zoned storage device can be addressed by groups of blocks that are grouped and aligned by a natural size, forming a number of addressable zones. In implementations utilizing an SSD, the natural size may be based on the erase block size of the SSD. In some implementations, the zones of the zoned storage device may be defined during initialization of the zoned storage device. In implementations, the zones may be defined dynamically as data is written to the zoned storage device.

In some implementations, zones may be heterogeneous, with some zones each being a page group and other zones being multiple page groups. In implementations, some zones may correspond to an erase block and other zones may correspond to multiple erase blocks. In an implementation, zones may be any combination of differing numbers of pages in page groups and/or erase blocks, for heterogeneous mixes of programming modes, manufacturers, product types and/or product generations of storage devices, as applied to heterogeneous assemblies, upgrades, distributed storages, etc. In some implementations, zones may be defined as having usage characteristics, such as a property of supporting data with particular kinds of longevity (very short lived or very long lived, for example). These properties could be used by a zoned storage device to determine how the zone will be managed over the zone's expected lifetime.

It should be appreciated that a zone is a virtual construct. Any particular zone may not have a fixed location at a storage device. Until allocated, a zone may not have any location at a storage device. A zone may correspond to a number representing a chunk of virtually allocatable space that is the size of an erase block or other block size in various implementations. When the system allocates or opens a zone, zones get allocated to flash or other solid-state storage memory and, as the system writes to the zone, pages are written to that mapped flash or other solid-state storage memory of the zoned storage device. When the system closes the zone, the associated erase block(s) or other sized block(s) are completed. At some point in the future, the system may delete a zone which will free up the zone's allocated space. During its lifetime, a zone may be moved around to different locations of the zoned storage device, e.g., as the zoned storage device does internal maintenance.

In implementations, the zones of the zoned storage device may be in different states. A zone may be in an empty state in which data has not been stored at the zone. An empty zone may be opened explicitly, or implicitly by writing data to the zone. This is the initial state for zones on a fresh zoned storage device, but may also be the result of a zone reset. In some implementations, an empty zone may have a designated location within the flash memory of the zoned storage device. In an implementation, the location of the empty zone may be chosen when the zone is first opened or first written to (or later if writes are buffered into memory). A zone may be in an open state either implicitly or explicitly, where a zone that is in an open state may be written to store data with write or append commands. In an implementation, a zone that is in an open state may also be written to using a copy command that copies data from a different zone. In some implementations, a zoned storage device may have a limit on the number of open zones at a particular time.

A zone in a closed state is a zone that has been partially written to, but has entered a closed state after issuing an explicit close operation. A zone in a closed state may be left available for future writes, but may reduce some of the run-time overhead consumed by keeping the zone in an open state. In implementations, a zoned storage device may have a limit on the number of closed zones at a particular time. A zone in a full state is a zone that is storing data and can no longer be written to. A zone may be in a full state either after writes have written data to the entirety of the zone or as a result of a zone finish operation. Prior to a finish operation, a zone may or may not have been completely written. After a finish operation, however, the zone may not be opened a written to further without first performing a zone reset operation.

The mapping from a zone to an erase block (or to a shingled track in an HDD) may be arbitrary, dynamic, and hidden from view. The process of opening a zone may be an operation that allows a new zone to be dynamically mapped to underlying storage of the zoned storage device, and then allows data to be written through appending writes into the zone until the zone reaches capacity. The zone can be finished at any point, after which further data may not be written into the zone. When the data stored at the zone is no longer needed, the zone can be reset which effectively deletes the zone's content from the zoned storage device, making the physical storage held by that zone available for the subsequent storage of data. Once a zone has been written and finished, the zoned storage device ensures that the data stored at the zone is not lost until the zone is reset. In the time between writing the data to the zone and the resetting of the zone, the zone may be moved around between shingle tracks or erase blocks as part of maintenance operations within the zoned storage device, such as by copying data to keep the data refreshed or to handle memory cell aging in an SSD.

In implementations utilizing an HDD, the resetting of the zone may allow the shingle tracks to be allocated to a new, opened zone that may be opened at some point in the future. In implementations utilizing an SSD, the resetting of the zone may cause the associated physical erase block(s) of the zone to be erased and subsequently reused for the storage of data. In some implementations, the zoned storage device may have a limit on the number of open zones at a point in time to reduce the amount of overhead dedicated to keeping zones open.

The operating system of the flash storage system may identify and maintain a list of allocation units across multiple flash drives of the flash storage system. The allocation units may be entire erase blocks or multiple erase blocks. The operating system may maintain a map or address range that directly maps addresses to erase blocks of the flash drives of the flash storage system.

Direct mapping to the erase blocks of the flash drives may be used to rewrite data and erase data. For example, the operations may be performed on one or more allocation units that include a first data and a second data where the first data is to be retained and the second data is no longer being used by the flash storage system. The operating system may initiate the process to write the first data to new locations within other allocation units and erasing the second data and marking the allocation units as being available for use for subsequent data. Thus, the process may only be performed by the higher level operating system of the flash storage system without an additional lower level process being performed by controllers of the flash drives.

Advantages of the process being performed only by the operating system of the flash storage system include increased reliability of the flash drives of the flash storage system as unnecessary or redundant write operations are not being performed during the process. One possible point of novelty here is the concept of initiating and controlling the process at the operating system of the flash storage system. In addition, the process can be controlled by the operating system across multiple flash drives. This is contrast to the process being performed by a storage controller of a flash drive.

A storage system can consist of two storage array controllers that share a set of drives for failover purposes, or it could consist of a single storage array controller that provides a storage service that utilizes multiple drives, or it could consist of a distributed network of storage array controllers each with some number of drives or some amount of Flash storage where the storage array controllers in the network collaborate to provide a complete storage service and collaborate on various aspects of a storage service including storage allocation and garbage collection.

Figure 1C:
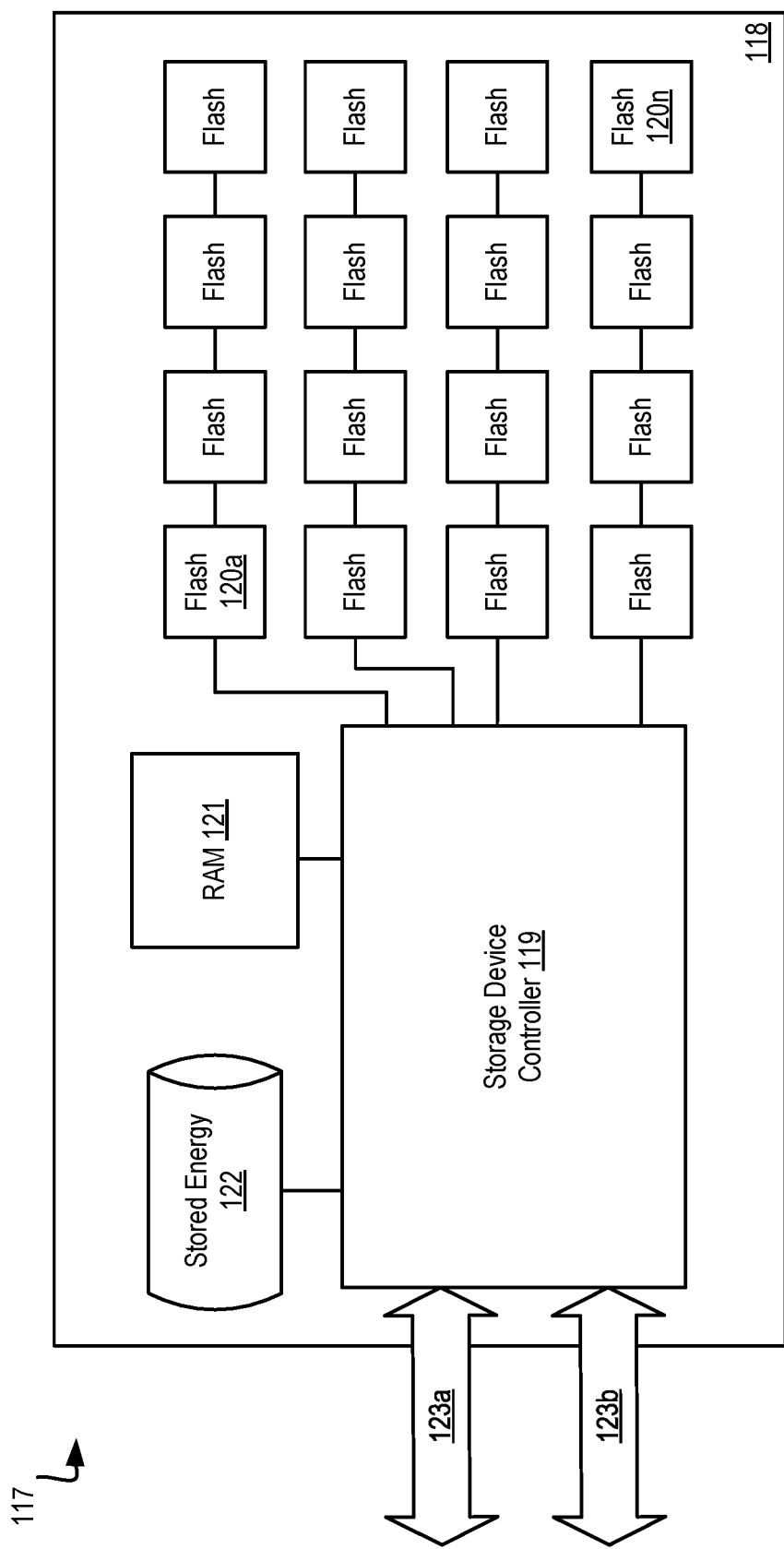
FIG. 1C illustrates a third example system for data storage in accordance with some implementations.

FIG. 1C illustrates a third example system 117 for data storage in accordance with some implementations. System 117 (also referred to as "storage system" herein) includes numerous elements for purposes of illustration rather than limitation. It may be noted that system 117 may include the same, more, or fewer elements configured in the same or different manner in other implementations.

In one embodiment, system 117 includes a dual Peripheral Component Interconnect ('PCI') flash storage device 118 with separately addressable fast write storage. System 117 may include a storage device controller 119. In one embodiment, storage device controller 119A-D may be a CPU, ASIC, FPGA, or any other circuitry that may implement control structures necessary according to the present disclosure. In one embodiment, system 117 includes flash memory devices (e.g., including flash memory devices 120a-n), operatively coupled to various channels of the storage device controller 119. Flash memory devices 120a-n, may be presented to the controller 119A-D as an addressable collection of Flash pages, erase blocks, and/or control elements sufficient to allow the storage device controller 119A-D to program and retrieve various aspects of the Flash. In one embodiment, storage device controller 119A-D may perform operations on flash memory devices 120a-n including storing and retrieving data content of pages, arranging and erasing any blocks, tracking statistics related to the use and reuse of Flash memory pages, erase blocks, and cells, tracking and predicting error codes and faults within the Flash memory, controlling voltage levels associated with programming and retrieving contents of Flash cells, etc.

In one embodiment, system 117 may include RAM 121 to store separately addressable fast-write data. In one embodiment, RAM 121 may be one or more separate discrete devices. In another embodiment, RAM 121 may be integrated into storage device controller 119A-D or multiple storage device controllers. The RAM 121 may be utilized for other purposes as well, such as temporary program memory for a processing device (e.g., a CPU) in the storage device controller 119.

In one embodiment, system 117 may include a stored energy device 122, such as a rechargeable battery or a capacitor. Stored energy device 122 may store energy sufficient to power the storage device controller 119, some amount of the RAM (e.g., RAM 121), and some amount of Flash memory (e.g., Flash memory 120a-120n) for sufficient time to write the contents of RAM to Flash memory. In one embodiment, storage device controller 119A-D may write the contents of RAM to Flash Memory if the storage device controller detects loss of external power.

In one embodiment, system 117 includes two data communications links 123a, 123b. In one embodiment, data communications links 123a, 123b may be PCI interfaces. In another embodiment, data communications links 123a, 123b may be based on other communications standards (e.g., HyperTransport, InfiniBand, etc.). Data communications links 123a, 123b may be based on non-volatile memory express ('NVMe') or NVMe over fabrics ('NVMf') specifications that allow external connection to the storage device controller 119A-D from other components in the storage system 117. It should be noted that data communications links may be interchangeably referred to herein as PCI buses for convenience.

System 117 may also include an external power source (not shown), which may be provided over one or both data communications links 123a, 123b, or which may be provided separately. An alternative embodiment includes a separate Flash memory (not shown) dedicated for use in storing the content of RAM 121. The storage device controller 119A-D may present a logical device over a PCI bus which may include an addressable fast-write logical device, or a distinct part of the logical address space of the storage device 118, which may be presented as PCI memory or as persistent storage. In one embodiment, operations to store into the device are directed into the RAM 121. On power failure, the storage device controller 119A-D may write stored content associated with the addressable fast-write logical storage to Flash memory (e.g., Flash memory 120a-n) for long-term persistent storage.

In one embodiment, the logical device may include some presentation of some or all of the content of the Flash memory devices 120a-n, where that presentation allows a storage system including a storage device 118 (e.g., storage system 117) to directly address Flash memory pages and directly reprogram erase blocks from storage system components that are external to the storage device through the PCI bus. The presentation may also allow one or more of the external components to control and retrieve other aspects of the Flash memory including some or all of: tracking statistics related to use and reuse of Flash memory pages, erase blocks, and cells across all the Flash memory devices; tracking and predicting error codes and faults within and across the Flash memory devices; controlling voltage levels associated with programming and retrieving contents of Flash cells; etc.

In one embodiment, the stored energy device 122 may be sufficient to ensure completion of in-progress operations to the Flash memory devices 120a-120n stored energy device 122 may power storage device controller 119A-D and associated Flash memory devices (e.g., 120a-n) for those operations, as well as for the storing of fast-write RAM to Flash memory. Stored energy device 122 may be used to store accumulated statistics and other parameters kept and tracked by the Flash memory devices 120a-n and/or the storage device controller 119. Separate capacitors or stored energy devices (such as smaller capacitors near or embedded within the Flash memory devices themselves) may be used for some or all of the operations described herein.

Various schemes may be used to track and optimize the life span of the stored energy component, such as adjusting voltage levels over time, partially discharging the stored energy device 122 to measure corresponding discharge characteristics, etc. If the available energy decreases over time, the effective available capacity of the addressable fast-write storage may be decreased to ensure that it can be written safely based on the currently available stored energy.

Figure 1D:
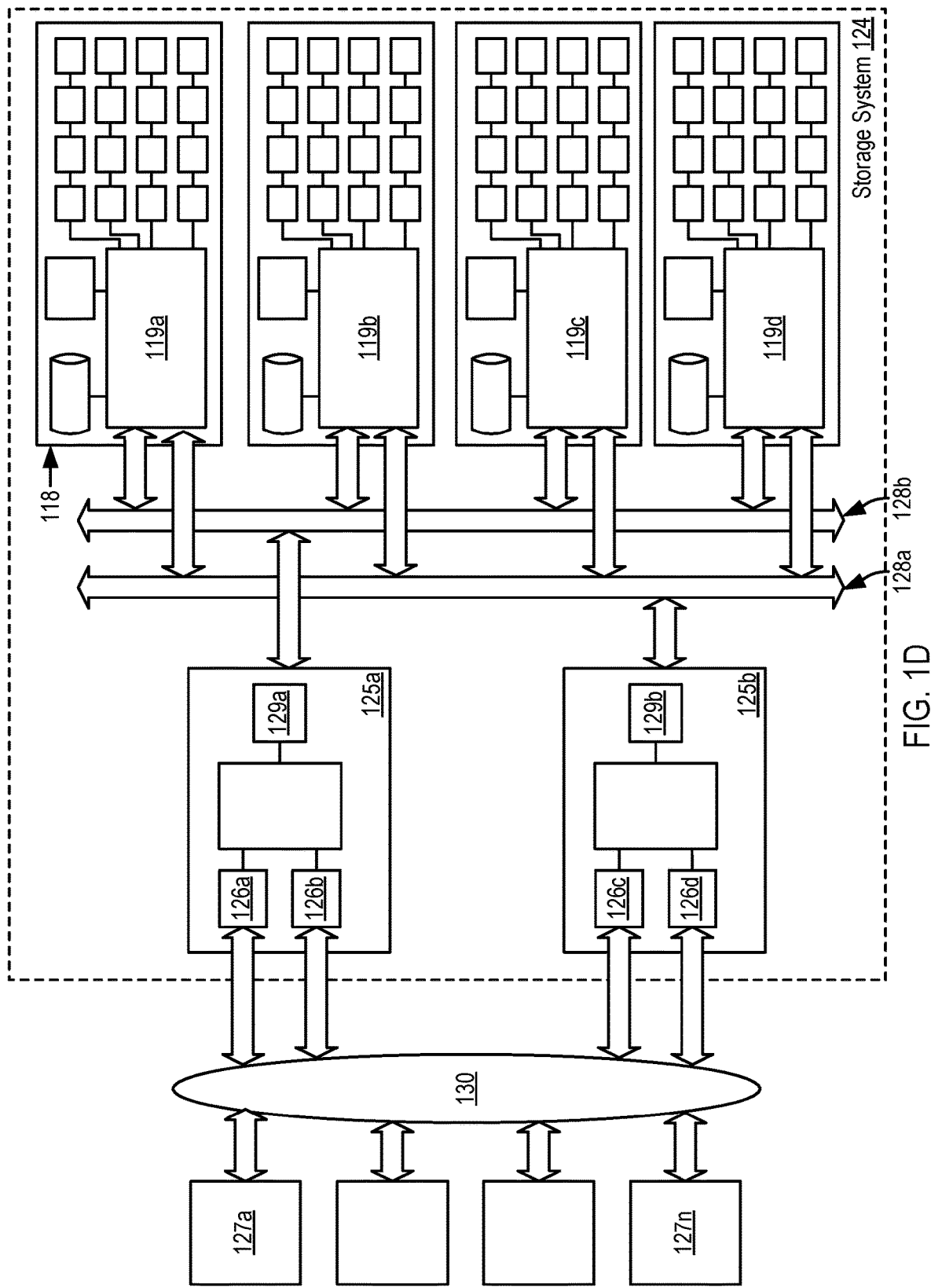
FIG. 1D illustrates a fourth example system for data storage in accordance with some implementations.

FIG. 1D illustrates a third example storage system 124 for data storage in accordance with some implementations. In one embodiment, storage system 124 includes storage controllers 125a, 125b. In one embodiment, storage controllers 125a, 125b are operatively coupled to Dual PCI storage devices. Storage controllers 125a, 125b may be operatively coupled (e.g., via a storage network 130) to some number of host computers 127a-n.

In one embodiment, two storage controllers (e.g., 125a and 125b) provide storage services, such as a SCS) block storage array, a file server, an object server, a database or data analytics service, etc. The storage controllers 125*a*, 125*b* may provide services through some number of network interfaces (e.g., 126*a-d*) to host computers 127*a-n* outside of the storage system 124. Storage controllers 125*a*, 125*b* may provide integrated services or an application entirely within the storage system 124, forming a converged storage and compute system. The storage controllers 125*a*, 125*b* may utilize the fast write memory within or across storage devices 119*a-d* to journal in progress operations to ensure the operations are not lost on a power failure, storage controller removal, storage controller or storage system shutdown, or some fault of one or more software or hardware components within the storage system 124.

In one embodiment, storage controllers 125*a*, 125*b* operate as PCI masters to one or the other PCI buses 128*a*, 128*b*. In another embodiment, 128*a* and 128*b* may be based on other communications standards (e.g., HyperTransport, InfiniBand, etc.). Other storage system embodiments may operate storage controllers 125*a*, 125*b* as multi-masters for both PCI buses 128*a*, 128*b*. Alternately, a PCI/NVMe/NVMf switching infrastructure or fabric may connect multiple storage controllers. Some storage system embodiments may allow storage devices to communicate with each other directly rather than communicating only with storage controllers. In one embodiment, a storage device controller 119*a* may be operable under direction from a storage controller 125*a* to synthesize and transfer data to be stored into Flash memory devices from data that has been stored in RAM (e.g., RAM 121 of FIG. 1C). For example, a recalculated version of RAM content may be transferred after a storage controller has determined that an operation has fully committed across the storage system, or when fast-write memory on the device has reached a certain used capacity, or after a certain amount of time, to ensure improve safety of the data or to release addressable fast-write capacity for reuse. This mechanism may be used, for example, to avoid a second transfer over a bus (e.g., 128*a*, 128*b*) from the storage controllers 125*a*, 125*b*. In one embodiment, a recalculation may include compressing data, attaching indexing or other metadata, combining multiple data segments together, performing erasure code calculations, etc.

In one embodiment, under direction from a storage controller 125*a*, 125*b*, a storage device controller 119*a*, 119*b* may be operable to calculate and transfer data to other storage devices from data stored in RAM (e.g., RAM 121 of FIG. 1C) without involvement of the storage controllers 125*a*, 125*b*. This operation may be used to mirror data stored in one storage controller 125*a* to another storage controller 125*b*, or it could be used to offload compression, data aggregation, and/or erasure coding calculations and transfers to storage devices to reduce load on storage controllers or the storage controller interface 129*a*, 129*b* to the PCI bus 128*a*, 128*b*.

A storage device controller 119A-D may include mechanisms for implementing high availability primitives for use by other parts of a storage system external to the Dual PCI storage device 118. For example, reservation or exclusion primitives may be provided so that, in a storage system with two storage controllers providing a highly available storage service, one storage controller may prevent the other storage controller from accessing or continuing to access the storage device. This could be used, for example, in cases where one controller detects that the other controller is not functioning properly or where the interconnect between the two storage controllers may itself not be functioning properly.

In one embodiment, a storage system for use with Dual PCI direct mapped storage devices with separately addressable fast write storage includes systems that manage erase blocks or groups of erase blocks as allocation units for storing data on behalf of the storage service, or for storing metadata (e.g., indexes, logs, etc.) associated with the storage service, or for proper management of the storage system itself. Flash pages, which may be a few kilobytes in size, may be written as data arrives or as the storage system is to persist data for long intervals of time (e.g., above a defined threshold of time). To commit data more quickly, or to reduce the number of writes to the Flash memory devices, the storage controllers may first write data into the separately addressable fast write storage on one or more storage devices.

In one embodiment, the storage controllers 125*a*, 125*b* may initiate the use of erase blocks within and across storage devices (e.g., 118) in accordance with an age and expected remaining lifespan of the storage devices, or based on other statistics. The storage controllers 125*a*, 125*b* may initiate garbage collection and data migration between storage devices in accordance with pages that are no longer needed as well as to manage Flash page and erase block lifespans and to manage overall system performance.

In one embodiment, the storage system 124 may utilize mirroring and/or erasure coding schemes as part of storing data into addressable fast write storage and/or as part of writing data into allocation units associated with erase blocks. Erasure codes may be used across storage devices, as well as within erase blocks or allocation units, or within and across Flash memory devices on a single storage device, to provide redundancy against single or multiple storage device failures or to protect against internal corruptions of Flash memory pages resulting from Flash memory operations or from degradation of Flash memory cells. Mirroring and erasure coding at various levels may be used to recover from multiple types of failures that occur separately or in combination.

The embodiments depicted with reference to FIGS. 2A-G illustrate a storage cluster that stores user data, such as user data originating from one or more user or client systems or other sources external to the storage cluster. The storage cluster distributes user data across storage nodes housed within a chassis, or across multiple chassis, using erasure coding and redundant copies of metadata. Erasure coding refers to a method of data protection or reconstruction in which data is stored across a set of different locations, such as disks, storage nodes or geographic locations. Flash memory is one type of solid-state memory that may be integrated with the embodiments, although the embodiments may be extended to other types of solid-state memory or other storage medium, including non-solid state memory. Control of storage locations and workloads are distributed across the storage locations in a clustered peer-to-peer system. Tasks such as mediating communications between the various storage nodes, detecting when a storage node has become unavailable, and balancing I/Os (inputs and outputs) across the various storage nodes, are all handled on a distributed basis. Data is laid out or distributed across multiple storage nodes in data fragments or stripes that support data recovery in some embodiments. Ownership of data can be reassigned within a cluster, independent of input and output patterns. This architecture described in more detail below allows a storage node in the cluster to fail, with the system remaining operational, since the data can be reconstructed from other storage nodes and thus remain available for input and output operations. In various embodiments, a storage node may be referred to as a cluster node, a blade, or a server.

The storage cluster may be contained within a chassis, i.e., an enclosure housing one or more storage nodes. A mechanism to provide power to each storage node, such as a power distribution bus, and a communication mechanism, such as a communication bus that enables communication between the storage nodes are included within the chassis. The storage cluster can run as an independent system in one location according to some embodiments. In one embodiment, a chassis contains at least two instances of both the power distribution and the communication bus which may be enabled or disabled independently. The internal communication bus may be an Ethernet bus, however, other technologies such as PCIe, InfiniBand, and others, are equally suitable. The chassis provides a port for an external communication bus for enabling communication between multiple chassis, directly or through a switch, and with client systems. The external communication may use a technology such as Ethernet, InfiniBand, Fibre Channel, etc. In some embodiments, the external communication bus uses different communication bus technologies for inter-chassis and client communication. If a switch is deployed within or between chassis, the switch may act as a translation between multiple protocols or technologies. When multiple chassis are connected to define a storage cluster, the storage cluster may be accessed by a client using either proprietary interfaces or standard interfaces such as network file system ('NFS'), common internet file system ('CIFS'), small computer system interface ('SCSI') or hypertext transfer protocol ('HTTP'). Translation from the client protocol may occur at the switch, chassis external communication bus or within each storage node. In some embodiments, multiple chassis may be coupled or connected to each other through an aggregator switch. A portion and/or all of the coupled or connected chassis may be designated as a storage cluster. As discussed above, each chassis can have multiple blades, each blade has a media access control ('MAC') address, but the storage cluster is presented to an external network as having a single cluster IP address and a single MAC address in some embodiments.

Each storage node may be one or more storage servers and each storage server is connected to one or more non-volatile solid state memory units, which may be referred to as storage units or storage devices. One embodiment includes a single storage server in each storage node and between one to eight non-volatile solid state memory units, however this one example is not meant to be limiting. The storage server may include a processor, DRAM and interfaces for the internal communication bus and power distribution for each of the power buses. Inside the storage node, the interfaces and storage unit share a communication bus, e.g., PCI Express, in some embodiments. The non-volatile solid state memory units may directly access the internal communication bus interface through a storage node communication bus, or request the storage node to access the bus interface. The non-volatile solid state memory unit contains an embedded CPU, solid state storage controller, and a quantity of solid state mass storage, e.g., between 2-32 terabytes ('TB') in some embodiments. An embedded volatile storage medium, such as DRAM, and an energy reserve apparatus are included in the non-volatile solid state memory unit. In some embodiments, the energy reserve apparatus is a capacitor, super-capacitor, or battery that enables transferring a subset of DRAM contents to a stable storage medium in the case of power loss. In some embodiments, the non-volatile solid state memory unit is constructed with a storage class memory, such as phase change or magnetoresistive random access memory ('MRAM') that substitutes for DRAM and enables a reduced power holdup apparatus.

One of many features of the storage nodes and non-volatile solid state storage is the ability to proactively rebuild data in a storage cluster. The storage nodes and non-volatile solid state storage can determine when a storage node or non-volatile solid state storage in the storage cluster is unreachable, independent of whether there is an attempt to read data involving that storage node or non-volatile solid state storage. The storage nodes and non-volatile solid state storage then cooperate to recover and rebuild the data in at least partially new locations. This constitutes a proactive rebuild, in that the system rebuilds data without waiting until the data is needed for a read access initiated from a client system employing the storage cluster. These and further details of the storage memory and operation thereof are discussed below.

Figure 2A:
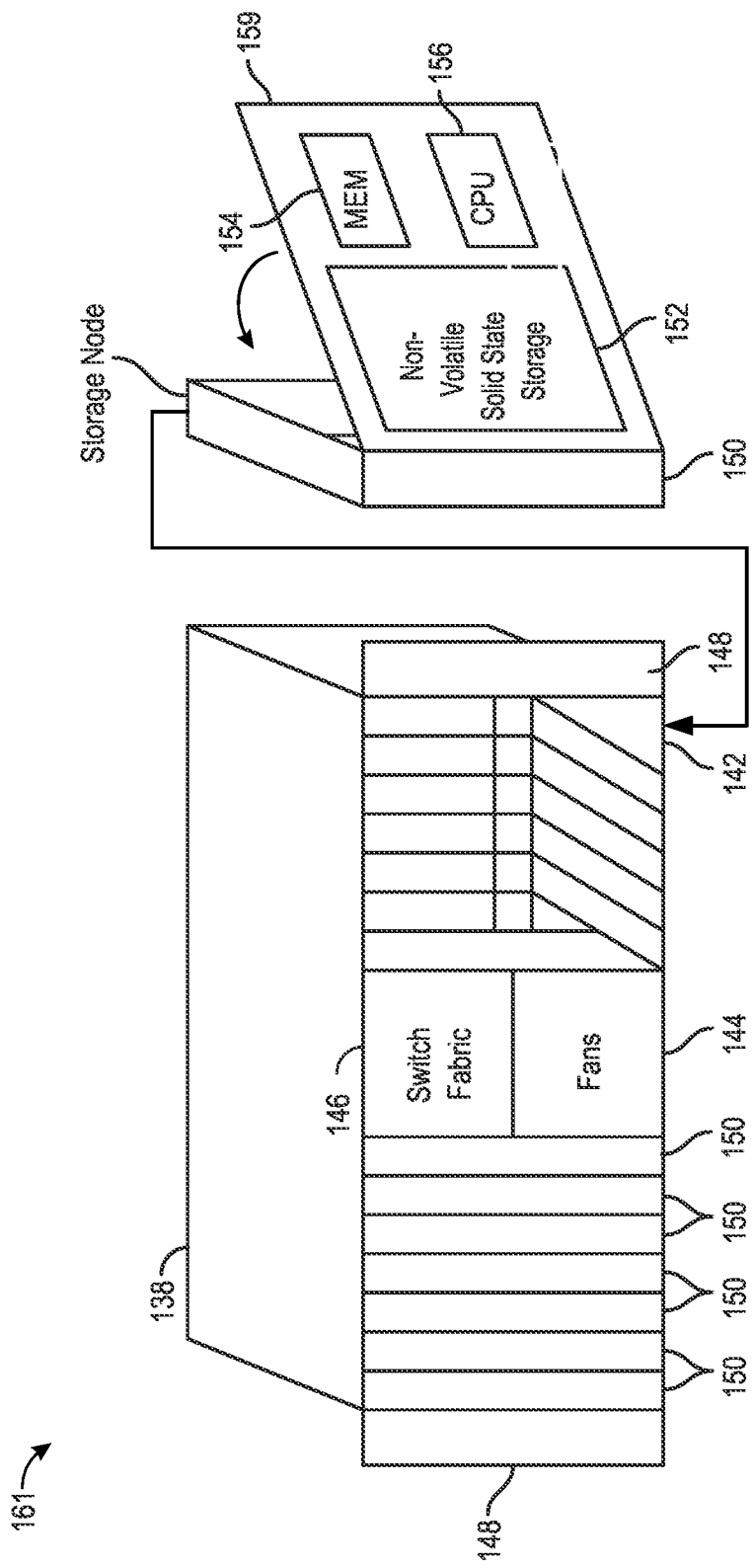
FIG. 2A is a perspective view of a storage cluster with multiple storage nodes and internal storage coupled to each storage node to provide network attached storage, in accordance with some embodiments.

FIG. 2A is a perspective view of a storage cluster 161, with multiple storage nodes 150 and internal solid-state memory coupled to each storage node to provide network attached storage or storage area network, in accordance with some embodiments. A network attached storage, storage area network, or a storage cluster, or other storage memory, could include one or more storage clusters 161, each having one or more storage nodes 150, in a flexible and reconfigurable arrangement of both the physical components and the amount of storage memory provided thereby. The storage cluster 161 is designed to fit in a rack, and one or more racks can be set up and populated as desired for the storage memory. The storage cluster 161 has a chassis 138 having multiple slots 142. It should be appreciated that chassis 138 may be referred to as a housing, enclosure, or rack unit. In one embodiment, the chassis 138 has fourteen slots 142, although other numbers of slots are readily devised. For example, some embodiments have four slots, eight slots, sixteen slots, thirty-two slots, or other suitable number of slots. Each slot 142 can accommodate one storage node 150 in some embodiments. Chassis 138 includes flaps 148 that can be utilized to mount the chassis 138 on a rack. Fans 144 provide air circulation for cooling of the storage nodes 150 and components thereof, although other cooling components could be used, or an embodiment could be devised without cooling components. A switch fabric 146 couples storage nodes 150 within chassis 138 together and to a network for communication to the memory. In an embodiment depicted in herein, the slots 142 to the left of the switch fabric 146 and fans 144 are shown occupied by storage nodes 150, while the slots 142 to the right of the switch fabric 146 and fans 144 are empty and available for insertion of storage node 150 for illustrative purposes. This configuration is one example, and one or more storage nodes 150 could occupy the slots 142 in various further arrangements. The storage node arrangements need not be sequential or adjacent in some embodiments. Storage nodes 150 are hot pluggable, meaning that a storage node 150 can be inserted into a slot 142 in the chassis 138, or removed from a slot 142, without stopping or powering down the system. Upon insertion or removal of storage node 150 from slot 142, the system automatically reconfigures in order to recognize and adapt to the change. Reconfiguration, in some embodiments, includes restoring redundancy and/or rebalancing data or load.

Each storage node 150 can have multiple components. In the embodiment shown here, the storage node 150 includes a printed circuit board 159 populated by a CPU 156, i.e., processor, a memory 154 coupled to the CPU 156, and a non-volatile solid state storage 152 coupled to the CPU 156, although other mountings and/or components could be used in further embodiments. The memory 154 has instructions which are executed by the CPU 156 and/or data operated on by the CPU 156. As further explained below, the non-volatile solid state storage 152 includes flash or, in further embodiments, other types of solid-state memory.

Referring to FIG. 2A, storage cluster 161 is scalable, meaning that storage capacity with non-uniform storage sizes is readily added, as described above. One or more storage nodes 150 can be plugged into or removed from each chassis and the storage cluster self-configures in some embodiments. Plug-in storage nodes 150, whether installed in a chassis as delivered or later added, can have different sizes. For example, in one embodiment a storage node 150 can have any multiple of 4 TB, e.g., 8 TB, 12 TB, 16 TB, 32 TB, etc. In further embodiments, a storage node 150 could have any multiple of other storage amounts or capacities. Storage capacity of each storage node 150 is broadcast, and influences decisions of how to stripe the data. For maximum storage efficiency, an embodiment can self-configure as wide as possible in the stripe, subject to a predetermined requirement of continued operation with loss of up to one, or up to two, non-volatile solid state storage 152 units or storage nodes 150 within the chassis.

Figure 2B:
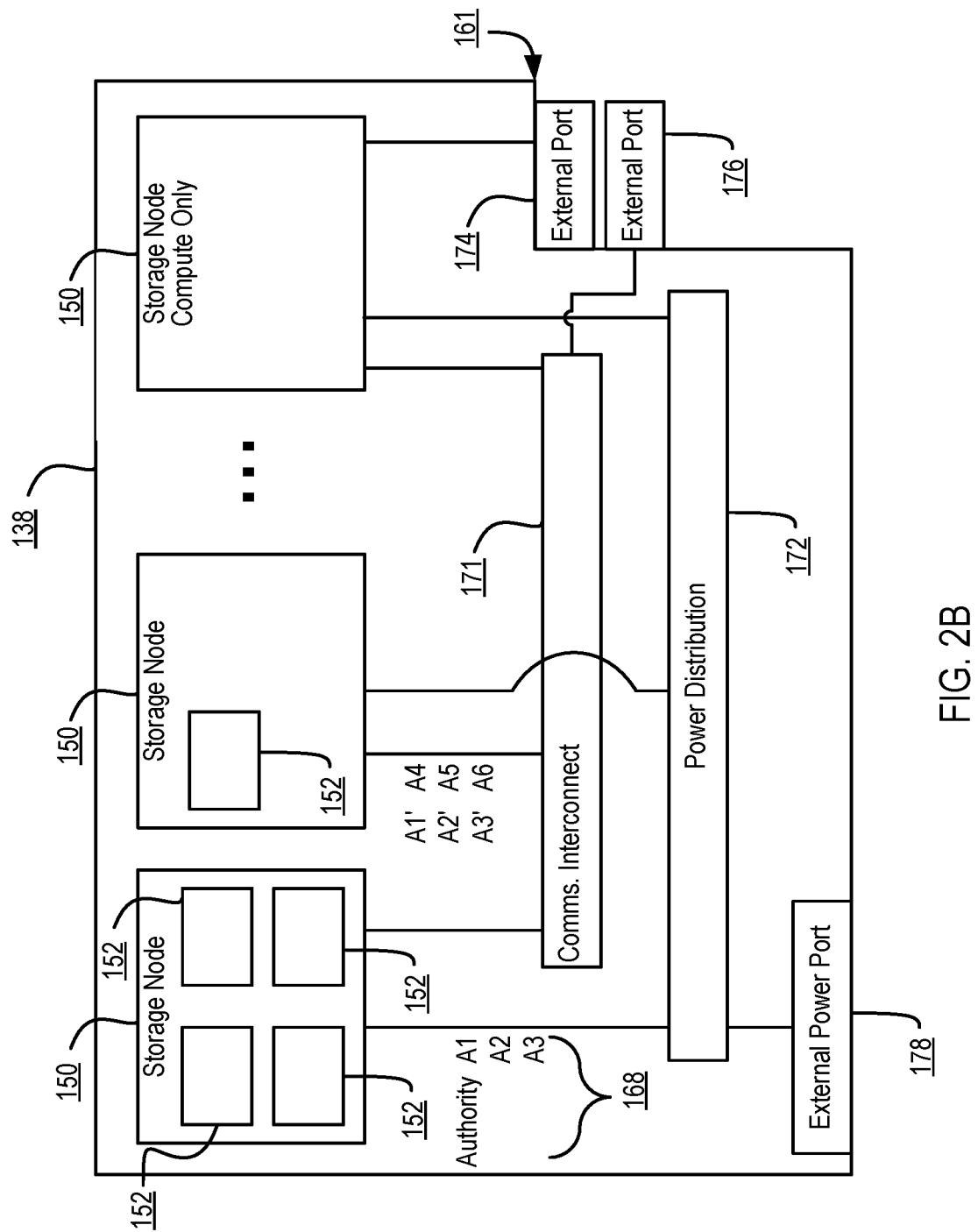
FIG. 2B is a block diagram showing an interconnect switch coupling multiple storage nodes in accordance with some embodiments.

FIG. 2B is a block diagram showing a communications interconnect 173 and power distribution bus 172 coupling multiple storage nodes 150. Referring back to FIG. 2A, the communications interconnect 173 can be included in or implemented with the switch fabric 146 in some embodiments. Where multiple storage clusters 161 occupy a rack, the communications interconnect 173 can be included in or implemented with a top of rack switch, in some embodiments. As illustrated in FIG. 2B, storage cluster 161 is enclosed within a single chassis 138. External port 176 is coupled to storage nodes 150 through communications interconnect 173, while external port 174 is coupled directly to a storage node. External power port 178 is coupled to power distribution bus 172. Storage nodes 150 may include varying amounts and differing capacities of non-volatile solid state storage 152 as described with reference to FIG. 2A. In addition, one or more storage nodes 150 may be a compute only storage node as illustrated in FIG. 2B. Authorities 168 are implemented on the non-volatile solid state storage 152, for example as lists or other data structures stored in memory. In some embodiments the authorities are stored within the non-volatile solid state storage 152 and supported by software executing on a controller or other processor of the non-volatile solid state storage 152. In a further embodiment, authorities 168 are implemented on the storage nodes 150, for example as lists or other data structures stored in the memory 154 and supported by software executing on the CPU 156 of the storage node 150. Authorities 168 control how and where data is stored in the non-volatile solid state storage 152 in some embodiments. This control assists in determining which type of erasure coding scheme is applied to the data, and which storage nodes 150 have which portions of the data. Each authority 168 may be assigned to a non-volatile solid state storage 152. Each authority may control a range of inode numbers, segment numbers, or other data identifiers which are assigned to data by a file system, by the storage nodes 150, or by the non-volatile solid state storage 152, in various embodiments.

Every piece of data, and every piece of metadata, has redundancy in the system in some embodiments. In addition, every piece of data and every piece of metadata has an owner, which may be referred to as an authority. If that authority is unreachable, for example through failure of a storage node, there is a plan of succession for how to find that data or that metadata. In various embodiments, there are redundant copies of authorities 168. Authorities 168 have a relationship to storage nodes 150 and non-volatile solid state storage 152 in some embodiments. Each authority 168, covering a range of data segment numbers or other identifiers of the data, may be assigned to a specific non-volatile solid state storage 152. In some embodiments the authorities 168 for all of such ranges are distributed over the non-volatile solid state storage 152 of a storage cluster. Each storage node 150 has a network port that provides access to the non-volatile solid state storage(s) 152 of that storage node 150. Data can be stored in a segment, which is associated with a segment number and that segment number is an indirection for a configuration of a RAID (redundant array of independent disks) stripe in some embodiments. The assignment and use of the authorities 168 thus establishes an indirection to data. Indirection may be referred to as the ability to reference data indirectly, in this case via an authority 168, in accordance with some embodiments. A segment identifies a set of non-volatile solid state storage 152 and a local identifier into the set of non-volatile solid state storage 152 that may contain data. In some embodiments, the local identifier is an offset into the device and may be reused sequentially by multiple segments. In other embodiments the local identifier is unique for a specific segment and never reused. The offsets in the non-volatile solid state storage 152 are applied to locating data for writing to or reading from the non-volatile solid state storage 152 (in the form of a RAID stripe). Data is striped across multiple units of non-volatile solid state storage 152, which may include or be different from the non-volatile solid state storage 152 having the authority 168 for a particular data segment.

If there is a change in where a particular segment of data is located, e.g., during a data move or a data reconstruction, the authority 168 for that data segment should be consulted, at that non-volatile solid state storage 152 or storage node 150 having that authority 168. In order to locate a particular piece of data, embodiments calculate a hash value for a data segment or apply an inode number or a data segment number. The output of this operation points to a non-volatile solid state storage 152 having the authority 168 for that particular piece of data. In some embodiments there are two stages to this operation. The first stage maps an entity identifier (ID), e.g., a segment number, inode number, or directory number to an authority identifier. This mapping may include a calculation such as a hash or a bit mask. The second stage is mapping the authority identifier to a particular non-volatile solid state storage 152, which may be done through an explicit mapping. The operation is repeatable, so that when the calculation is performed, the result of the calculation repeatably and reliably points to a particular non-volatile solid state storage 152 having that authority 168. The operation may include the set of reachable storage nodes as input. If the set of reachable non-volatile solid state storage units changes the optimal set changes. In some embodiments, the persisted value is the current assignment (which is always true) and the calculated value is the target assignment the cluster will attempt to reconfigure towards. This calculation may be used to determine the optimal non-volatile solid state storage 152 for an authority in the presence of a set of non-volatile solid state storage 152 that are reachable and constitute the same cluster. The calculation also determines an ordered set of peer non-volatile solid state storage 152 that will also record the authority to non-volatile solid state storage mapping so that the authority may be determined even if the assigned non-volatile solid state storage is unreachable. A duplicate or substitute authority 168 may be consulted if a specific authority 168 is unavailable in some embodiments.

With reference to FIGS. 2A and 2B, two of the many tasks of the CPU 156 on a storage node 150 are to break up write data, and reassemble read data. When the system has determined that data is to be written, the authority 168 for that data is located as above. When the segment ID for data is already determined the request to write is forwarded to the non-volatile solid state storage 152 currently determined to be the host of the authority 168 determined from the segment. The host CPU 156 of the storage node 150, on which the non-volatile solid state storage 152 and corresponding authority 168 reside, then breaks up or shards the data and transmits the data out to various non-volatile solid state storage 152. The transmitted data is written as a data stripe in accordance with an erasure coding scheme. In some embodiments, data is requested to be pulled, and in other embodiments, data is pushed. In reverse, when data is read, the authority 168 for the segment ID containing the data is located as described above. The host CPU 156 of the storage node 150 on which the non-volatile solid state storage 152 and corresponding authority 168 reside requests the data from the non-volatile solid state storage and corresponding storage nodes pointed to by the authority. In some embodiments the data is read from flash storage as a data stripe. The host CPU 156 of storage node 150 then reassembles the read data, correcting any errors (if present) according to the appropriate erasure coding scheme, and forwards the reassembled data to the network. In further embodiments, some or all of these tasks can be handled in the non-volatile solid state storage 152. In some embodiments, the segment host requests the data be sent to storage node 150 by requesting pages from storage and then sending the data to the storage node making the original request.

In embodiments, authorities 168 operate to determine how operations will proceed against particular logical elements. Each of the logical elements may be operated on through a particular authority across a plurality of storage controllers of a storage system. The authorities 168 may communicate with the plurality of storage controllers so that the plurality of storage controllers collectively perform operations against those particular logical elements.

In embodiments, logical elements could be, for example, files, directories, object buckets, individual objects, delineated parts of files or objects, other forms of key-value pair databases, or tables. In embodiments, performing an operation can involve, for example, ensuring consistency, structural integrity, and/or recoverability with other operations against the same logical element, reading metadata and data associated with that logical element, determining what data should be written durably into the storage system to persist any changes for the operation, or where metadata and data can be determined to be stored across modular storage devices attached to a plurality of the storage controllers in the storage system.

In some embodiments the operations are token based transactions to efficiently communicate within a distributed system. Each transaction may be accompanied by or associated with a token, which gives permission to execute the transaction. The authorities 168 are able to maintain a pre-transaction state of the system until completion of the operation in some embodiments. The token based communication may be accomplished without a global lock across the system, and also enables restart of an operation in case of a disruption or other failure.

In some systems, for example in UNIX-style file systems, data is handled with an index node or inode, which specifies a data structure that represents an object in a file system. The object could be a file or a directory, for example. Metadata may accompany the object, as attributes such as permission data and a creation timestamp, among other attributes. A segment number could be assigned to all or a portion of such an object in a file system. In other systems, data segments are handled with a segment number assigned elsewhere. For purposes of discussion, the unit of distribution is an entity, and an entity can be a file, a directory or a segment. That is, entities are units of data or metadata stored by a storage system. Entities are grouped into sets called authorities. Each authority has an authority owner, which is a storage node that has the exclusive right to update the entities in the authority. In other words, a storage node contains the authority, and that the authority, in turn, contains entities.

A segment is a logical container of data in accordance with some embodiments. A segment is an address space between medium address space and physical flash locations, i.e., the data segment number, are in this address space. Segments may also contain meta-data, which enable data redundancy to be restored (rewritten to different flash locations or devices) without the involvement of higher level software. In one embodiment, an internal format of a segment contains client data and medium mappings to determine the position of that data. Each data segment is protected, e.g., from memory and other failures, by breaking the segment into a number of data and parity shards, where applicable. The data and parity shards are distributed, i.e., striped, across non-volatile solid state storage 152 coupled to the host CPUs 156 (See FIGS. 2E and 2G) in accordance with an erasure coding scheme. Usage of the term segments refers to the container and its place in the address space of segments in some embodiments. Usage of the term stripe refers to the same set of shards as a segment and includes how the shards are distributed along with redundancy or parity information in accordance with some embodiments.

A series of address-space transformations takes place across an entire storage system. At the top are the directory entries (file names) which link to an inode. Modes point into medium address space, where data is logically stored. Medium addresses may be mapped through a series of indirect mediums to spread the load of large files, or implement data services like deduplication or snapshots. Segment addresses are then translated into physical flash locations. Physical flash locations have an address range bounded by the amount of flash in the system in accordance with some embodiments. Medium addresses and segment addresses are logical containers, and in some embodiments use a 128 bit or larger identifier so as to be practically infinite, with a likelihood of reuse calculated as longer than the expected life of the system. Addresses from logical containers are allocated in a hierarchical fashion in some embodiments. Initially, each non-volatile solid state storage 152 unit may be assigned a range of address space. Within this assigned range, the non-volatile solid state storage 152 is able to allocate addresses without synchronization with other non-volatile solid state storage 152.

Data and metadata is stored by a set of underlying storage layouts that are optimized for varying workload patterns and storage devices. These layouts incorporate multiple redundancy schemes, compression formats and index algorithms. Some of these layouts store information about authorities and authority masters, while others store file metadata and file data. The redundancy schemes include error correction codes that tolerate corrupted bits within a single storage device (such as a NAND flash chip), erasure codes that tolerate the failure of multiple storage nodes, and replication schemes that tolerate data center or regional failures. In some embodiments, low density parity check ('LDPC') code is used within a single storage unit. Reed-Solomon encoding is used within a storage cluster, and mirroring is used within a storage grid in some embodiments. Metadata may be stored using an ordered log structured index (such as a Log Structured Merge Tree), and large data may not be stored in a log structured layout.

In order to maintain consistency across multiple copies of an entity, the storage nodes agree implicitly on two things through calculations: (1) the authority that contains the entity, and (2) the storage node that contains the authority. The assignment of entities to authorities can be done by pseudo randomly assigning entities to authorities, by splitting entities into ranges based upon an externally produced key, or by placing a single entity into each authority. Examples of pseudorandom schemes are linear hashing and the Replication Under Scalable Hashing ('RUSH') family of hashes, including Controlled Replication Under Scalable Hashing ('CRUSH'). In some embodiments, pseudo-random assignment is utilized only for assigning authorities to nodes because the set of nodes can change. The set of authorities cannot change so any subjective function may be applied in these embodiments. Some placement schemes automatically place authorities on storage nodes, while other placement schemes rely on an explicit mapping of authorities to storage nodes. In some embodiments, a pseudorandom scheme is utilized to map from each authority to a set of candidate authority owners. A pseudorandom data distribution function related to CRUSH may assign authorities to storage nodes and create a list of where the authorities are assigned. Each storage node has a copy of the pseudorandom data distribution function, and can arrive at the same calculation for distributing, and later finding or locating an authority. Each of the pseudorandom schemes requires the reachable set of storage nodes as input in some embodiments in order to conclude the same target nodes. Once an entity has been placed in an authority, the entity may be stored on physical devices so that no expected failure will lead to unexpected data loss. In some embodiments, rebalancing algorithms attempt to store the copies of all entities within an authority in the same layout and on the same set of machines.

Examples of expected failures include device failures, stolen machines, datacenter fires, and regional disasters, such as nuclear or geological events. Different failures lead to different levels of acceptable data loss. In some embodiments, a stolen storage node impacts neither the security nor the reliability of the system, while depending on system configuration, a regional event could lead to no loss of data, a few seconds or minutes of lost updates, or even complete data loss.

In the embodiments, the placement of data for storage redundancy is independent of the placement of authorities for data consistency. In some embodiments, storage nodes that contain authorities do not contain any persistent storage. Instead, the storage nodes are connected to non-volatile solid state storage units that do not contain authorities. The communications interconnect between storage nodes and non-volatile solid state storage units consists of multiple communication technologies and has non-uniform performance and fault tolerance characteristics. In some embodiments, as mentioned above, non-volatile solid state storage units are connected to storage nodes via PCI express, storage nodes are connected together within a single chassis using Ethernet backplane, and chassis are connected together to form a storage cluster. Storage clusters are connected to clients using Ethernet or fiber channel in some embodiments. If multiple storage clusters are configured into a storage grid, the multiple storage clusters are connected using the Internet or other long-distance networking links, such as a "metro scale" link or private link that does not traverse the internet.

Authority owners have the exclusive right to modify entities, to migrate entities from one non-volatile solid state storage unit to another non-volatile solid state storage unit, and to add and remove copies of entities. This allows for maintaining the redundancy of the underlying data. When an authority owner fails, is going to be decommissioned, or is overloaded, the authority is transferred to a new storage node. Transient failures make it non-trivial to ensure that all non-faulty machines agree upon the new authority location. The ambiguity that arises due to transient failures can be achieved automatically by a consensus protocol such as Paxos, hot-warm failover schemes, via manual intervention by a remote system administrator, or by a local hardware administrator (such as by physically removing the failed machine from the cluster, or pressing a button on the failed machine). In some embodiments, a consensus protocol is used, and failover is automatic. If too many failures or replication events occur in too short a time period, the system goes into a self-preservation mode and halts replication and data movement activities until an administrator intervenes in accordance with some embodiments.

As authorities are transferred between storage nodes and authority owners update entities in their authorities, the system transfers messages between the storage nodes and non-volatile solid state storage units. With regard to persistent messages, messages that have different purposes are of different types. Depending on the type of the message, the system maintains different ordering and durability guarantees. As the persistent messages are being processed, the messages are temporarily stored in multiple durable and non-durable storage hardware technologies. In some embodiments, messages are stored in RAM, NVRAM and on NAND flash devices, and a variety of protocols are used in order to make efficient use of each storage medium. Latency-sensitive client requests may be persisted in replicated NVRAM, and then later NAND, while background rebalancing operations are persisted directly to NAND.

Persistent messages are persistently stored prior to being transmitted. This allows the system to continue to serve client requests despite failures and component replacement. Although many hardware components contain unique identifiers that are visible to system administrators, manufacturer, hardware supply chain and ongoing monitoring quality control infrastructure, applications running on top of the infrastructure address virtualize addresses. These virtualized addresses do not change over the lifetime of the storage system, regardless of component failures and replacements. This allows each component of the storage system to be replaced over time without reconfiguration or disruptions of client request processing, i.e., the system supports non-disruptive upgrades.

In some embodiments, the virtualized addresses are stored with sufficient redundancy. A continuous monitoring system correlates hardware and software status and the hardware identifiers. This allows detection and prediction of failures due to faulty components and manufacturing details. The monitoring system also enables the proactive transfer of authorities and entities away from impacted devices before failure occurs by removing the component from the critical path in some embodiments.

Figure 2C:
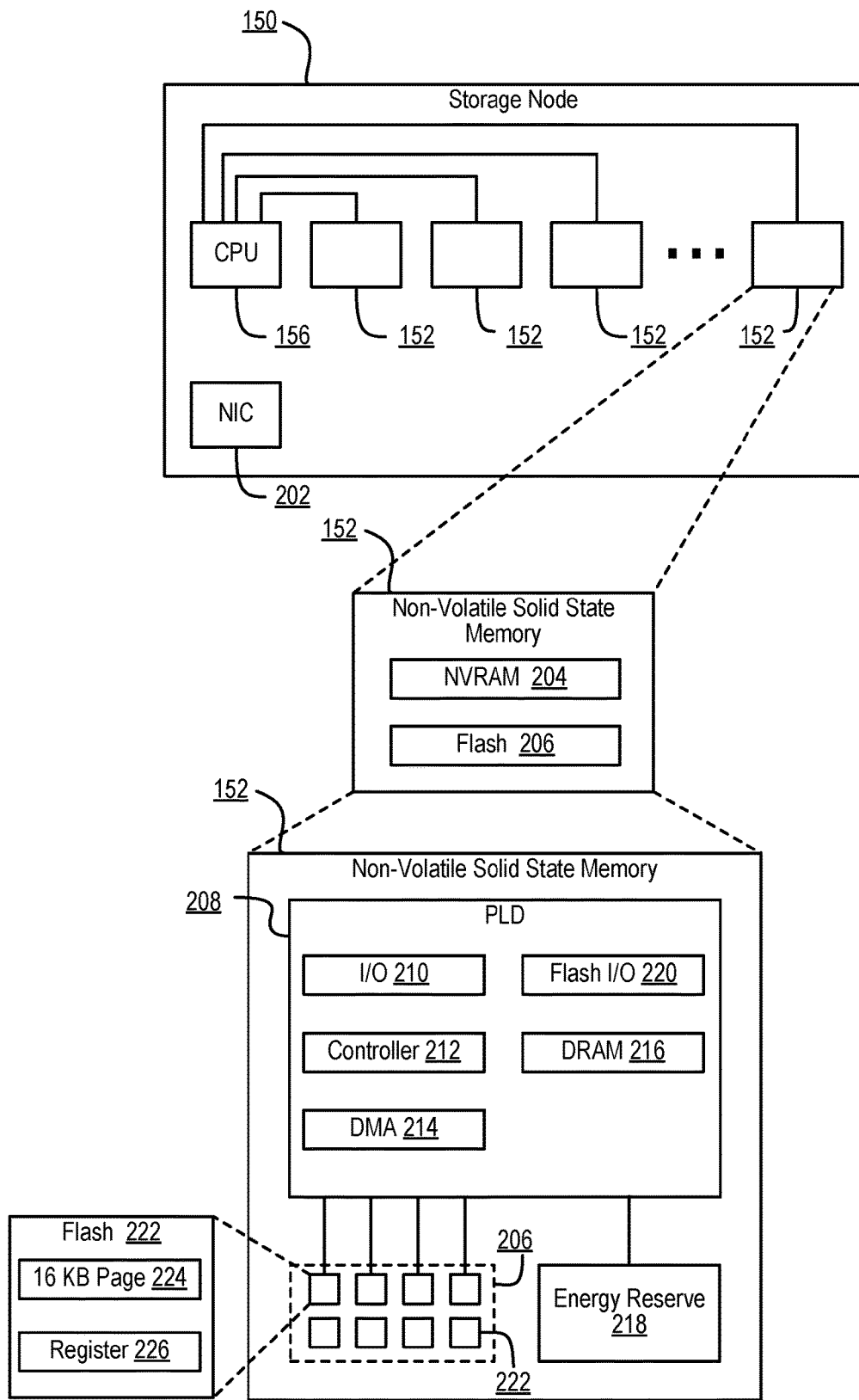
FIG. 2C is a multiple level block diagram, showing contents of a storage node and contents of one of the non-volatile solid state storage units in accordance with some embodiments.

FIG. 2C is a multiple level block diagram, showing contents of a storage node 150 and contents of a non-volatile solid state storage 152 of the storage node 150. Data is communicated to and from the storage node 150 by a network interface controller ('NIC') 202 in some embodiments. Each storage node 150 has a CPU 156, and one or more non-volatile solid state storage 152, as discussed above. Moving down one level in FIG. 2C, each non-volatile solid state storage 152 has a relatively fast non-volatile solid state memory, such as nonvolatile random access memory ('NVRAM') 204, and flash memory 206. In some embodiments, NVRAM 204 may be a component that does not require program/erase cycles (DRAM, MRAM, PCM), and can be a memory that can support being written vastly more often than the memory is read from. Moving down another level in FIG. 2C, the NVRAM 204 is implemented in one embodiment as high speed volatile memory, such as dynamic random access memory (DRAM) 216, backed up by energy reserve 218. Energy reserve 218 provides sufficient electrical power to keep the DRAM 216 powered long enough for contents to be transferred to the flash memory 206 in the event of power failure. In some embodiments, energy reserve 218 is a capacitor, super-capacitor, battery, or other device, that supplies a suitable supply of energy sufficient to enable the transfer of the contents of DRAM 216 to a stable storage medium in the case of power loss. The flash memory 206 is implemented as multiple flash dies 222, which may be referred to as packages of flash dies 222 or an array of flash dies 222. It should be appreciated that the flash dies 222 could be packaged in any number of ways, with a single die per package, multiple dies per package (i.e., multichip packages), in hybrid packages, as bare dies on a printed circuit board or other substrate, as encapsulated dies, etc. In the embodiment shown, the non-volatile solid state storage 152 has a controller 212 or other processor, and an input output (I/O) port 210 coupled to the controller 212. I/O port 210 is coupled to the CPU 156 and/or the network interface controller 202 of the flash storage node 150. Flash input output (I/O) port 220 is coupled to the flash dies 222, and a direct memory access unit (DMA) 214 is coupled to the controller 212, the DRAM 216 and the flash dies 222. In the embodiment shown, the I/O port 210, controller 212, DMA unit 214 and flash I/O port 220 are implemented on a programmable logic device ('PLD') 208, e.g., an FPGA. In this embodiment, each flash die 222 has pages, organized as sixteen kB (kilobyte) pages 224, and a register 226 through which data can be written to or read from the flash die 222. In further embodiments, other types of solid-state memory are used in place of, or in addition to flash memory illustrated within flash die 222.

Storage clusters 161, in various embodiments as disclosed herein, can be contrasted with storage arrays in general. The storage nodes 150 are part of a collection that creates the storage cluster 161. Each storage node 150 owns a slice of data and computing required to provide the data. Multiple storage nodes 150 cooperate to store and retrieve the data. Storage memory or storage devices, as used in storage arrays in general, are less involved with processing and manipulating the data. Storage memory or storage devices in a storage array receive commands to read, write, or erase data. The storage memory or storage devices in a storage array are not aware of a larger system in which they are embedded, or what the data means. Storage memory or storage devices in storage arrays can include various types of storage memory, such as RAM, solid state drives, hard disk drives, etc. The non-volatile solid state storage 152 units described herein have multiple interfaces active simultaneously and serving multiple purposes. In some embodiments, some of the functionality of a storage node 150 is shifted into a storage unit 152, transforming the storage unit 152 into a combination of storage unit 152 and storage node 150. Placing computing (relative to storage data) into the storage unit 152 places this computing closer to the data itself. The various system embodiments have a hierarchy of storage node layers with different capabilities. By contrast, in a storage array, a controller owns and knows everything about all of the data that the controller manages in a shelf or storage devices. In a storage cluster 161, as described herein, multiple controllers in multiple non-volatile solid state storage 152 units and/or storage nodes 150 cooperate in various ways (e.g., for erasure coding, data sharding, metadata communication and redundancy, storage capacity expansion or contraction, data recovery, and so on).

Figure 2D:
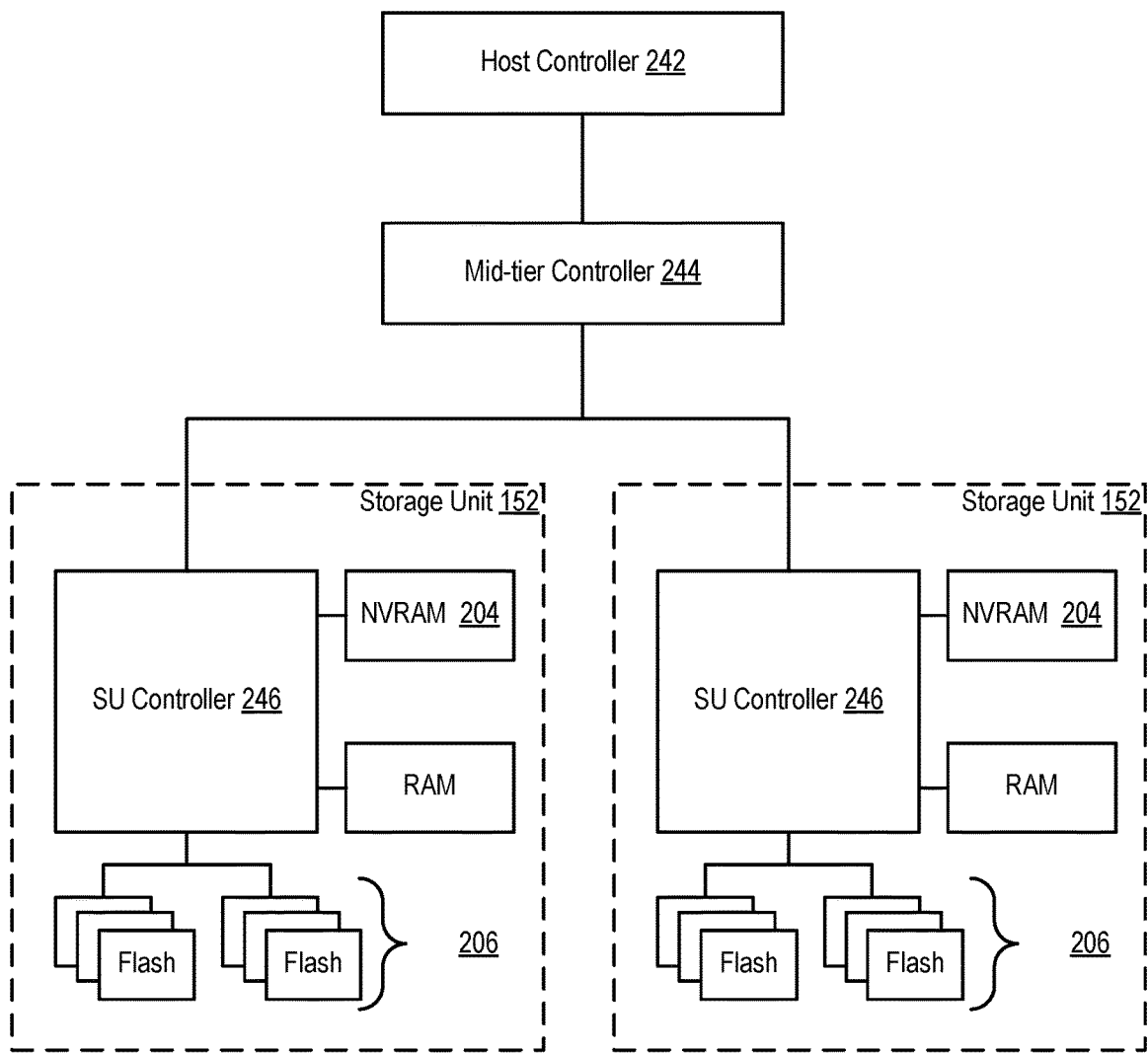
FIG. 2D shows a storage server environment, which uses embodiments of the storage nodes and storage units of some previous figures in accordance with some embodiments.

FIG. 2D shows a storage server environment, which uses embodiments of the storage nodes 150 and storage 152 units of FIGS. 2A-C. In this version, each non-volatile solid state storage 152 unit has a processor such as controller 212 (see FIG. 2C), an FPGA, flash memory 206, and NVRAM 204 (which is super-capacitor backed DRAM 216, see FIGS. 2B and 2C) on a PCIe (peripheral component interconnect express) board in a chassis 138 (see FIG. 2A). The non-volatile solid state storage 152 unit may be implemented as a single board containing storage, and may be the largest tolerable failure domain inside the chassis. In some embodiments, up to two non-volatile solid state storage 152 units may fail and the device will continue with no data loss.

The physical storage is divided into named regions based on application usage in some embodiments. The NVRAM 204 is a contiguous block of reserved memory in the non-volatile solid state storage 152 DRAM 216, and is backed by NAND flash. NVRAM 204 is logically divided into multiple memory regions written for two as spool (e.g., spool region). Space within the NVRAM 204 spools is managed by each authority 168 independently. Each device provides an amount of storage space to each authority 168. That authority 168 further manages lifetimes and allocations within that space. Examples of a spool include distributed transactions or notions. When the primary power to a non-volatile solid state storage 152 unit fails, onboard super-capacitors provide a short duration of power hold up. During this holdup interval, the contents of the NVRAM 204 are flushed to flash memory 206. On the next power-on, the contents of the NVRAM 204 are recovered from the flash memory 206.

As for the storage unit controller, the responsibility of the logical "controller" is distributed across each of the blades containing authorities 168. This distribution of logical control is shown in FIG. 2D as a host controller 242, mid-tier controller 244 and storage unit controller(s) 246. Management of the control plane and the storage plane are treated independently, although parts may be physically co-located on the same blade. Each authority 168 effectively serves as an independent controller. Each authority 168 provides its own data and metadata structures, its own background workers, and maintains its own lifecycle.

Figure 2E:
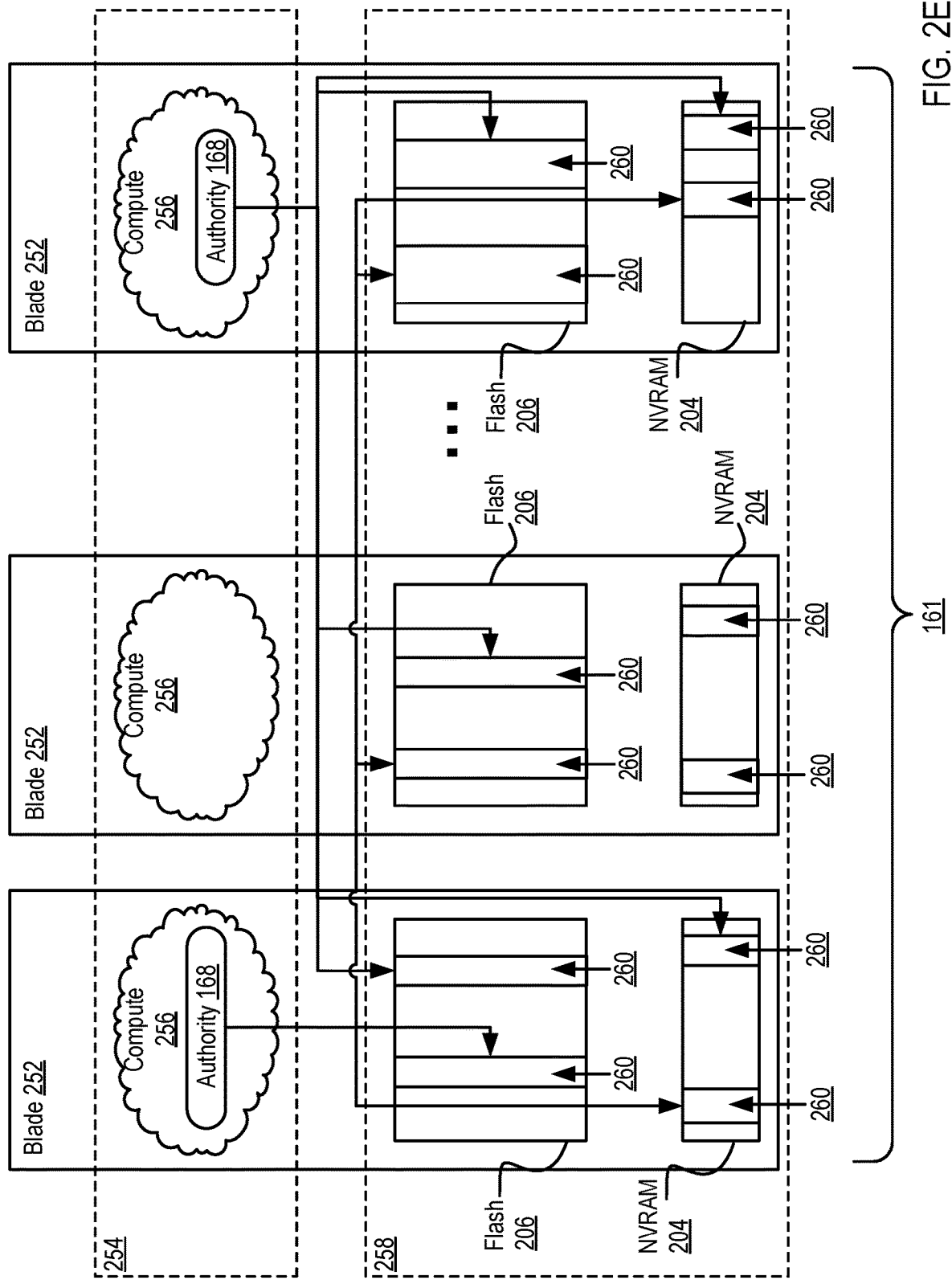
FIG. 2E is a blade hardware block diagram, showing a control plane, compute and storage planes, and authorities interacting with underlying physical resources, in accordance with some embodiments.

FIG. 2E is a blade 252 hardware block diagram, showing a control plane 254, compute and storage planes 256, 258, and authorities 168 interacting with underlying physical resources, using embodiments of the storage nodes 150 and storage units 152 of FIGS. 2A-C in the storage server environment of FIG. 2D. The control plane 254 is partitioned into a number of authorities 168 which can use the compute resources in the compute plane 256 to run on any of the blades 252. The storage plane 258 is partitioned into a set of devices, each of which provides access to flash 206 and NVRAM 204 resources. In one embodiment, the compute plane 256 may perform the operations of a storage array controller, as described herein, on one or more devices of the storage plane 258 (e.g., a storage array).

In the compute and storage planes 256, 258 of FIG. 2E, the authorities 168 interact with the underlying physical resources (i.e., devices). From the point of view of an authority 168, its resources are striped over all of the physical devices. From the point of view of a device, it provides resources to all authorities 168, irrespective of where the authorities happen to run. Each authority 168 has allocated or has been allocated one or more partitions 260 of storage memory in the storage units 152, e.g., partitions 260 in flash memory 206 and NVRAM 204. Each authority 168 uses those allocated partitions 260 that belong to it, for writing or reading user data. Authorities can be associated with differing amounts of physical storage of the system. For example, one authority 168 could have a larger number of partitions 260 or larger sized partitions 260 in one or more storage units 152 than one or more other authorities 168.

Figure 2F:
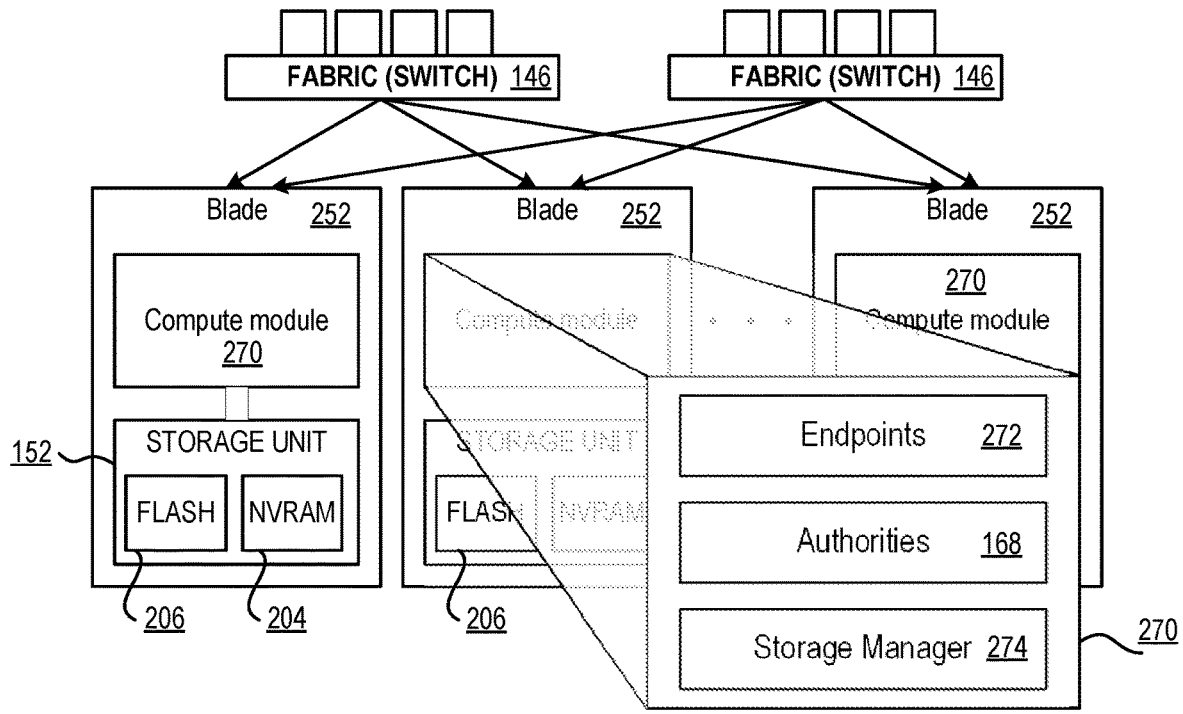
FIG. 2F depicts elasticity software layers in blades of a storage cluster, in accordance with some embodiments.

FIG. 2F depicts elasticity software layers in blades 252 of a storage cluster, in accordance with some embodiments. In the elasticity structure, elasticity software is symmetric, i.e., each blade's compute module 270 runs the three identical layers of processes depicted in FIG. 2F. Storage managers 274 execute read and write requests from other blades 252 for data and metadata stored in local storage unit 152 NVRAM 204 and flash 206. Authorities 168 fulfill client requests by issuing the necessary reads and writes to the blades 252 on whose storage units 152 the corresponding data or metadata resides. Endpoints 272 parse client connection requests received from switch fabric 146 supervisory software, relay the client connection requests to the authorities 168 responsible for fulfillment, and relay the authorities' 168 responses to clients. The symmetric three-layer structure enables the storage system's high degree of concurrency. Elasticity scales out efficiently and reliably in these embodiments. In addition, elasticity implements a unique scale-out technique that balances work evenly across all resources regardless of client access pattern, and maximizes concurrency by eliminating much of the need for inter-blade coordination that typically occurs with conventional distributed locking.

Still referring to FIG. 2F, authorities 168 running in the compute modules 270 of a blade 252 perform the internal operations required to fulfill client requests. One feature of elasticity is that authorities 168 are stateless, i.e., they cache active data and metadata in their own blades' 252 DRAMs for fast access, but the authorities store every update in their NVRAM 204 partitions on three separate blades 252 until the update has been written to flash 206. All the storage system writes to NVRAM 204 are in triplicate to partitions on three separate blades 252 in some embodiments. With triple-mirrored NVRAM 204 and persistent storage protected by parity and Reed-Solomon RAID checksums, the storage system can survive concurrent failure of two blades 252 with no loss of data, metadata, or access to either.

Because authorities 168 are stateless, they can migrate between blades 252. Each authority 168 has a unique identifier. NVRAM 204 and flash 206 partitions are associated with authorities' 168 identifiers, not with the blades 252 on which they are running in some embodiments. Thus, when an authority 168 migrates, the authority 168 continues to manage the same storage partitions from its new location. When a new blade 252 is installed in an embodiment of the storage cluster, the system automatically rebalances load by: partitioning the new blade's 252 storage for use by the system's authorities 168, migrating selected authorities 168 to the new blade 252, starting endpoints 272 on the new blade 252 and including them in the switch fabric's 146 client connection distribution algorithm.

From their new locations, migrated authorities 168 persist the contents of their NVRAM 204 partitions on flash 206, process read and write requests from other authorities 168, and fulfill the client requests that endpoints 272 direct to them. Similarly, if a blade 252 fails or is removed, the system redistributes its authorities 168 among the system's remaining blades 252. The redistributed authorities 168 continue to perform their original functions from their new locations.

Figure 2G:
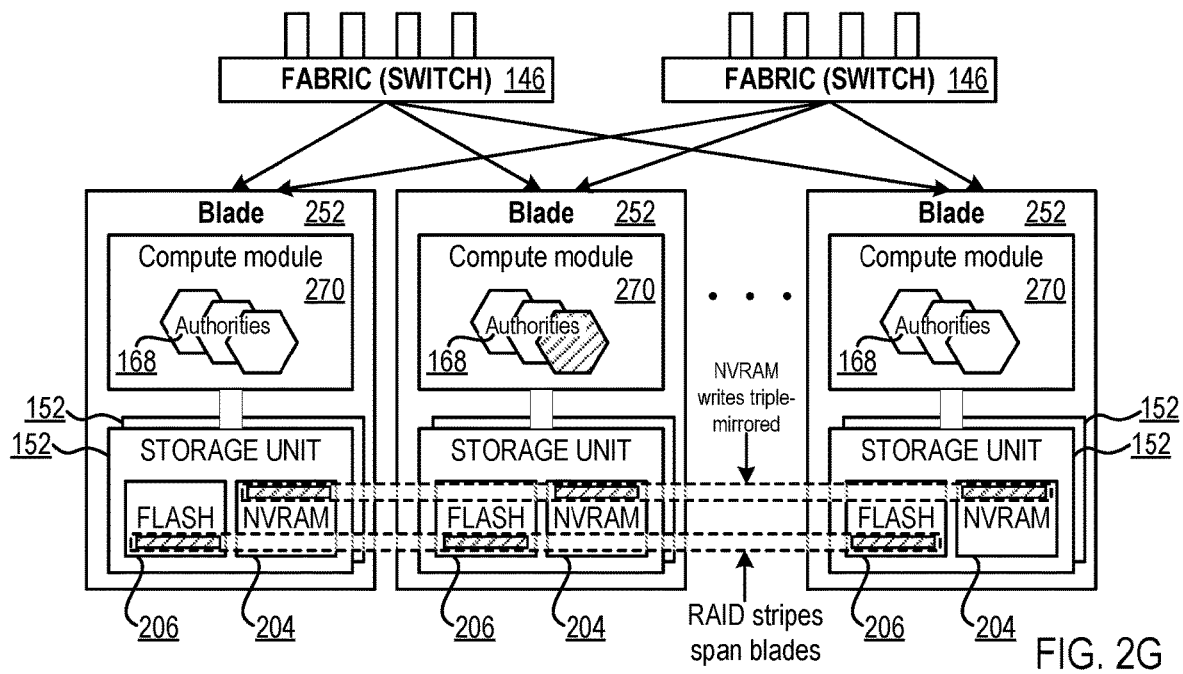
FIG. 2G depicts authorities and storage resources in blades of a storage cluster, in accordance with some embodiments.

FIG. 2G depicts authorities 168 and storage resources in blades 252 of a storage cluster, in accordance with some embodiments. Each authority 168 is exclusively responsible for a partition of the flash 206 and NVRAM 204 on each blade 252. The authority 168 manages the content and integrity of its partitions independently of other authorities 168. Authorities 168 compress incoming data and preserve it temporarily in their NVRAM 204 partitions, and then consolidate, RAID-protect, and persist the data in segments of the storage in their flash 206 partitions. As the authorities 168 write data to flash 206, storage managers 274 perform the necessary flash translation to optimize write performance and maximize media longevity. In the background, authorities 168 "garbage collect," or reclaim space occupied by data that clients have made obsolete by overwriting the data. It should be appreciated that since authorities' 168 partitions are disjoint, there is no need for distributed locking to execute client and writes or to perform background functions.

The embodiments described herein may utilize various software, communication and/or networking protocols. In addition, the configuration of the hardware and/or software may be adjusted to accommodate various protocols. For example, the embodiments may utilize Active Directory, which is a database based system that provides authentication, directory, policy, and other services in a WINDOWS™ environment. In these embodiments, LDAP (Lightweight Directory Access Protocol) is one example application protocol for querying and modifying items in directory service providers such as Active Directory. In some embodiments, a network lock manager ('NLM') is utilized as a facility that works in cooperation with the Network File System ('NFS') to provide a System V style of advisory file and record locking over a network. The Server Message Block ('SMB') protocol, one version of which is also known as Common Internet File System ('CIFS'), may be integrated with the storage systems discussed herein. SMP operates as an application-layer network protocol typically used for providing shared access to files, printers, and serial ports and miscellaneous communications between nodes on a network. SMB also provides an authenticated inter-process communication mechanism. AMAZON™ S3 (Simple Storage Service) is a web service offered by Amazon Web Services, and the systems described herein may interface with Amazon S3 through web services interfaces (REST (representational state transfer), SOAP (simple object access protocol), and BitTorrent). A RESTful API (application programming interface) breaks down a transaction to create a series of small modules. Each module addresses a particular underlying part of the transaction. The control or permissions provided with these embodiments, especially for object data, may include utilization of an access control list ('ACL'). The ACL is a list of permissions attached to an object and the ACL specifies which users or system processes are granted access to objects, as well as what operations are allowed on given objects. The systems may utilize Internet Protocol version 6 ('IPv6'), as well as IPv4, for the communications protocol that provides an identification and location system for computers on networks and routes traffic across the Internet. The routing of packets between networked systems may include Equal-cost multi-path routing ('ECMP'), which is a routing strategy where next-hop packet forwarding to a single destination can occur over multiple "best paths" which tie for top place in routing metric calculations. Multi-path routing can be used in conjunction with most routing protocols, because it is a per-hop decision limited to a single router. The software may support Multi-tenancy, which is an architecture in which a single instance of a software application serves multiple customers. Each customer may be referred to as a tenant. Tenants may be given the ability to customize some parts of the application, but may not customize the application's code, in some embodiments. The embodiments may maintain audit logs. An audit log is a document that records an event in a computing system. In addition to documenting what resources were accessed, audit log entries typically include destination and source addresses, a timestamp, and user login information for compliance with various regulations. The embodiments may support various key management policies, such as encryption key rotation. In addition, the system may support dynamic root passwords or some variation dynamically changing passwords.

Figure 3A:
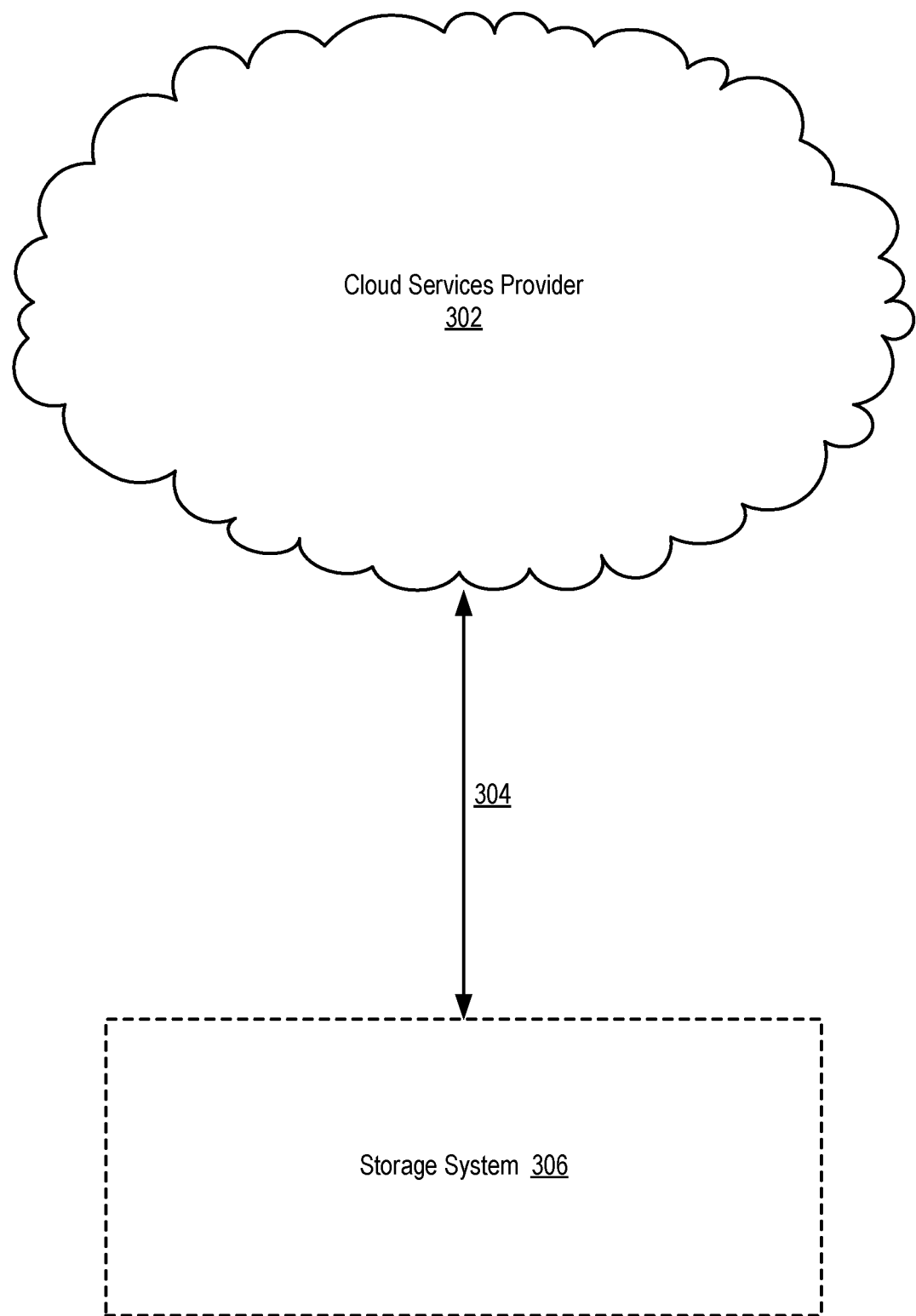
FIG. 3A sets forth a diagram of a storage system that is coupled for data communications with a cloud services provider in accordance with some embodiments of the present disclosure.

FIG. 3A sets forth a diagram of a storage system 306 that is coupled for data communications with a cloud services provider 302 in accordance with some embodiments of the present disclosure. Although depicted in less detail, the storage system 306 depicted in FIG. 3A may be similar to the storage systems described above with reference to FIGS. 1A-1D and FIGS. 2A-2G. In some embodiments, the storage system 306 depicted in FIG. 3A may be embodied as a storage system that includes imbalanced active/active controllers, as a storage system that includes balanced active/active controllers, as a storage system that includes active/active controllers where less than all of each controller's resources are utilized such that each controller has reserve resources that may be used to support failover, as a storage system that includes fully active/active controllers, as a storage system that includes dataset-segregated controllers, as a storage system that includes dual-layer architectures with front-end controllers and back-end integrated storage controllers, as a storage system that includes scale-out clusters of dual-controller arrays, as well as combinations of such embodiments.

In the example depicted in FIG. 3A, the storage system 306 is coupled to the cloud services provider 302 via a data communications link 304. The data communications link 304 may be embodied as a dedicated data communications link, as a data communications pathway that is provided through the use of one or data communications networks such as a wide area network ('WAN') or LAN, or as some other mechanism capable of transporting digital information between the storage system 306 and the cloud services provider 302. Such a data communications link 304 may be fully wired, fully wireless, or some aggregation of wired and wireless data communications pathways. In such an example, digital information may be exchanged between the storage system 306 and the cloud services provider 302 via the data communications link 304 using one or more data communications protocols. For example, digital information may be exchanged between the storage system 306 and the cloud services provider 302 via the data communications link 304 using the handheld device transfer protocol ('HDTP'), hypertext transfer protocol ('HTTP'), internet protocol ('IP'), real-time transfer protocol ('RTP'), transmission control protocol ('TCP'), user datagram protocol ('UDP'), wireless application protocol ('WAP'), or other protocol.

The cloud services provider 302 depicted in FIG. 3A may be embodied, for example, as a system and computing environment that provides a vast array of services to users of the cloud services provider 302 through the sharing of computing resources via the data communications link 304. The cloud services provider 302 may provide on-demand access to a shared pool of configurable computing resources such as computer networks, servers, storage, applications and services, and so on. The shared pool of configurable resources may be rapidly provisioned and released to a user of the cloud services provider 302 with minimal management effort. Generally, the user of the cloud services provider 302 is unaware of the exact computing resources utilized by the cloud services provider 302 to provide the services. Although in many cases such a cloud services provider 302 may be accessible via the Internet, readers of skill in the art will recognize that any system that abstracts the use of shared resources to provide services to a user through any data communications link may be considered a cloud services provider 302.

In the example depicted in FIG. 3A, the cloud services provider 302 may be configured to provide a variety of services to the storage system 306 and users of the storage system 306 through the implementation of various service models. For example, the cloud services provider 302 may be configured to provide services through the implementation of an infrastructure as a service ('IaaS') service model, through the implementation of a platform as a service ('PaaS') service model, through the implementation of a software as a service ('SaaS') service model, through the implementation of an authentication as a service ('AaaS') service model, through the implementation of a storage as a service model where the cloud services provider 302 offers access to its storage infrastructure for use by the storage system 306 and users of the storage system 306, and so on. Readers will appreciate that the cloud services provider 302 may be configured to provide additional services to the storage system 306 and users of the storage system 306 through the implementation of additional service models, as the service models described above are included only for explanatory purposes and in no way represent a limitation of the services that may be offered by the cloud services provider 302 or a limitation as to the service models that may be implemented by the cloud services provider 302.

In the example depicted in FIG. 3A, the cloud services provider 302 may be embodied, for example, as a private cloud, as a public cloud, or as a combination of a private cloud and public cloud. In an embodiment in which the cloud services provider 302 is embodied as a private cloud, the cloud services provider 302 may be dedicated to providing services to a single organization rather than providing services to multiple organizations. In an embodiment where the cloud services provider 302 is embodied as a public cloud, the cloud services provider 302 may provide services to multiple organizations. In still alternative embodiments, the cloud services provider 302 may be embodied as a mix of a private and public cloud services with a hybrid cloud deployment.

Although not explicitly depicted in FIG. 3A, readers will appreciate that a vast amount of additional hardware components and additional software components may be necessary to facilitate the delivery of cloud services to the storage system 306 and users of the storage system 306. For example, the storage system 306 may be coupled to (or even include) a cloud storage gateway. Such a cloud storage gateway may be embodied, for example, as hardware-based or software-based appliance that is located on premises with the storage system 306. Such a cloud storage gateway may operate as a bridge between local applications that are executing on the storage system 306 and remote, cloud-based storage that is utilized by the storage system 306. Through the use of a cloud storage gateway, organizations may move primary iSCSI or NAS to the cloud services provider 302, thereby enabling the organization to save space on their on-premises storage systems. Such a cloud storage gateway may be configured to emulate a disk array, a block-based device, a file server, or other storage system that can translate the SCSI commands, file server commands, or other appropriate command into REST-space protocols that facilitate communications with the cloud services provider 302.

In order to enable the storage system 306 and users of the storage system 306 to make use of the services provided by the cloud services provider 302, a cloud migration process may take place during which data, applications, or other elements from an organization's local systems (or even from another cloud environment) are moved to the cloud services provider 302. In order to successfully migrate data, applications, or other elements to the cloud services provider's 302 environment, middleware such as a cloud migration tool may be utilized to bridge gaps between the cloud services provider's 302 environment and an organization's environment. Such cloud migration tools may also be configured to address potentially high network costs and long transfer times associated with migrating large volumes of data to the cloud services provider 302, as well as addressing security concerns associated with sensitive data to the cloud services provider 302 over data communications networks. In order to further enable the storage system 306 and users of the storage system 306 to make use of the services provided by the cloud services provider 302, a cloud orchestrator may also be used to arrange and coordinate automated tasks in pursuit of creating a consolidated process or workflow. Such a cloud orchestrator may perform tasks such as configuring various components, whether those components are cloud components or on-premises components, as well as managing the interconnections between such components. The cloud orchestrator can simplify the inter-component communication and connections to ensure that links are correctly configured and maintained.

In the example depicted in FIG. 3A, and as described briefly above, the cloud services provider 302 may be configured to provide services to the storage system 306 and users of the storage system 306 through the usage of a SaaS service model, eliminating the need to install and run the application on local computers, which may simplify maintenance and support of the application. Such applications may take many forms in accordance with various embodiments of the present disclosure. For example, the cloud services provider 302 may be configured to provide access to data analytics applications to the storage system 306 and users of the storage system 306. Such data analytics applications may be configured, for example, to receive vast amounts of telemetry data phoned home by the storage system 306. Such telemetry data may describe various operating characteristics of the storage system 306 and may be analyzed for a vast array of purposes including, for example, to determine the health of the storage system 306, to identify workloads that are executing on the storage system 306, to predict when the storage system 306 will run out of various resources, to recommend configuration changes, hardware or software upgrades, workflow migrations, or other actions that may improve the operation of the storage system 306.

The cloud services provider 302 may also be configured to provide access to virtualized computing environments to the storage system 306 and users of the storage system 306. Such virtualized computing environments may be embodied, for example, as a virtual machine or other virtualized computer hardware platforms, virtual storage devices, virtualized computer network resources, and so on. Examples of such virtualized environments can include virtual machines that are created to emulate an actual computer, virtualized desktop environments that separate a logical desktop from a physical machine, virtualized file systems that allow uniform access to different types of concrete file systems, and many others.

Although the example depicted in FIG. 3A illustrates the storage system 306 being coupled for data communications with the cloud services provider 302, in other embodiments the storage system 306 may be part of a hybrid cloud deployment in which private cloud elements (e.g., private cloud services, on-premises infrastructure, and so on) and public cloud elements (e.g., public cloud services, infrastructure, and so on that may be provided by one or more cloud services providers) are combined to form a single solution, with orchestration among the various platforms. Such a hybrid cloud deployment may leverage hybrid cloud management software such as, for example, Azure™ Arc from Microsoft™, that centralize the management of the hybrid cloud deployment to any infrastructure and enable the deployment of services anywhere. In such an example, the hybrid cloud management software may be configured to create, update, and delete resources (both physical and virtual) that form the hybrid cloud deployment, to allocate compute and storage to specific workloads, to monitor workloads and resources for performance, policy compliance, updates and patches, security status, or to perform a variety of other tasks.

Readers will appreciate that by pairing the storage systems described herein with one or more cloud services providers, various offerings may be enabled. For example, disaster recovery as a service ('DRaaS') may be provided where cloud resources are utilized to protect applications and data from disruption caused by disaster, including in embodiments where the storage systems may serve as the primary data store. In such embodiments, a total system backup may be taken that allows for business continuity in the event of system failure. In such embodiments, cloud data backup techniques (by themselves or as part of a larger DRaaS solution) may also be integrated into an overall solution that includes the storage systems and cloud services providers described herein.

The storage systems described herein, as well as the cloud services providers, may be utilized to provide a wide array of security features. For example, the storage systems may encrypt data at rest (and data may be sent to and from the storage systems encrypted) and may make use of Key Management-as-a-Service ('KMaaS') to manage encryption keys, keys for locking and unlocking storage devices, and so on. Likewise, cloud data security gateways or similar mechanisms may be utilized to ensure that data stored within the storage systems does not improperly end up being stored in the cloud as part of a cloud data backup operation. Furthermore, microsegmentation or identity-based-segmentation may be utilized in a data center that includes the storage systems or within the cloud services provider, to create secure zones in data centers and cloud deployments that enables the isolation of workloads from one another.

Figure 3B:
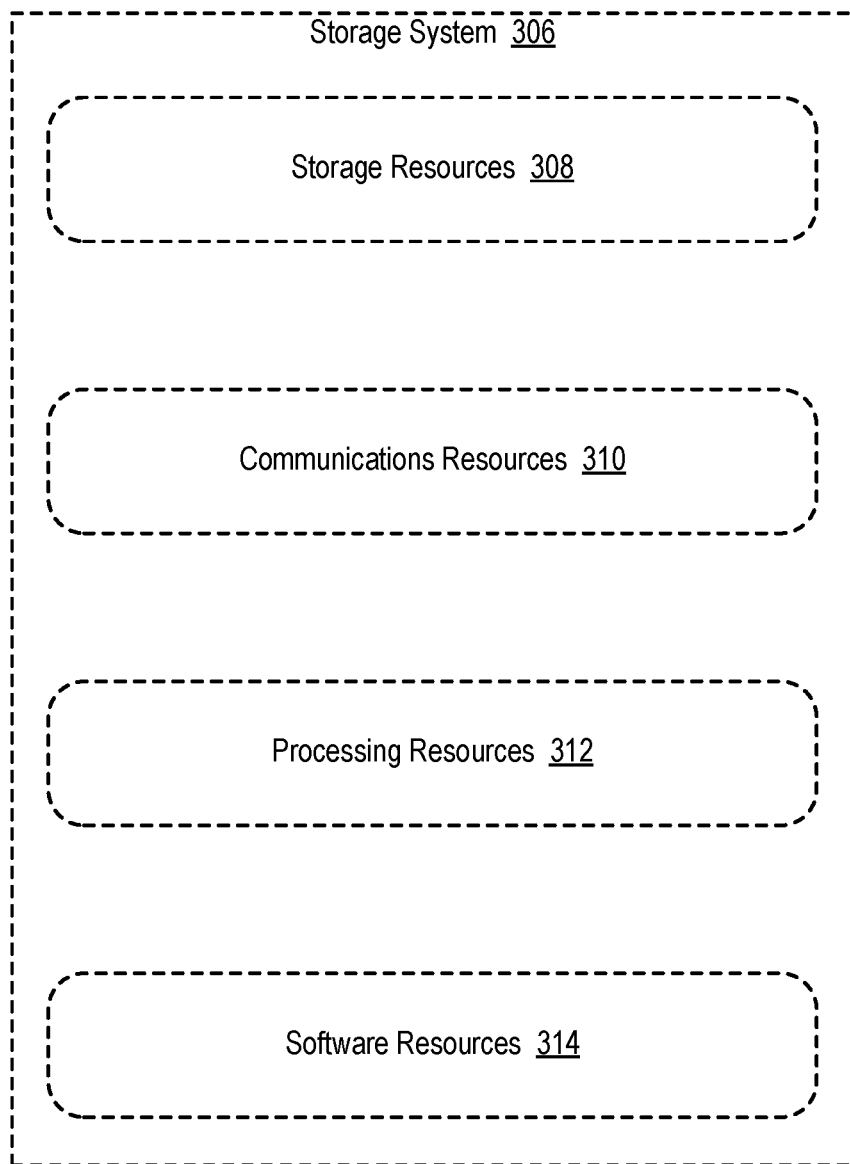
FIG. 3B sets forth a diagram of a storage system in accordance with some embodiments of the present disclosure.

For further explanation, FIG. 3B sets forth a diagram of a storage system 306 in accordance with some embodiments of the present disclosure. Although depicted in less detail, the storage system 306 depicted in FIG. 3B may be similar to the storage systems described above with reference to FIGS. 1A-1D and FIGS. 2A-2G as the storage system may include many of the components described above.

The storage system 306 depicted in FIG. 3B may include a vast amount of storage resources 308, which may be embodied in many forms. For example, the storage resources 308 can include nano-RAM or another form of nonvolatile random access memory that utilizes carbon nanotubes deposited on a substrate, 3D crosspoint non-volatile memory, flash memory including single-level cell ('SLC') NAND flash, multi-level cell ('MLC') NAND flash, triple-level cell ('TLC') NAND flash, quad-level cell ('QLC') NAND flash, or others. Likewise, the storage resources 308 may include non-volatile magnetoresistive random-access memory ('MRAM'), including spin transfer torque ('STT') MRAM. The example storage resources 308 may alternatively include non-volatile phase-change memory ('PCM'), quantum memory that allows for the storage and retrieval of photonic quantum information, resistive random-access memory ('ReRAM'), storage class memory ('SCM'), or other form of storage resources, including any combination of resources described herein. Readers will appreciate that other forms of computer memories and storage devices may be utilized by the storage systems described above, including DRAM, SRAM, EEPROM, universal memory, and many others. The storage resources 308 depicted in FIG. 3A may be embodied in a variety of form factors, including but not limited to, dual in-line memory modules ('DIMMs'), non-volatile dual in-line memory modules ('NVDIMMs'), M.2, U.2, and others.

The storage resources 308 depicted in FIG. 3B may include various forms of SCM. SCM may effectively treat fast, non-volatile memory (e.g., NAND flash) as an extension of DRAM such that an entire dataset may be treated as an in-memory dataset that resides entirely in DRAM. SCM may include non-volatile media such as, for example, NAND flash. Such NAND flash may be accessed utilizing NVMe that can use the PCIe bus as its transport, providing for relatively low access latencies compared to older protocols. In fact, the network protocols used for SSDs in all-flash arrays can include NVMe using Ethernet (ROCE, NVME TCP), Fibre Channel (NVMe FC), InfiniBand (iWARP), and others that make it possible to treat fast, non-volatile memory as an extension of DRAM. In view of the fact that DRAM is often byte-addressable and fast, non-volatile memory such as NAND flash is block-addressable, a controller software/hardware stack may be needed to convert the block data to the bytes that are stored in the media. Examples of media and software that may be used as SCM can include, for example, 3D XPoint, Intel Memory Drive Technology, Samsung's Z-SSD, and others.

The storage resources 308 depicted in FIG. 3B may also include racetrack memory (also referred to as domain-wall memory). Such racetrack memory may be embodied as a form of non-volatile, solid-state memory that relies on the intrinsic strength and orientation of the magnetic field created by an electron as it spins in addition to its electronic charge, in solid-state devices. Through the use of spin-coherent electric current to move magnetic domains along a nanoscopic permalloy wire, the domains may pass by magnetic read/write heads positioned near the wire as current is passed through the wire, which alter the domains to record patterns of bits. In order to create a racetrack memory device, many such wires and read/write elements may be packaged together.

The example storage system 306 depicted in FIG. 3B may implement a variety of storage architectures. For example, storage systems in accordance with some embodiments of the present disclosure may utilize block storage where data is stored in blocks, and each block essentially acts as an individual hard drive. Storage systems in accordance with some embodiments of the present disclosure may utilize object storage, where data is managed as objects. Each object may include the data itself, a variable amount of metadata, and a globally unique identifier, where object storage can be implemented at multiple levels (e.g., device level, system level, interface level). Storage systems in accordance with some embodiments of the present disclosure utilize file storage in which data is stored in a hierarchical structure. Such data may be saved in files and folders, and presented to both the system storing it and the system retrieving it in the same format.

The example storage system 306 depicted in FIG. 3B may be embodied as a storage system in which additional storage resources can be added through the use of a scale-up model, additional storage resources can be added through the use of a scale-out model, or through some combination thereof. In a scale-up model, additional storage may be added by adding additional storage devices. In a scale-out model, however, additional storage nodes may be added to a cluster of storage nodes, where such storage nodes can include additional processing resources, additional networking resources, and so on.

The example storage system 306 depicted in FIG. 3B may leverage the storage resources described above in a variety of different ways. For example, some portion of the storage resources may be utilized to serve as a write cache, storage resources within the storage system may be utilized as a read cache, or tiering may be achieved within the storage systems by placing data within the storage system in accordance with one or more tiering policies.

The storage system 306 depicted in FIG. 3B also includes communications resources 310 that may be useful in facilitating data communications between components within the storage system 306, as well as data communications between the storage system 306 and computing devices that are outside of the storage system 306, including embodiments where those resources are separated by a relatively vast expanse. The communications resources 310 may be configured to utilize a variety of different protocols and data communication fabrics to facilitate data communications between components within the storage systems as well as computing devices that are outside of the storage system. For example, the communications resources 310 can include fibre channel ('FC') technologies such as FC fabrics and FC protocols that can transport SCSI commands over FC network, FC over ethernet ('FCoE') technologies through which FC frames are encapsulated and transmitted over Ethernet networks, InfiniBand ('IB') technologies in which a switched fabric topology is utilized to facilitate transmissions between channel adapters, NVM Express ('NVMe') technologies and NVMe over fabrics ('NVMeoF') technologies through which non-volatile storage media attached via a PCI express ('PCIe') bus may be accessed, and others. In fact, the storage systems described above may, directly or indirectly, make use of neutrino communication technologies and devices through which information (including binary information) is transmitted using a beam of neutrinos.

The communications resources 310 can also include mechanisms for accessing storage resources 308 within the storage system 306 utilizing serial attached SCSI ('SAS'), serial ATA ('SATA') bus interfaces for connecting storage resources 308 within the storage system 306 to host bus adapters within the storage system 306, internet small computer systems interface ('iSCSI') technologies to provide block-level access to storage resources 308 within the storage system 306, and other communications resources that may be useful in facilitating data communications between components within the storage system 306, as well as data communications between the storage system 306 and computing devices that are outside of the storage system 306.

The storage system 306 depicted in FIG. 3B also includes processing resources 312 that may be useful in executing computer program instructions and performing other computational tasks within the storage system 306. The processing resources 312 may include one or more ASICs that are customized for some particular purpose as well as one or more CPUs. The processing resources 312 may also include one or more DSPs, one or more FPGAs, one or more systems on a chip ('SoCs'), or other form of processing resources 312. The storage system 306 may utilize the storage resources 312 to perform a variety of tasks including, but not limited to, supporting the execution of software resources 314 that will be described in greater detail below.

The storage system 306 depicted in FIG. 3B also includes software resources 314 that, when executed by processing resources 312 within the storage system 306, may perform a vast array of tasks. The software resources 314 may include, for example, one or more modules of computer program instructions that when executed by processing resources 312 within the storage system 306 are useful in carrying out various data protection techniques. Such data protection techniques may be carried out, for example, by system software executing on computer hardware within the storage system, by a cloud services provider, or in other ways. Such data protection techniques can include data archiving, data backup, data replication, data snapshotting, data and database cloning, and other data protection techniques.

The software resources 314 may also include software that is useful in implementing software-defined storage ('SDS'). In such an example, the software resources 314 may include one or more modules of computer program instructions that, when executed, are useful in policy-based provisioning and management of data storage that is independent of the underlying hardware. Such software resources 314 may be useful in implementing storage virtualization to separate the storage hardware from the software that manages the storage hardware.

The software resources 314 may also include software that is useful in facilitating and optimizing I/O operations that are directed to the storage system 306. For example, the software resources 314 may include software modules that perform various data reduction techniques such as, for example, data compression, data deduplication, and others. The software resources 314 may include software modules that intelligently group together I/O operations to facilitate better usage of the underlying storage resource 308, software modules that perform data migration operations to migrate from within a storage system, as well as software modules that perform other functions. Such software resources 314 may be embodied as one or more software containers or in many other ways.

Figure 3C:
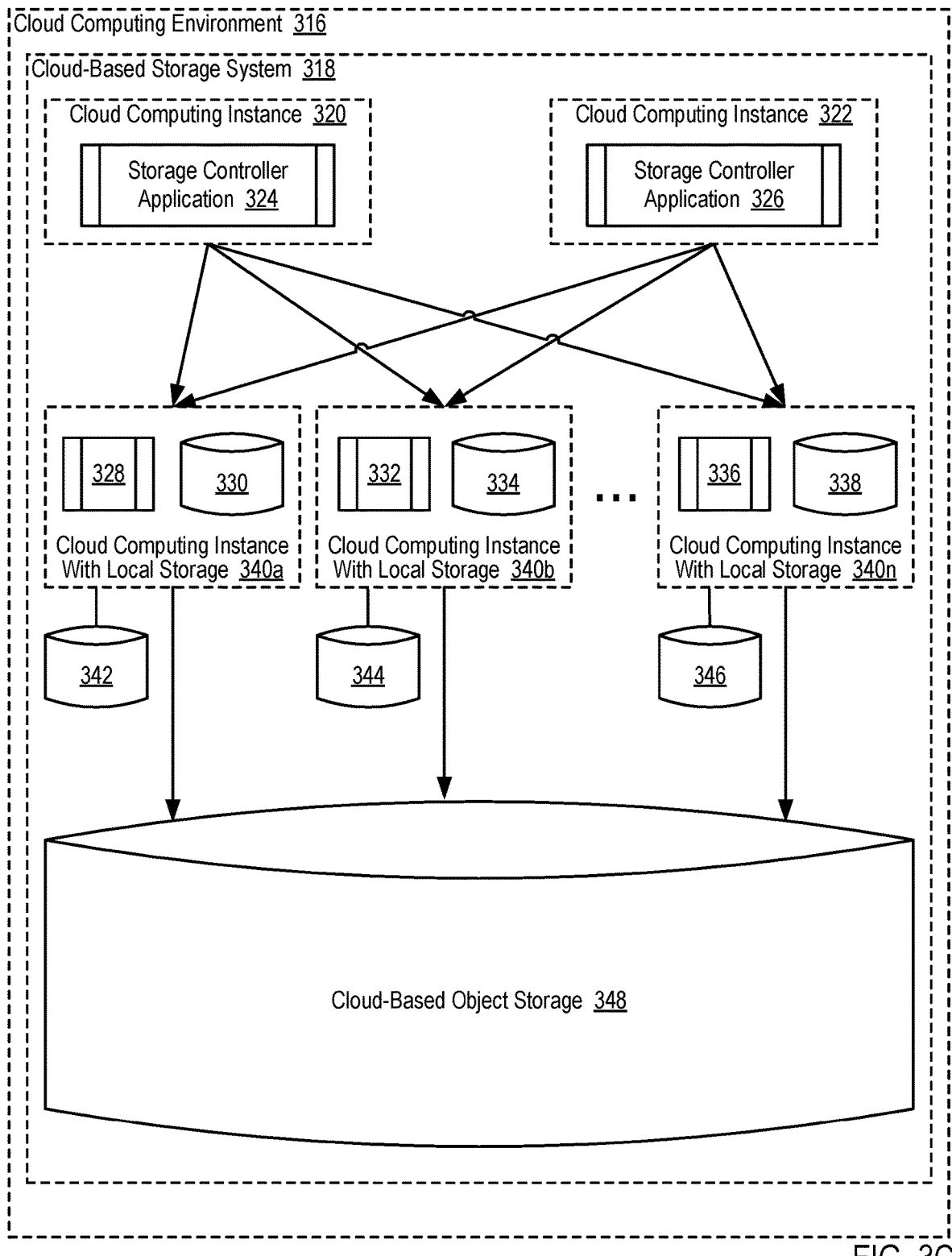
FIG. 3C sets forth an example of a cloud-based storage system in accordance with some embodiments of the present disclosure.

For further explanation, FIG. 3C sets forth an example of a cloud-based storage system 318 in accordance with some embodiments of the present disclosure. In the example depicted in FIG. 3C, the cloud-based storage system 318 is created entirely in a cloud computing environment 316 such as, for example, Amazon Web Services ('AWS')™, Microsoft Azure™, Google Cloud Platform™, IBM Cloud™, Oracle Cloud™, and others. The cloud-based storage system 318 may be used to provide services similar to the services that may be provided by the storage systems described above.

The cloud-based storage system 318 depicted in FIG. 3C includes two cloud computing instances 320, 322 that each are used to support the execution of a storage controller application 324, 326. The cloud computing instances 320, 322 may be embodied, for example, as instances of cloud computing resources (e.g., virtual machines) that may be provided by the cloud computing environment 316 to support the execution of software applications such as the storage controller application 324, 326. For example, each of the cloud computing instances 320, 322 may execute on an Azure VM, where each Azure VM may include high speed temporary storage that may be leveraged as a cache (e.g., as a read cache). In one embodiment, the cloud computing instances 320, 322 may be embodied as Amazon Elastic Compute Cloud ('EC2') instances. In such an example, an Amazon Machine Image ('AMI') that includes the storage controller application 324, 326 may be booted to create and configure a virtual machine that may execute the storage controller application 324, 326.

In the example method depicted in FIG. 3C, the storage controller application 324, 326 may be embodied as a module of computer program instructions that, when executed, carries out various storage tasks. For example, the storage controller application 324, 326 may be embodied as a module of computer program instructions that, when executed, carries out the same tasks as the controllers 110A, 110B in FIG. 1A described above such as writing data to the cloud-based storage system 318, erasing data from the cloud-based storage system 318, retrieving data from the cloud-based storage system 318, monitoring and reporting of disk utilization and performance, performing redundancy operations, such as RAID or RAID-like data redundancy operations, compressing data, encrypting data, deduplicating data, and so forth. Readers will appreciate that because there are two cloud computing instances 320, 322 that each include the storage controller application 324, 326, in some embodiments one cloud computing instance 320 may operate as the primary controller as described above while the other cloud computing instance 322 may operate as the secondary controller as described above. Readers will appreciate that the storage controller application 324, 326 depicted in FIG. 3C may include identical source code that is executed within different cloud computing instances 320, 322 such as distinct EC2 instances.

Readers will appreciate that other embodiments that do not include a primary and secondary controller are within the scope of the present disclosure. For example, each cloud computing instance 320, 322 may operate as a primary controller for some portion of the address space supported by the cloud-based storage system 318, each cloud computing instance 320, 322 may operate as a primary controller where the servicing of I/O operations directed to the cloud-based storage system 318 are divided in some other way, and so on. In fact, in other embodiments where costs savings may be prioritized over performance demands, only a single cloud computing instance may exist that contains the storage controller application.

The cloud-based storage system 318 depicted in FIG. 3C includes cloud computing instances 340a, 340b, 340n with local storage 330, 334, 338. The cloud computing instances 340a, 340b, 340n may be embodied, for example, as instances of cloud computing resources that may be provided by the cloud computing environment 316 to support the execution of software applications. The cloud computing instances 340a, 340b, 340n of FIG. 3C may differ from the cloud computing instances 320, 322 described above as the cloud computing instances 340a, 340b, 340n of FIG. 3C have local storage 330, 334, 338 resources whereas the cloud computing instances 320, 322 that support the execution of the storage controller application 324, 326 need not have local storage resources. The cloud computing instances 340a, 340b, 340n with local storage 330, 334, 338 may be embodied, for example, as EC2 M5 instances that include one or more SSDs, as EC2 R5 instances that include one or more SSDs, as EC2 I3 instances that include one or more SSDs, and so on. In some embodiments, the local storage 330, 334, 338 must be embodied as solid-state storage (e.g., SSDs) rather than storage that makes use of hard disk drives.

In the example depicted in FIG. 3C, each of the cloud computing instances 340a, 340b, 340n with local storage 330, 334, 338 can include a software daemon 328, 332, 336 that, when executed by a cloud computing instance 340a, 340b, 340n can present itself to the storage controller applications 324, 326 as if the cloud computing instance 340a, 340b, 340n were a physical storage device (e.g., one or more SSDs). In such an example, the software daemon 328, 332, 336 may include computer program instructions similar to those that would normally be contained on a storage device such that the storage controller applications 324, 326 can send and receive the same commands that a storage controller would send to storage devices. In such a way, the storage controller applications 324, 326 may include code that is identical to (or substantially identical to) the code that would be executed by the controllers in the storage systems described above. In these and similar embodiments, communications between the storage controller applications 324, 326 and the cloud computing instances 340a, 340b, 340n with local storage 330, 334, 338 may utilize iSCSI, NVMe over TCP, messaging, a custom protocol, or in some other mechanism.

In the example depicted in FIG. 3C, each of the cloud computing instances 340a, 340b, 340n with local storage 330, 334, 338 may also be coupled to block storage 342, 344, 346 that is offered by the cloud computing environment 316 such as, for example, as Amazon Elastic Block Store ('EBS') volumes. In such an example, the block storage 342, 344, 346 that is offered by the cloud computing environment 316 may be utilized in a manner that is similar to how the NVRAM devices described above are utilized, as the software daemon 328, 332, 336 (or some other module) that is executing within a particular cloud computing instance 340a, 340b, 340n may, upon receiving a request to write data, initiate a write of the data to its attached EBS volume as well as a write of the data to its local storage 330, 334, 338 resources. In some alternative embodiments, data may only be written to the local storage 330, 334, 338 resources within a particular cloud computing instance 340a, 340b, 340n. In an alternative embodiment, rather than using the block storage 342, 344, 346 that is offered by the cloud computing environment 316 as NVRAM, actual RAM on each of the cloud computing instances 340a, 340b, 340n with local storage 330, 334, 338 may be used as NVRAM, thereby decreasing network utilization costs that would be associated with using an EBS volume as the NVRAM. In yet another embodiment, high performance block storage resources such as one or more Azure Ultra Disks may be utilized as the NVRAM.

The storage controller applications 324, 326 may be used to perform various tasks such as deduplicating the data contained in the request, compressing the data contained in the request, determining where to the write the data contained in the request, and so on, before ultimately sending a request to write a deduplicated, encrypted, or otherwise possibly updated version of the data to one or more of the cloud computing instances 340a, 340b, 340n with local storage 330, 334, 338. Either cloud computing instance 320, 322, in some embodiments, may receive a request to read data from the cloud-based storage system 318 and may ultimately send a request to read data to one or more of the cloud computing instances 340a, 340b, 340n with local storage 330, 334, 338.

When a request to write data is received by a particular cloud computing instance 340a, 340b, 340n with local storage 330, 334, 338, the software daemon 328, 332, 336 may be configured to not only write the data to its own local storage 330, 334, 338 resources and any appropriate block storage 342, 344, 346 resources, but the software daemon 328, 332, 336 may also be configured to write the data to cloud-based object storage 348 that is attached to the particular cloud computing instance 340a, 340b, 340n. The cloud-based object storage 348 that is attached to the particular cloud computing instance 340a, 340b, 340n may be embodied, for example, as Amazon Simple Storage Service ('S3'). In other embodiments, the cloud computing instances 320, 322 that each include the storage controller application 324, 326 may initiate the storage of the data in the local storage 330, 334, 338 of the cloud computing instances 340a, 340b, 340n and the cloud-based object storage 348. In other embodiments, rather than using both the cloud computing instances 340a, 340b, 340n with local storage 330, 334, 338 (also referred to herein as 'virtual drives') and the cloud-based object storage 348 to store data, a persistent storage layer may be implemented in other ways. For example, one or more Azure Ultra disks may be used to persistently store data (e.g., after the data has been written to the NVRAM layer).

While the local storage 330, 334, 338 resources and the block storage 342, 344, 346 resources that are utilized by the cloud computing instances 340a, 340b, 340n may support block-level access, the cloud-based object storage 348 that is attached to the particular cloud computing instance 340a, 340b, 340n supports only object-based access. The software daemon 328, 332, 336 may therefore be configured to take blocks of data, package those blocks into objects, and write the objects to the cloud-based object storage 348 that is attached to the particular cloud computing instance 340a, 340b, 340n.

Consider an example in which data is written to the local storage 330, 334, 338 resources and the block storage 342, 344, 346 resources that are utilized by the cloud computing instances 340a, 340b, 340n in 1 MB blocks. In such an example, assume that a user of the cloud-based storage system 318 issues a request to write data that, after being compressed and deduplicated by the storage controller application 324, 326 results in the need to write 5 MB of data. In such an example, writing the data to the local storage 330, 334, 338 resources and the block storage 342, 344, 346 resources that are utilized by the cloud computing instances 340a, 340b, 340n is relatively straightforward as 5 blocks that are 1 MB in size are written to the local storage 330, 334, 338 resources and the block storage 342, 344, 346 resources that are utilized by the cloud computing instances 340a, 340b, 340n. In such an example, the software daemon 328, 332, 336 may also be configured to create five objects containing distinct 1 MB chunks of the data. As such, in some embodiments, each object that is written to the cloud-based object storage 348 may be identical (or nearly identical) in size. Readers will appreciate that in such an example, metadata that is associated with the data itself may be included in each object (e.g., the first 1 MB of the object is data and the remaining portion is metadata associated with the data). Readers will appreciate that the cloud-based object storage 348 may be incorporated into the cloud-based storage system 318 to increase the durability of the cloud-based storage system 318.

In some embodiments, all data that is stored by the cloud-based storage system 318 may be stored in both: 1) the cloud-based object storage 348, and 2) at least one of the local storage 330, 334, 338 resources or block storage 342, 344, 346 resources that are utilized by the cloud computing instances 340a, 340b, 340n. In such embodiments, the local storage 330, 334, 338 resources and block storage 342, 344, 346 resources that are utilized by the cloud computing instances 340a, 340b, 340n may effectively operate as cache that generally includes all data that is also stored in S3, such that all reads of data may be serviced by the cloud computing instances 340a, 340b, 340n without requiring the cloud computing instances 340a, 340b, 340n to access the cloud-based object storage 348. Readers will appreciate that in other embodiments, however, all data that is stored by the cloud-based storage system 318 may be stored in the cloud-based object storage 348, but less than all data that is stored by the cloud-based storage system 318 may be stored in at least one of the local storage 330, 334, 338 resources or block storage 342, 344, 346 resources that are utilized by the cloud computing instances 340a, 340b, 340n. In such an example, various policies may be utilized to determine which subset of the data that is stored by the cloud-based storage system 318 should reside in both: 1) the cloud-based object storage 348, and 2) at least one of the local storage 330, 334, 338 resources or block storage 342, 344, 346 resources that are utilized by the cloud computing instances 340a, 340b, 340n.

One or more modules of computer program instructions that are executing within the cloud-based storage system 318 (e.g., a monitoring module that is executing on its own EC2 instance) may be designed to handle the failure of one or more of the cloud computing instances 340a, 340b, 340n with local storage 330, 334, 338. In such an example, the monitoring module may handle the failure of one or more of the cloud computing instances 340a, 340b, 340n with local storage 330, 334, 338 by creating one or more new cloud computing instances with local storage, retrieving data that was stored on the failed cloud computing instances 340a, 340b, 340n from the cloud-based object storage 348, and storing the data retrieved from the cloud-based object storage 348 in local storage on the newly created cloud computing instances. Readers will appreciate that many variants of this process may be implemented.

Readers will appreciate that various performance aspects of the cloud-based storage system 318 may be monitored (e.g., by a monitoring module that is executing in an EC2 instance) such that the cloud-based storage system 318 can be scaled-up or scaled-out as needed. For example, if the cloud computing instances 320, 322 that are used to support the execution of a storage controller application 324, 326 are undersized and not sufficiently servicing the I/O requests that are issued by users of the cloud-based storage system 318, a monitoring module may create a new, more powerful cloud computing instance (e.g., a cloud computing instance of a type that includes more processing power, more memory, etc. . . . ) that includes the storage controller application such that the new, more powerful cloud computing instance can begin operating as the primary controller. Likewise, if the monitoring module determines that the cloud computing instances 320, 322 that are used to support the execution of a storage controller application 324, 326 are oversized and that cost savings could be gained by switching to a smaller, less powerful cloud computing instance, the monitoring module may create a new, less powerful (and less expensive) cloud computing instance that includes the storage controller application such that the new, less powerful cloud computing instance can begin operating as the primary controller.

The storage systems described above may carry out intelligent data backup techniques through which data stored in the storage system may be copied and stored in a distinct location to avoid data loss in the event of equipment failure or some other form of catastrophe. For example, the storage systems described above may be configured to examine each backup to avoid restoring the storage system to an undesirable state. Consider an example in which malware infects the storage system. In such an example, the storage system may include software resources 314 that can scan each backup to identify backups that were captured before the malware infected the storage system and those backups that were captured after the malware infected the storage system. In such an example, the storage system may restore itself from a backup that does not include the malware—or at least not restore the portions of a backup that contained the malware. In such an example, the storage system may include software resources 314 that can scan each backup to identify the presences of malware (or a virus, or some other undesirable), for example, by identifying write operations that were serviced by the storage system and originated from a network subnet that is suspected to have delivered the malware, by identifying write operations that were serviced by the storage system and originated from a user that is suspected to have delivered the malware, by identifying write operations that were serviced by the storage system and examining the content of the write operation against fingerprints of the malware, and in many other ways.

Readers will further appreciate that the backups (often in the form of one or more snapshots) may also be utilized to perform rapid recovery of the storage system. Consider an example in which the storage system is infected with ransomware that locks users out of the storage system. In such an example, software resources 314 within the storage system may be configured to detect the presence of ransomware and may be further configured to restore the storage system to a point-in-time, using the retained backups, prior to the point-in-time at which the ransomware infected the storage system. In such an example, the presence of ransomware may be explicitly detected through the use of software tools utilized by the system, through the use of a key (e.g., a USB drive) that is inserted into the storage system, or in a similar way. Likewise, the presence of ransomware may be inferred in response to system activity meeting a predetermined fingerprint such as, for example, no reads or writes coming into the system for a predetermined period of time.

Readers will appreciate that the various components described above may be grouped into one or more optimized computing packages as converged infrastructures. Such converged infrastructures may include pools of computers, storage and networking resources that can be shared by multiple applications and managed in a collective manner using policy-driven processes. Such converged infrastructures may be implemented with a converged infrastructure reference architecture, with standalone appliances, with a software driven hyper-converged approach (e.g., hyper-converged infrastructures), or in other ways.

Readers will appreciate that the storage systems described in this disclosure may be useful for supporting various types of software applications. In fact, the storage systems may be 'application aware' in the sense that the storage systems may obtain, maintain, or otherwise have access to information describing connected applications (e.g., applications that utilize the storage systems) to optimize the operation of the storage system based on intelligence about the applications and their utilization patterns. For example, the storage system may optimize data layouts, optimize caching behaviors, optimize 'QoS' levels, or perform some other optimization that is designed to improve the storage performance that is experienced by the application.

As an example of one type of application that may be supported by the storage systems described herein, the storage system 306 may be useful in supporting artificial intelligence ('AI') applications, database applications, XOps projects (e.g., DevOps projects, DataOps projects, MLOps projects, ModelOps projects, PlatformOps projects), electronic design automation tools, event-driven software applications, high performance computing applications, simulation applications, high-speed data capture and analysis applications, machine learning applications, media production applications, media serving applications, picture archiving and communication systems ('PACS') applications, software development applications, virtual reality applications, augmented reality applications, and many other types of applications by providing storage resources to such applications.

In view of the fact that the storage systems include compute resources, storage resources, and a wide variety of other resources, the storage systems may be well suited to support applications that are resource intensive such as, for example, AI applications. AI applications may be deployed in a variety of fields, including: predictive maintenance in manufacturing and related fields, healthcare applications such as patient data & risk analytics, retail and marketing deployments (e.g., search advertising, social media advertising), supply chains solutions, fintech solutions such as business analytics & reporting tools, operational deployments such as real-time analytics tools, application performance management tools, IT infrastructure management tools, and many others.

Such AI applications may enable devices to perceive their environment and take actions that maximize their chance of success at some goal. Examples of such AI applications can include IBM Watson™, Microsoft Oxford™, Google Deep-Mind™, Baidu Minwa™, and others.

The storage systems described above may also be well suited to support other types of applications that are resource intensive such as, for example, machine learning applications. Machine learning applications may perform various types of data analysis to automate analytical model building. Using algorithms that iteratively learn from data, machine learning applications can enable computers to learn without being explicitly programmed. One particular area of machine learning is referred to as reinforcement learning, which involves taking suitable actions to maximize reward in a particular situation.

In addition to the resources already described, the storage systems described above may also include graphics processing units ('GPUs'), occasionally referred to as visual processing unit ('VPUs'). Such GPUs may be embodied as specialized electronic circuits that rapidly manipulate and alter memory to accelerate the creation of images in a frame buffer intended for output to a display device. Such GPUs may be included within any of the computing devices that are part of the storage systems described above, including as one of many individually scalable components of a storage system, where other examples of individually scalable components of such storage system can include storage components, memory components, compute components (e.g., CPUs, FPGAs, ASICs), networking components, software components, and others. In addition to GPUs, the storage systems described above may also include neural network processors ('NNPs') for use in various aspects of neural network processing. Such NNPs may be used in place of (or in addition to) GPUs and may also be independently scalable.

As described above, the storage systems described herein may be configured to support artificial intelligence applications, machine learning applications, big data analytics applications, and many other types of applications. The rapid growth in these sort of applications is being driven by three technologies: deep learning (DL), GPU processors, and Big Data. Deep learning is a computing model that makes use of massively parallel neural networks inspired by the human brain. Instead of experts handcrafting software, a deep learning model writes its own software by learning from lots of examples. Such GPUs may include thousands of cores that are well-suited to run algorithms that loosely represent the parallel nature of the human brain.

Advances in deep neural networks, including the development of multi-layer neural networks, have ignited a new wave of algorithms and tools for data scientists to tap into their data with artificial intelligence (AI). With improved algorithms, larger data sets, and various frameworks (including open-source software libraries for machine learning across a range of tasks), data scientists are tackling new use cases like autonomous driving vehicles, natural language processing and understanding, computer vision, machine reasoning, strong AI, and many others. Applications of such techniques may include: machine and vehicular object detection, identification and avoidance; visual recognition, classification and tagging; algorithmic financial trading strategy performance management; simultaneous localization and mapping; predictive maintenance of high-value machinery; prevention against cyber security threats, expertise automation; image recognition and classification; question answering; robotics; text analytics (extraction, classification) and text generation and translation; and many others. Applications of AI techniques has materialized in a wide array of products include, for example, Amazon Echo's speech recognition technology that allows users to talk to their machines, Google Translate™ which allows for machine-based language translation, Spotify's Discover Weekly that provides recommendations on new songs and artists that a user may like based on the user's usage and traffic analysis, Quill's text generation offering that takes structured data and turns it into narrative stories, Chatbots that provide real-time, contextually specific answers to questions in a dialog format, and many others.

Data is the heart of modern AI and deep learning algorithms. Before training can begin, one problem that must be addressed revolves around collecting the labeled data that is crucial for training an accurate AI model. A full scale AI deployment may be required to continuously collect, clean, transform, label, and store large amounts of data. Adding additional high quality data points directly translates to more accurate models and better insights. Data samples may undergo a series of processing steps including, but not limited to: 1) ingesting the data from an external source into the training system and storing the data in raw form, 2) cleaning and transforming the data in a format convenient for training, including linking data samples to the appropriate label, 3) exploring parameters and models, quickly testing with a smaller dataset, and iterating to converge on the most promising models to push into the production cluster, 4) executing training phases to select random batches of input data, including both new and older samples, and feeding those into production GPU servers for computation to update model parameters, and 5) evaluating including using a holdback portion of the data not used in training in order to evaluate model accuracy on the holdout data. This lifecycle may apply for any type of parallelized machine learning, not just neural networks or deep learning. For example, standard machine learning frameworks may rely on CPUs instead of GPUs but the data ingest and training workflows may be the same. Readers will appreciate that a single shared storage data hub creates a coordination point throughout the lifecycle without the need for extra data copies among the ingest, preprocessing, and training stages. Rarely is the ingested data used for only one purpose, and shared storage gives the flexibility to train multiple different models or apply traditional analytics to the data.

Readers will appreciate that each stage in the AI data pipeline may have varying requirements from the data hub (e.g., the storage system or collection of storage systems). Scale-out storage systems must deliver uncompromising performance for all manner of access types and patterns—from small, metadata-heavy to large files, from random to sequential access patterns, and from low to high concurrency. The storage systems described above may serve as an ideal AI data hub as the systems may service unstructured workloads. In the first stage, data is ideally ingested and stored on to the same data hub that following stages will use, in order to avoid excess data copying. The next two steps can be done on a standard compute server that optionally includes a GPU, and then in the fourth and last stage, full training production jobs are run on powerful GPU-accelerated servers. Often, there is a production pipeline alongside an experimental pipeline operating on the same dataset. Further, the GPU-accelerated servers can be used independently for different models or joined together to train on one larger model, even spanning multiple systems for distributed training. If the shared storage tier is slow, then data must be copied to local storage for each phase, resulting in wasted time staging data onto different servers. The ideal data hub for the AI training pipeline delivers performance similar to data stored locally on the server node while also having the simplicity and performance to enable all pipeline stages to operate concurrently.

In order for the storage systems described above to serve as a data hub or as part of an AI deployment, in some embodiments the storage systems may be configured to provide DMA between storage devices that are included in the storage systems and one or more GPUs that are used in an AI or big data analytics pipeline. The one or more GPUs may be coupled to the storage system, for example, via NVMe-over-Fabrics ('NVMe-oF') such that bottlenecks such as the host CPU can be bypassed and the storage system (or one of the components contained therein) can directly access GPU memory. In such an example, the storage systems may leverage API hooks to the GPUs to transfer data directly to the GPUs. For example, the GPUs may be embodied as Nvidia™ GPUs and the storage systems may support GPUDirect Storage ('GDS') software, or have similar proprietary software, that enables the storage system to transfer data to the GPUs via RDMA or similar mechanism.

Although the preceding paragraphs discuss deep learning applications, readers will appreciate that the storage systems described herein may also be part of a distributed deep learning ('DDL') platform to support the execution of DDL algorithms. The storage systems described above may also be paired with other technologies such as TensorFlow, an open-source software library for dataflow programming across a range of tasks that may be used for machine learning applications such as neural networks, to facilitate the development of such machine learning models, applications, and so on.

The storage systems described above may also be used in a neuromorphic computing environment. Neuromorphic computing is a form of computing that mimics brain cells. To support neuromorphic computing, an architecture of interconnected "neurons" replace traditional computing models with low-powered signals that go directly between neurons for more efficient computation. Neuromorphic computing may make use of very-large-scale integration (VLSI) systems containing electronic analog circuits to mimic neuro-biological architectures present in the nervous system, as well as analog, digital, mixed-mode analog/digital VLSI, and software systems that implement models of neural systems for perception, motor control, or multisensory integration.

Readers will appreciate that the storage systems described above may be configured to support the storage or use of (among other types of data) blockchains and derivative items such as, for example, open source blockchains and related tools that are part of the IBM™ Hyperledger project, permissioned blockchains in which a certain number of trusted parties are allowed to access the block chain, blockchain products that enable developers to build their own distributed ledger projects, and others. Blockchains and the storage systems described herein may be leveraged to support on-chain storage of data as well as off-chain storage of data.

Off-chain storage of data can be implemented in a variety of ways and can occur when the data itself is not stored within the blockchain. For example, in one embodiment, a hash function may be utilized and the data itself may be fed into the hash function to generate a hash value. In such an example, the hashes of large pieces of data may be embedded within transactions, instead of the data itself. Readers will appreciate that, in other embodiments, alternatives to blockchains may be used to facilitate the decentralized storage of information. For example, one alternative to a blockchain that may be used is a blockweave. While conventional blockchains store every transaction to achieve validation, a blockweave permits secure decentralization without the usage of the entire chain, thereby enabling low cost on-chain storage of data. Such blockweaves may utilize a consensus mechanism that is based on proof of access (PoA) and proof of work (PoW).

The storage systems described above may, either alone or in combination with other computing devices, be used to support in-memory computing applications. In-memory computing involves the storage of information in RAM that is distributed across a cluster of computers. Readers will appreciate that the storage systems described above, especially those that are configurable with customizable amounts of processing resources, storage resources, and memory resources (e.g., those systems in which blades that contain configurable amounts of each type of resource), may be configured in a way so as to provide an infrastructure that can support in-memory computing. Likewise, the storage systems described above may include component parts (e.g., NVDIMMs, 3D crosspoint storage that provide fast random access memory that is persistent) that can actually provide for an improved in-memory computing environment as compared to in-memory computing environments that rely on RAM distributed across dedicated servers.

In some embodiments, the storage systems described above may be configured to operate as a hybrid in-memory computing environment that includes a universal interface to all storage media (e.g., RAM, flash storage, 3D crosspoint storage). In such embodiments, users may have no knowledge regarding the details of where their data is stored but they can still use the same full, unified API to address data. In such embodiments, the storage system may (in the background) move data to the fastest layer available—including intelligently placing the data in dependence upon various characteristics of the data or in dependence upon some other heuristic. In such an example, the storage systems may even make use of existing products such as Apache Ignite and GridGain to move data between the various storage layers, or the storage systems may make use of custom software to move data between the various storage layers. The storage systems described herein may implement various optimizations to improve the performance of in-memory computing such as, for example, having computations occur as close to the data as possible.

Readers will further appreciate that in some embodiments, the storage systems described above may be paired with other resources to support the applications described above. For example, one infrastructure could include primary compute in the form of servers and workstations which specialize in using General-purpose computing on graphics processing units ('GPGPU') to accelerate deep learning applications that are interconnected into a computation engine to train parameters for deep neural networks. Each system may have Ethernet external connectivity, InfiniBand external connectivity, some other form of external connectivity, or some combination thereof. In such an example, the GPUs can be grouped for a single large training or used independently to train multiple models. The infrastructure could also include a storage system such as those described above to provide, for example, a scale-out all-flash file or object store through which data can be accessed via high-performance protocols such as NFS, S3, and so on. The infrastructure can also include, for example, redundant top-of-rack Ethernet switches connected to storage and compute via ports in MLAG port channels for redundancy. The infrastructure could also include additional compute in the form of whitebox servers, optionally with GPUs, for data ingestion, pre-processing, and model debugging. Readers will appreciate that additional infrastructures are also possible.

Readers will appreciate that the storage systems described above, either alone or in coordination with other computing machinery may be configured to support other AI related tools. For example, the storage systems may make use of tools like ONXX or other open neural network exchange formats that make it easier to transfer models written in different AI frameworks. Likewise, the storage systems may be configured to support tools like Amazon's Gluon that allow developers to prototype, build, and train deep learning models. In fact, the storage systems described above may be part of a larger platform, such as IBM™ Cloud Private for Data, that includes integrated data science, data engineering and application building services.

Readers will further appreciate that the storage systems described above may also be deployed as an edge solution. Such an edge solution may be in place to optimize cloud computing systems by performing data processing at the edge of the network, near the source of the data. Edge computing can push applications, data and computing power (i.e., services) away from centralized points to the logical extremes of a network. Through the use of edge solutions such as the storage systems described above, computational tasks may be performed using the compute resources provided by such storage systems, data may be storage using the storage resources of the storage system, and cloud-based services may be accessed through the use of various resources of the storage system (including networking resources). By performing computational tasks on the edge solution, storing data on the edge solution, and generally making use of the edge solution, the consumption of expensive cloud-based resources may be avoided and, in fact, performance improvements may be experienced relative to a heavier reliance on cloud-based resources.

While many tasks may benefit from the utilization of an edge solution, some particular uses may be especially suited for deployment in such an environment. For example, devices like drones, autonomous cars, robots, and others may require extremely rapid processing—so fast, in fact, that sending data up to a cloud environment and back to receive data processing support may simply be too slow. As an additional example, some IoT devices such as connected video cameras may not be well-suited for the utilization of cloud-based resources as it may be impractical (not only from a privacy perspective, security perspective, or a financial perspective) to send the data to the cloud simply because of the pure volume of data that is involved. As such, many tasks that really on data processing, storage, or communications may be better suited by platforms that include edge solutions such as the storage systems described above.

The storage systems described above may alone, or in combination with other computing resources, serves as a network edge platform that combines compute resources, storage resources, networking resources, cloud technologies and network virtualization technologies, and so on. As part of the network, the edge may take on characteristics similar to other network facilities, from the customer premise and backhaul aggregation facilities to Points of Presence (PoPs) and regional data centers. Readers will appreciate that network workloads, such as Virtual Network Functions (VNFs) and others, will reside on the network edge platform. Enabled by a combination of containers and virtual machines, the network edge platform may rely on controllers and schedulers that are no longer geographically co-located with the data processing resources. The functions, as microservices, may split into control planes, user and data planes, or even state machines, allowing for independent optimization and scaling techniques to be applied. Such user and data planes may be enabled through increased accelerators, both those residing in server platforms, such as FPGAs and Smart NICs, and through SDN-enabled merchant silicon and programmable ASICs.

The storage systems described above may also be optimized for use in big data analytics, including being leveraged as part of a composable data analytics pipeline where containerized analytics architectures, for example, make analytics capabilities more composable. Big data analytics may be generally described as the process of examining large and varied data sets to uncover hidden patterns, unknown correlations, market trends, customer preferences and other useful information that can help organizations make more-informed business decisions. As part of that process, semi-structured and unstructured data such as, for example, internet clickstream data, web server logs, social media content, text from customer emails and survey responses, mobile-phone call-detail records, IoT sensor data, and other data may be converted to a structured form.

The storage systems described above may also support (including implementing as a system interface) applications that perform tasks in response to human speech. For example, the storage systems may support the execution intelligent personal assistant applications such as, for example, Amazon's Alexa™, Apple Siri™, Google Voice™, Samsung Bixby™, Microsoft Cortana™, and others. While the examples described in the previous sentence make use of voice as input, the storage systems described above may also support chatbots, talkbots, chatterbots, or artificial conversational entities or other applications that are configured to conduct a conversation via auditory or textual methods. Likewise, the storage system may actually execute such an application to enable a user such as a system administrator to interact with the storage system via speech. Such applications are generally capable of voice interaction, music playback, making to-do lists, setting alarms, streaming podcasts, playing audiobooks, and providing weather, traffic, and other real time information, such as news, although in embodiments in accordance with the present disclosure, such applications may be utilized as interfaces to various system management operations.

The storage systems described above may also implement AI platforms for delivering on the vision of self-driving storage. Such AI platforms may be configured to deliver global predictive intelligence by collecting and analyzing large amounts of storage system telemetry data points to enable effortless management, analytics and support. In fact, such storage systems may be capable of predicting both capacity and performance, as well as generating intelligent advice on workload deployment, interaction and optimization. Such AI platforms may be configured to scan all incoming storage system telemetry data against a library of issue fingerprints to predict and resolve incidents in realtime, before they impact customer environments, and captures hundreds of variables related to performance that are used to forecast performance load.

The storage systems described above may support the serialized or simultaneous execution of artificial intelligence applications, machine learning applications, data analytics applications, data transformations, and other tasks that collectively may form an AI ladder. Such an AI ladder may effectively be formed by combining such elements to form a complete data science pipeline, where exist dependencies between elements of the AI ladder. For example, AI may require that some form of machine learning has taken place, machine learning may require that some form of analytics has taken place, analytics may require that some form of data and information architecting has taken place, and so on. As such, each element may be viewed as a rung in an AI ladder that collectively can form a complete and sophisticated AI solution.

The storage systems described above may also, either alone or in combination with other computing environments, be used to deliver an AI everywhere experience where AI permeates wide and expansive aspects of business and life. For example, AI may play an important role in the delivery of deep learning solutions, deep reinforcement learning solutions, artificial general intelligence solutions, autonomous vehicles, cognitive computing solutions, commercial UAVs or drones, conversational user interfaces, enterprise taxonomies, ontology management solutions, machine learning solutions, smart dust, smart robots, smart workplaces, and many others.

The storage systems described above may also, either alone or in combination with other computing environments, be used to deliver a wide range of transparently immersive experiences (including those that use digital twins of various "things" such as people, places, processes, systems, and so on) where technology can introduce transparency between people, businesses, and things. Such transparently immersive experiences may be delivered as augmented reality technologies, connected homes, virtual reality technologies, brain-computer interfaces, human augmentation technologies, nanotube electronics, volumetric displays, 4D printing technologies, or others.

The storage systems described above may also, either alone or in combination with other computing environments, be used to support a wide variety of digital platforms. Such digital platforms can include, for example, 5G wireless systems and platforms, digital twin platforms, edge computing platforms, IoT platforms, quantum computing platforms, serverless PaaS, software-defined security, neuromorphic computing platforms, and so on.

The storage systems described above may also be part of a multi-cloud environment in which multiple cloud computing and storage services are deployed in a single heterogeneous architecture. In order to facilitate the operation of such a multi-cloud environment, DevOps tools may be deployed to enable orchestration across clouds. Likewise, continuous development and continuous integration tools may be deployed to standardize processes around continuous integration and delivery, new feature rollout and provisioning cloud workloads. By standardizing these processes, a multi-cloud strategy may be implemented that enables the utilization of the best provider for each workload.

The storage systems described above may be used as a part of a platform to enable the use of crypto-anchors that may be used to authenticate a product's origins and contents to ensure that it matches a blockchain record associated with the product. Similarly, as part of a suite of tools to secure data stored on the storage system, the storage systems described above may implement various encryption technologies and schemes, including lattice cryptography. Lattice cryptography can involve constructions of cryptographic primitives that involve lattices, either in the construction itself or in the security proof. Unlike public-key schemes such as the RSA, Diffie-Hellman or Elliptic-Curve cryptosystems, which are easily attacked by a quantum computer, some lattice-based constructions appear to be resistant to attack by both classical and quantum computers.

A quantum computer is a device that performs quantum computing. Quantum computing is computing using quantum-mechanical phenomena, such as superposition and entanglement. Quantum computers differ from traditional computers that are based on transistors, as such traditional computers require that data be encoded into binary digits (bits), each of which is always in one of two definite states (0 or 1). In contrast to traditional computers, quantum computers use quantum bits, which can be in superpositions of states. A quantum computer maintains a sequence of qubits, where a single qubit can represent a one, a zero, or any quantum superposition of those two qubit states. A pair of qubits can be in any quantum superposition of 4 states, and three qubits in any superposition of 8 states. A quantum computer with n qubits can generally be in an arbitrary superposition of up to 2^n different states simultaneously, whereas a traditional computer can only be in one of these states at any one time. A quantum Turing machine is a theoretical model of such a computer.

The storage systems described above may also be paired with FPGA-accelerated servers as part of a larger AI or ML infrastructure. Such FPGA-accelerated servers may reside near (e.g., in the same data center) the storage systems described above or even incorporated into an appliance that includes one or more storage systems, one or more FPGA-accelerated servers, networking infrastructure that supports communications between the one or more storage systems and the one or more FPGA-accelerated servers, as well as other hardware and software components. Alternatively, FPGA-accelerated servers may reside within a cloud computing environment that may be used to perform compute-related tasks for AI and ML jobs. Any of the embodiments described above may be used to collectively serve as a FPGA-based AI or ML platform. Readers will appreciate that, in some embodiments of the FPGA-based AI or ML platform, the FPGAs that are contained within the FPGA-accelerated servers may be reconfigured for different types of ML models (e.g., LSTMs, CNNs, GRUs). The ability to reconfigure the FPGAs that are contained within the FPGA-accelerated servers may enable the acceleration of a ML or AI application based on the most optimal numerical precision and memory model being used. Readers will appreciate that by treating the collection of FPGA-accelerated servers as a pool of FPGAs, any CPU in the data center may utilize the pool of FPGAs as a shared hardware microservice, rather than limiting a server to dedicated accelerators plugged into it.

The FPGA-accelerated servers and the GPU-accelerated servers described above may implement a model of computing where, rather than keeping a small amount of data in a CPU and running a long stream of instructions over it as occurred in more traditional computing models, the machine learning model and parameters are pinned into the high-bandwidth on-chip memory with lots of data streaming through the high-bandwidth on-chip memory. FPGAs may even be more efficient than GPUs for this computing model, as the FPGAs can be programmed with only the instructions needed to run this kind of computing model.

The storage systems described above may be configured to provide parallel storage, for example, through the use of a parallel file system such as BeeGFS. Such parallel files systems may include a distributed metadata architecture. For example, the parallel file system may include a plurality of metadata servers across which metadata is distributed, as well as components that include services for clients and storage servers.

The systems described above can support the execution of a wide array of software applications. Such software applications can be deployed in a variety of ways, including container-based deployment models. Containerized applications may be managed using a variety of tools. For example, containerized applications may be managed using Docker Swarm, Kubernetes, and others. Containerized applications may be used to facilitate a serverless, cloud native computing deployment and management model for software applications. In support of a serverless, cloud native computing deployment and management model for software applications, containers may be used as part of an event handling mechanisms (e.g., AWS Lambdas) such that various events cause a containerized application to be spun up to operate as an event handler.

The systems described above may be deployed in a variety of ways, including being deployed in ways that support fifth generation ('5G') networks. 5G networks may support substantially faster data communications than previous generations of mobile communications networks and, as a consequence may lead to the disaggregation of data and computing resources as modern massive data centers may become less prominent and may be replaced, for example, by more-local, micro data centers that are close to the mobile-network towers. The systems described above may be included in such local, micro data centers and may be part of or paired to multi-access edge computing ('MEC') systems. Such MEC systems may enable cloud computing capabilities and an IT service environment at the edge of the cellular network. By running applications and performing related processing tasks closer to the cellular customer, network congestion may be reduced and applications may perform better.

The storage systems described above may also be configured to implement NVMe Zoned Namespaces. Through the use of NVMe Zoned Namespaces, the logical address space of a namespace is divided into zones. Each zone provides a logical block address range that must be written sequentially and explicitly reset before rewriting, thereby enabling the creation of namespaces that expose the natural boundaries of the device and offload management of internal mapping tables to the host. In order to implement NVMe Zoned Name Spaces ('ZNS'), ZNS SSDs or some other form of zoned block devices may be utilized that expose a namespace logical address space using zones. With the zones aligned to the internal physical properties of the device, several inefficiencies in the placement of data can be eliminated. In such embodiments, each zone may be mapped, for example, to a separate application such that functions like wear levelling and garbage collection could be performed on a per-zone or per-application basis rather than across the entire device. In order to support ZNS, the storage controllers described herein may be configured with to interact with zoned block devices through the usage of, for example, the Linux™ kernel zoned block device interface or other tools.

The storage systems described above may also be configured to implement zoned storage in other ways such as, for example, through the usage of shingled magnetic recording (SMR) storage devices. In examples where zoned storage is used, device-managed embodiments may be deployed where the storage devices hide this complexity by managing it in the firmware, presenting an interface like any other storage device. Alternatively, zoned storage may be implemented via a host-managed embodiment that depends on the operating system to know how to handle the drive, and only write sequentially to certain regions of the drive. Zoned storage may similarly be implemented using a host-aware embodiment in which a combination of a drive managed and host managed implementation is deployed.

The storage systems described herein may be used to form a data lake. A data lake may operate as the first place that an organization's data flows to, where such data may be in a raw format. Metadata tagging may be implemented to facilitate searches of data elements in the data lake, especially in embodiments where the data lake contains multiple stores of data, in formats not easily accessible or readable (e.g., unstructured data, semi-structured data, structured data). From the data lake, data may go downstream to a data warehouse where data may be stored in a more processed, packaged, and consumable format. The storage systems described above may also be used to implement such a data warehouse. In addition, a data mart or data hub may allow for data that is even more easily consumed, where the storage systems described above may also be used to provide the underlying storage resources necessary for a data mart or data hub. In embodiments, queries the data lake may require a schema-on-read approach, where data is applied to a plan or schema as it is pulled out of a stored location, rather than as it goes into the stored location.

The storage systems described herein may also be configured to implement a recovery point objective ('RPO'), which may be establish by a user, established by an administrator, established as a system default, established as part of a storage class or service that the storage system is participating in the delivery of, or in some other way. A "recovery point objective" is a goal for the maximum time difference between the last update to a source dataset and the last recoverable replicated dataset update that would be correctly recoverable, given a reason to do so, from a continuously or frequently updated copy of the source dataset. An update is correctly recoverable if it properly takes into account all updates that were processed on the source dataset prior to the last recoverable replicated dataset update.

In synchronous replication, the RPO would be zero, meaning that under normal operation, all completed updates on the source dataset should be present and correctly recoverable on the copy dataset. In best effort nearly synchronous replication, the RPO can be as low as a few seconds. In snapshot-based replication, the RPO can be roughly calculated as the interval between snapshots plus the time to transfer the modifications between a previous already transferred snapshot and the most recent to-be-replicated snapshot.

If updates accumulate faster than they are replicated, then an RPO can be missed. If more data to be replicated accumulates between two snapshots, for snapshot-based replication, than can be replicated between taking the snapshot and replicating that snapshot's cumulative updates to the copy, then the RPO can be missed. If, again in snapshot-based replication, data to be replicated accumulates at a faster rate than could be transferred in the time between subsequent snapshots, then replication can start to fall further behind which can extend the miss between the expected recovery point objective and the actual recovery point that is represented by the last correctly replicated update.

The storage systems described above may also be part of a shared nothing storage cluster. In a shared nothing storage cluster, each node of the cluster has local storage and communicates with other nodes in the cluster through networks, where the storage used by the cluster is (in general) provided only by the storage connected to each individual node. A collection of nodes that are synchronously replicating a dataset may be one example of a shared nothing storage cluster, as each storage system has local storage and communicates to other storage systems through a network, where those storage systems do not (in general) use storage from somewhere else that they share access to through some kind of interconnect. In contrast, some of the storage systems described above are themselves built as a shared-storage cluster, since there are drive shelves that are shared by the paired controllers. Other storage systems described above, however, are built as a shared nothing storage cluster, as all storage is local to a particular node (e.g., a blade) and all communication is through networks that link the compute nodes together.

In other embodiments, other forms of a shared nothing storage cluster can include embodiments where any node in the cluster has a local copy of all storage they need, and where data is mirrored through a synchronous style of replication to other nodes in the cluster either to ensure that the data isn't lost or because other nodes are also using that storage. In such an embodiment, if a new cluster node needs some data, that data can be copied to the new node from other nodes that have copies of the data.

In some embodiments, mirror-copy-based shared storage clusters may store multiple copies of all the cluster's stored data, with each subset of data replicated to a particular set of nodes, and different subsets of data replicated to different sets of nodes. In some variations, embodiments may store all of the cluster's stored data in all nodes, whereas in other variations nodes may be divided up such that a first set of nodes will all store the same set of data and a second, different set of nodes will all store a different set of data.

Readers will appreciate that RAFT-based databases (e.g., etcd) may operate like shared-nothing storage clusters where all RAFT nodes store all data. The amount of data stored in a RAFT cluster, however, may be limited so that extra copies don't consume too much storage. A container server cluster might also be able to replicate all data to all cluster nodes, presuming the containers don't tend to be too large and their bulk data (the data manipulated by the applications that run in the containers) is stored elsewhere such as in an S3 cluster or an external file server. In such an example, the container storage may be provided by the cluster directly through its shared-nothing storage model, with those containers providing the images that form the execution environment for parts of an application or service.

Figure 3D:
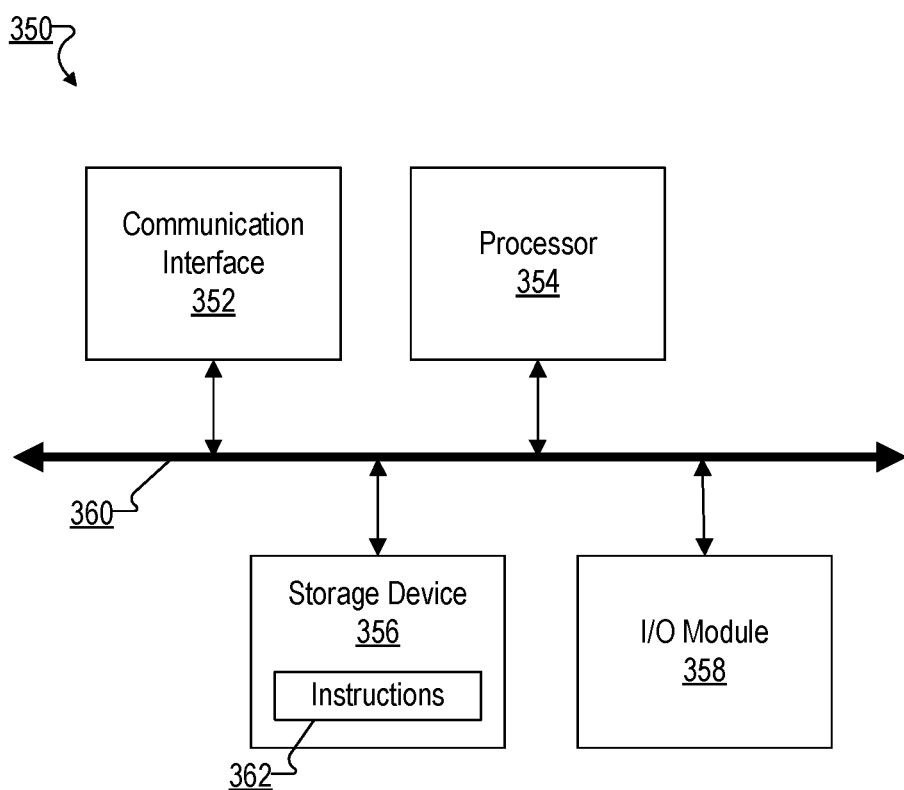
FIG. 3D illustrates an exemplary computing device that may be specifically configured to perform one or more of the processes described herein.

For further explanation, FIG. 3D illustrates an exemplary computing device 350 that may be specifically configured to perform one or more of the processes described herein. As shown in FIG. 3D, computing device 350 may include a communication interface 352, a processor 354, a storage device 356, and an input/output ("I/O") module 358 communicatively connected one to another via a communication infrastructure 360. While an exemplary computing device 350 is shown in FIG. 3D, the components illustrated in FIG. 3D are not intended to be limiting. Additional or alternative components may be used in other embodiments. Components of computing device 350 shown in FIG. 3D will now be described in additional detail.

Communication interface 352 may be configured to communicate with one or more computing devices. Examples of communication interface 352 include, without limitation, a wired network interface (such as a network interface card), a wireless network interface (such as a wireless network interface card), a modem, an audio/video connection, and any other suitable interface.

Processor 354 generally represents any type or form of processing unit capable of processing data and/or interpreting, executing, and/or directing execution of one or more of the instructions, processes, and/or operations described herein. Processor 354 may perform operations by executing computer-executable instructions 362 (e.g., an application, software, code, and/or other executable data instance) stored in storage device 356.

Storage device 356 may include one or more data storage media, devices, or configurations and may employ any type, form, and combination of data storage media and/or device. For example, storage device 356 may include, but is not limited to, any combination of the non-volatile media and/or volatile media described herein. Electronic data, including data described herein, may be temporarily and/or permanently stored in storage device 356. For example, data representative of computer-executable instructions 362 configured to direct processor 354 to perform any of the operations described herein may be stored within storage device 356. In some examples, data may be arranged in one or more databases residing within storage device 356.

I/O module 358 may include one or more I/O modules configured to receive user input and provide user output. I/O module 358 may include any hardware, firmware, software, or combination thereof supportive of input and output capabilities. For example, I/O module 358 may include hardware and/or software for capturing user input, including, but not limited to, a keyboard or keypad, a touchscreen component (e.g., touchscreen display), a receiver (e.g., an RF or infrared receiver), motion sensors, and/or one or more input buttons.

I/O module 358 may include one or more devices for presenting output to a user, including, but not limited to, a graphics engine, a display (e.g., a display screen), one or more output drivers (e.g., display drivers), one or more audio speakers, and one or more audio drivers. In certain embodiments, I/O module 358 is configured to provide graphical data to a display for presentation to a user. The graphical data may be representative of one or more graphical user interfaces and/or any other graphical content as may serve a particular implementation. In some examples, any of the systems, computing devices, and/or other components described herein may be implemented by computing device 350.

Figure 3E:
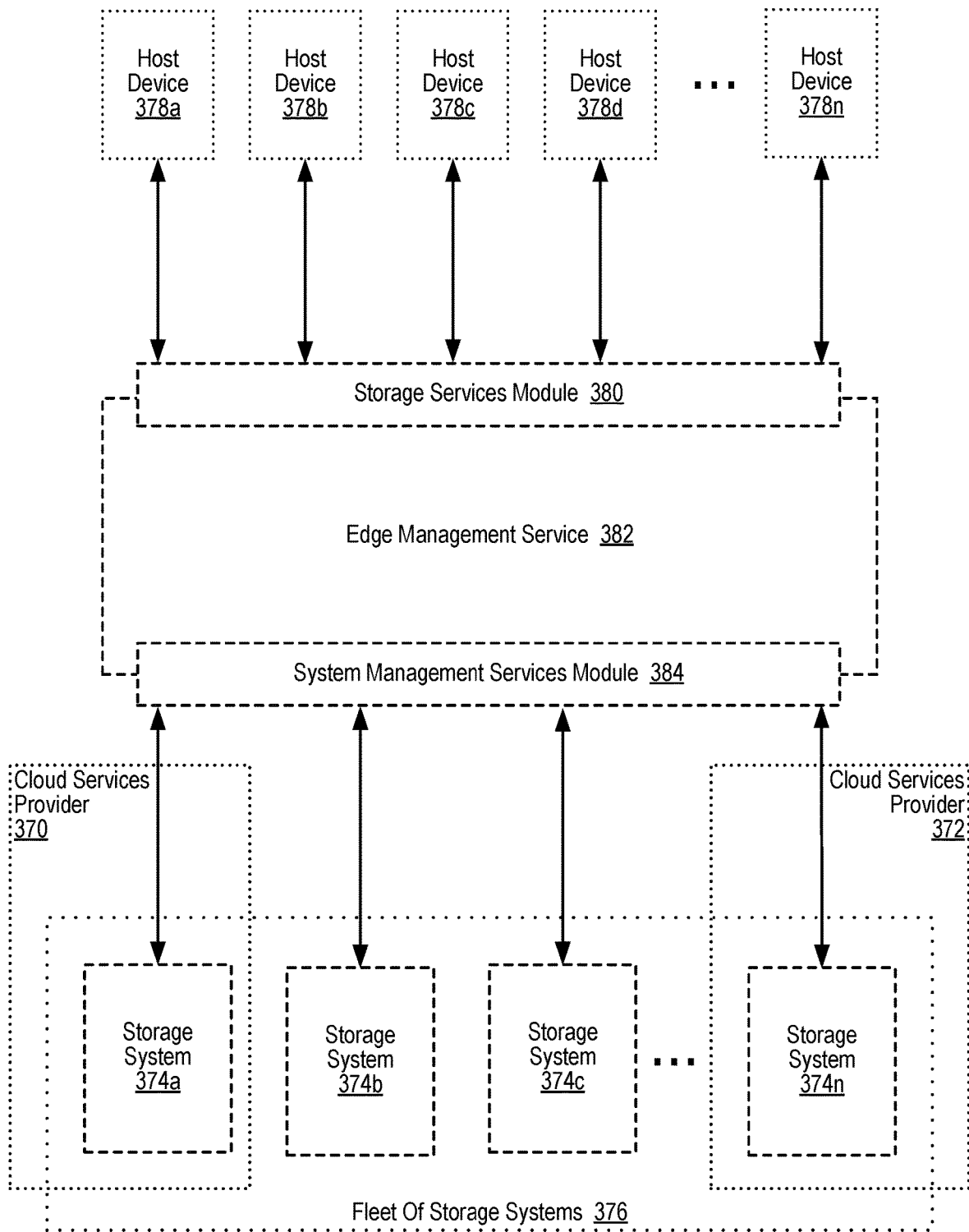
FIG. 3E illustrates an example of a fleet of storage systems for providing storage services, in accordance with embodiments of the disclosure.

For further explanation, FIG. 3E illustrates an example of a fleet of storage systems 376 for providing storage services (also referred to herein as 'data services'). The fleet of storage systems 376 depicted in FIG. 3 includes a plurality of storage systems 374a, 374b, 374c, 374d, 374n that may each be similar to the storage systems described herein. The storage systems 374a, 374b, 374c, 374d, 374n in the fleet of storage systems 376 may be embodied as identical storage systems or as different types of storage systems. For example, two of the storage systems 374a, 374n depicted in FIG. 3E are depicted as being cloud-based storage systems, as the resources that collectively form each of the storage systems 374a, 374n are provided by distinct cloud services providers 370, 372. For example, the first cloud services provider 370 may be Amazon AWS™ whereas the second cloud services provider 372 is Microsoft Azure™, although in other embodiments one or more public clouds, private clouds, or combinations thereof may be used to provide the underlying resources that are used to form a particular storage system in the fleet of storage systems 376.

The example depicted in FIG. 3E includes an edge management service 382 for delivering storage services in accordance with some embodiments of the present disclosure. The storage services (also referred to herein as 'data services') that are delivered may include, for example, services to provide a certain amount of storage to a consumer, services to provide storage to a consumer in accordance with a predetermined service level agreement, services to provide storage to a consumer in accordance with predetermined regulatory requirements, and many others.

The edge management service 382 depicted in FIG. 3E may be embodied, for example, as one or more modules of computer program instructions executing on computer hardware such as one or more computer processors. Alternatively, the edge management service 382 may be embodied as one or more modules of computer program instructions executing on a virtualized execution environment such as one or more virtual machines, in one or more containers, or in some other way. In other embodiments, the edge management service 382 may be embodied as a combination of the embodiments described above, including embodiments where the one or more modules of computer program instructions that are included in the edge management service 382 are distributed across multiple physical or virtual execution environments.

The edge management service 382 may operate as a gateway for providing storage services to storage consumers, where the storage services leverage storage offered by one or more storage systems 374a, 374b, 374c, 374d, 374n. For example, the edge management service 382 may be configured to provide storage services to host devices 378a, 378b, 378c, 378d, 378n that are executing one or more applications that consume the storage services. In such an example, the edge management service 382 may operate as a gateway between the host devices 378a, 378b, 378c, 378d, 378n and the storage systems 374a, 374b, 374c, 374d, 374n, rather than requiring that the host devices 378a, 378b, 378c, 378d, 378n directly access the storage systems 374a, 374b, 374c, 374d, 374n.

The edge management service 382 of FIG. 3E exposes a storage services module 380 to the host devices 378a, 378b, 378c, 378d, 378n of FIG. 3E, although in other embodiments the edge management service 382 may expose the storage services module 380 to other consumers of the various storage services. The various storage services may be presented to consumers via one or more user interfaces, via one or more APIs, or through some other mechanism provided by the storage services module 380. As such, the storage services module 380 depicted in FIG. 3E may be embodied as one or more modules of computer program instructions executing on physical hardware, on a virtualized execution environment, or combinations thereof, where executing such modules causes enables a consumer of storage services to be offered, select, and access the various storage services.

The edge management service 382 of FIG. 3E also includes a system management services module 384. The system management services module 384 of FIG. 3E includes one or more modules of computer program instructions that, when executed, perform various operations in coordination with the storage systems 374a, 374b, 374c, 374d, 374n to provide storage services to the host devices 378a, 378b, 378c, 378d, 378n. The system management services module 384 may be configured, for example, to perform tasks such as provisioning storage resources from the storage systems 374a, 374b, 374c, 374d, 374n via one or more APIs exposed by the storage systems 374a, 374b, 374c, 374d, 374n, migrating datasets or workloads amongst the storage systems 374a, 374b, 374c, 374d, 374n via one or more APIs exposed by the storage systems 374a, 374b, 374c, 374d, 374n, setting one or more tunable parameters (i.e., one or more configurable settings) on the storage systems 374a, 374b, 374c, 374d, 374n via one or more APIs exposed by the storage systems 374a, 374b, 374c, 374d, 374n, and so on. For example, many of the services described below relate to embodiments where the storage systems 374a, 374b, 374c, 374d, 374n are configured to operate in some way. In such examples, the system management services module 384 may be responsible for using APIs (or some other mechanism) provided by the storage systems 374a, 374b, 374c, 374d, 374n to configure the storage systems 374a, 374b, 374c, 374d, 374n to operate in the ways described below.

In addition to configuring the storage systems 374a, 374b, 374c, 374d, 374n, the edge management service 382 itself may be configured to perform various tasks required to provide the various storage services. Consider an example in which the storage service includes a service that, when selected and applied, causes personally identifiable information (PIP) contained in a dataset to be obfuscated when the dataset is accessed. In such an example, the storage systems 374a, 374b, 374c, 374d, 374n may be configured to obfuscate PII when servicing read requests directed to the dataset. Alternatively, the storage systems 374a, 374b, 374c, 374d, 374n may service reads by returning data that includes the PII, but the edge management service 382 itself may obfuscate the PII as the data is passed through the edge management service 382 on its way from the storage systems 374a, 374b, 374c, 374d, 374n to the host devices 378a, 378b, 378c, 378d, 378n.

The storage systems 374a, 374b, 374c, 374d, 374n depicted in FIG. 3E may be embodied as one or more of the storage systems described above with reference to FIGS. 1A-3D, including variations thereof. In fact, the storage systems 374a, 374b, 374c, 374d, 374n may serve as a pool of storage resources where the individual components in that pool have different performance characteristics, different storage characteristics, and so on. For example, one of the storage systems 374a may be a cloud-based storage system, another storage system 374b may be a storage system that provides block storage, another storage system 374c may be a storage system that provides file storage, another storage system 374d may be a relatively high-performance storage system while another storage system 374n may be a relatively low-performance storage system, and so on. In alternative embodiments, only a single storage system may be present.

The storage systems 374a, 374b, 374c, 374d, 374n depicted in FIG. 3E may also be organized into different failure domains so that the failure of one storage system 374a should be totally unrelated to the failure of another storage system 374b. For example, each of the storage systems may receive power from independent power systems, each of the storage systems may be coupled for data communications over independent data communications networks, and so on. Furthermore, the storage systems in a first failure domain may be accessed via a first gateway whereas storage systems in a second failure domain may be accessed via a second gateway. For example, the first gateway may be a first instance of the edge management service 382 and the second gateway may be a second instance of the edge management service 382, including embodiments where each instance is distinct, or each instance is part of a distributed edge management service 382.

As an illustrative example of available storage services, storage services may be presented to a user that are associated with different levels of data protection. For example, storage services may be presented to the user that, when selected and enforced, guarantee the user that data associated with that user will be protected such that various recovery point objectives ('RPO') can be guaranteed. A first available storage service may ensure, for example, that some dataset associated with the user will be protected such that any data that is more than 5 seconds old can be recovered in the event of a failure of the primary data store whereas a second available storage service may ensure that the dataset that is associated with the user will be protected such that any data that is more than 5 minutes old can be recovered in the event of a failure of the primary data store.

An additional example of storage services that may be presented to a user, selected by a user, and ultimately applied to a dataset associated with the user can include one or more data compliance services. Such data compliance services may be embodied, for example, as services that may be provided to consumers (i.e., a user) the data compliance services to ensure that the user's datasets are managed in a way to adhere to various regulatory requirements. For example, one or more data compliance services may be offered to a user to ensure that the user's datasets are managed in a way so as to adhere to the General Data Protection Regulation ('GDPR'), one or data compliance services may be offered to a user to ensure that the user's datasets are managed in a way so as to adhere to the Sarbanes-Oxley Act of 2002 ('SOX'), or one or more data compliance services may be offered to a user to ensure that the user's datasets are managed in a way so as to adhere to some other regulatory act. In addition, the one or more data compliance services may be offered to a user to ensure that the user's datasets are managed in a way so as to adhere to some non-governmental guidance (e.g., to adhere to best practices for auditing purposes), the one or more data compliance services may be offered to a user to ensure that the user's datasets are managed in a way so as to adhere to a particular clients or organizations requirements, and so on.

Consider an example in which a particular data compliance service is designed to ensure that a user's datasets are managed in a way so as to adhere to the requirements set forth in the GDPR. While a listing of all requirements of the GDPR can be found in the regulation itself, for the purposes of illustration, an example requirement set forth in the GDPR requires that pseudonymization processes must be applied to stored data in order to transform personal data in such a way that the resulting data cannot be attributed to a specific data subject without the use of additional information. For example, data encryption techniques can be applied to render the original data unintelligible, and such data encryption techniques cannot be reversed without access to the correct decryption key. As such, the GDPR may require that the decryption key be kept separately from the pseudonymised data. One particular data compliance service may be offered to ensure adherence to the requirements set forth in this paragraph.

In order to provide this particular data compliance service, the data compliance service may be presented to a user (e.g., via a GUI) and selected by the user. In response to receiving the selection of the particular data compliance service, one or more storage services policies may be applied to a dataset associated with the user to carry out the particular data compliance service. For example, a storage services policy may be applied requiring that the dataset be encrypted prior to being stored in a storage system, prior to being stored in a cloud environment, or prior to being stored elsewhere. In order to enforce this policy, a requirement may be enforced not only requiring that the dataset be encrypted when stored, but a requirement may be put in place requiring that the dataset be encrypted prior to transmitting the dataset (e.g., sending the dataset to another party). In such an example, a storage services policy may also be put in place requiring that any encryption keys used to encrypt the dataset are not stored on the same system that stores the dataset itself. Readers will appreciate that many other forms of data compliance services may be offered and implemented in accordance with embodiments of the present disclosure.

The storage systems 374a, 374b, 374c, 374d, 374n in the fleet of storage systems 376 may be managed collectively, for example, by one or more fleet management modules. The fleet management modules may be part of or separate from the system management services module 384 depicted in FIG. 3E. The fleet management modules may perform tasks such as monitoring the health of each storage system in the fleet, initiating updates or upgrades on one or more storage systems in the fleet, migrating workloads for loading balancing or other performance purposes, and many other tasks. As such, and for many other reasons, the storage systems 374a, 374b, 374c, 374d, 374n may be coupled to each other via one or more data communications links in order to exchange data between the storage systems 374a, 374b, 374c, 374d, 374n.

The storage systems described herein may support various forms of data replication. For example, two or more of the storage systems may synchronously replicate a dataset between each other. In synchronous replication, distinct copies of a particular dataset may be maintained by multiple storage systems, but all accesses (e.g., a read) of the dataset should yield consistent results regardless of which storage system the access was directed to. For example, a read directed to any of the storage systems that are synchronously replicating the dataset should return identical results. As such, while updates to the version of the dataset need not occur at exactly the same time, precautions must be taken to ensure consistent accesses to the dataset. For example, if an update (e.g., a write) that is directed to the dataset is received by a first storage system, the update may only be acknowledged as being completed if all storage systems that are synchronously replicating the dataset have applied the update to their copies of the dataset. In such an example, synchronous replication may be carried out through the use of I/O forwarding (e.g., a write received at a first storage system is forwarded to a second storage system), communications between the storage systems (e.g., each storage system indicating that it has completed the update), or in other ways.

In other embodiments, a dataset may be replicated through the use of checkpoints. In checkpoint-based replication (also referred to as 'nearly synchronous replication'), a set of updates to a dataset (e.g., one or more write operations directed to the dataset) may occur between different checkpoints, such that a dataset has been updated to a specific checkpoint only if all updates to the dataset prior to the specific checkpoint have been completed. Consider an example in which a first storage system stores a live copy of a dataset that is being accessed by users of the dataset. In this example, assume that the dataset is being replicated from the first storage system to a second storage system using checkpoint-based replication. For example, the first storage system may send a first checkpoint (at time t=0) to the second storage system, followed by a first set of updates to the dataset, followed by a second checkpoint (at time t=1), followed by a second set of updates to the dataset, followed by a third checkpoint (at time t=2). In such an example, if the second storage system has performed all updates in the first set of updates but has not yet performed all updates in the second set of updates, the copy of the dataset that is stored on the second storage system may be up-to-date until the second checkpoint. Alternatively, if the second storage system has performed all updates in both the first set of updates and the second set of updates, the copy of the dataset that is stored on the second storage system may be up-to-date until the third checkpoint. Readers will appreciate that various types of checkpoints may be used (e.g., metadata only checkpoints), checkpoints may be spread out based on a variety of factors (e.g., time, number of operations, an RPO setting), and so on.

In other embodiments, a dataset may be replicated through snapshot-based replication (also referred to as 'asynchronous replication'). In snapshot-based replication, snapshots of a dataset may be sent from a replication source such as a first storage system to a replication target such as a second storage system. In such an embodiment, each snapshot may include the entire dataset or a subset of the dataset such as, for example, only the portions of the dataset that have changed since the last snapshot was sent from the replication source to the replication target. Readers will appreciate that snapshots may be sent on-demand, based on a policy that takes a variety of factors into consideration (e.g., time, number of operations, an RPO setting), or in some other way.

The storage systems described above may, either alone or in combination, by configured to serve as a continuous data protection store. A continuous data protection store is a feature of a storage system that records updates to a dataset in such a way that consistent images of prior contents of the dataset can be accessed with a low time granularity (often on the order of seconds, or even less), and stretching back for a reasonable period of time (often hours or days). These allow access to very recent consistent points in time for the dataset, and also allow access to points in time for a dataset that might have just preceded some event that, for example, caused parts of the dataset to be corrupted or otherwise lost, while retaining close to the maximum number of updates that preceded that event. Conceptually, they are like a sequence of snapshots of a dataset taken very frequently and kept for a long period of time, though continuous data protection stores are often implemented quite differently from snapshots. A storage system implementing a data continuous data protection store may further provide a means of accessing these points in time, accessing one or more of these points in time as snapshots or as cloned copies, or reverting the dataset back to one of those recorded points in time.

Over time, to reduce overhead, some points in the time held in a continuous data protection store can be merged with other nearby points in time, essentially deleting some of these points in time from the store. This can reduce the capacity needed to store updates. It may also be possible to convert a limited number of these points in time into longer duration snapshots. For example, such a store might keep a low granularity sequence of points in time stretching back a few hours from the present, with some points in time merged or deleted to reduce overhead for up to an additional day. Stretching back in the past further than that, some of these points in time could be converted to snapshots representing consistent point-in-time images from only every few hours.

Although some embodiments are described largely in the context of a storage system, readers of skill in the art will recognize that embodiments of the present disclosure may also take the form of a computer program product disposed upon computer readable storage media for use with any suitable processing system. Such computer readable storage media may be any storage medium for machine-readable information, including magnetic media, optical media, solid-state media, or other suitable media. Examples of such media include magnetic disks in hard drives or diskettes, compact disks for optical drives, magnetic tape, and others as will occur to those of skill in the art. Persons skilled in the art will immediately recognize that any computer system having suitable programming means will be capable of executing the steps described herein as embodied in a computer program product. Persons skilled in the art will recognize also that, although some of the embodiments described in this specification are oriented to software installed and executing on computer hardware, nevertheless, alternative embodiments implemented as firmware or as hardware are well within the scope of the present disclosure.

In some examples, a non-transitory computer-readable medium storing computer-readable instructions may be provided in accordance with the principles described herein. The instructions, when executed by a processor of a computing device, may direct the processor and/or computing device to perform one or more operations, including one or more of the operations described herein. Such instructions may be stored and/or transmitted using any of a variety of known computer-readable media.

A non-transitory computer-readable medium as referred to herein may include any non-transitory storage medium that participates in providing data (e.g., instructions) that may be read and/or executed by a computing device (e.g., by a processor of a computing device). For example, a non-transitory computer-readable medium may include, but is not limited to, any combination of non-volatile storage media and/or volatile storage media. Exemplary non-volatile storage media include, but are not limited to, read-only memory, flash memory, a solid-state drive, a magnetic storage device (e.g., a hard disk, a floppy disk, magnetic tape, etc.), ferroelectric random-access memory ("RAM"), and an optical disc (e.g., a compact disc, a digital video disc, a Blu-ray disc, etc.). Exemplary volatile storage media include, but are not limited to, RAM (e.g., dynamic RAM).

One or more embodiments may be described herein with the aid of method steps illustrating the performance of specified functions and relationships thereof. The boundaries and sequence of these functional building blocks and method steps have been arbitrarily defined herein for convenience of description. Alternate boundaries and sequences can be defined so long as the specified functions and relationships are appropriately performed. Any such alternate boundaries or sequences are thus within the scope and spirit of the claims. Further, the boundaries of these functional building blocks have been arbitrarily defined for convenience of description. Alternate boundaries could be defined as long as the certain significant functions are appropriately performed. Similarly, flow diagram blocks may also have been arbitrarily defined herein to illustrate certain significant functionality.

To the extent used, the flow diagram block boundaries and sequence could have been defined otherwise and still perform the certain significant functionality. Such alternate definitions of both functional building blocks and flow diagram blocks and sequences are thus within the scope and spirit of the claims. One of average skill in the art will also recognize that the functional building blocks, and other illustrative blocks, modules and components herein, can be implemented as illustrated or by discrete components, application specific integrated circuits, processors executing appropriate software and the like or any combination thereof.

While particular combinations of various functions and features of the one or more embodiments are expressly described herein, other combinations of these features and functions are likewise possible. The present disclosure is not limited by the particular examples disclosed herein and expressly incorporates these other combinations.

Figure 4:
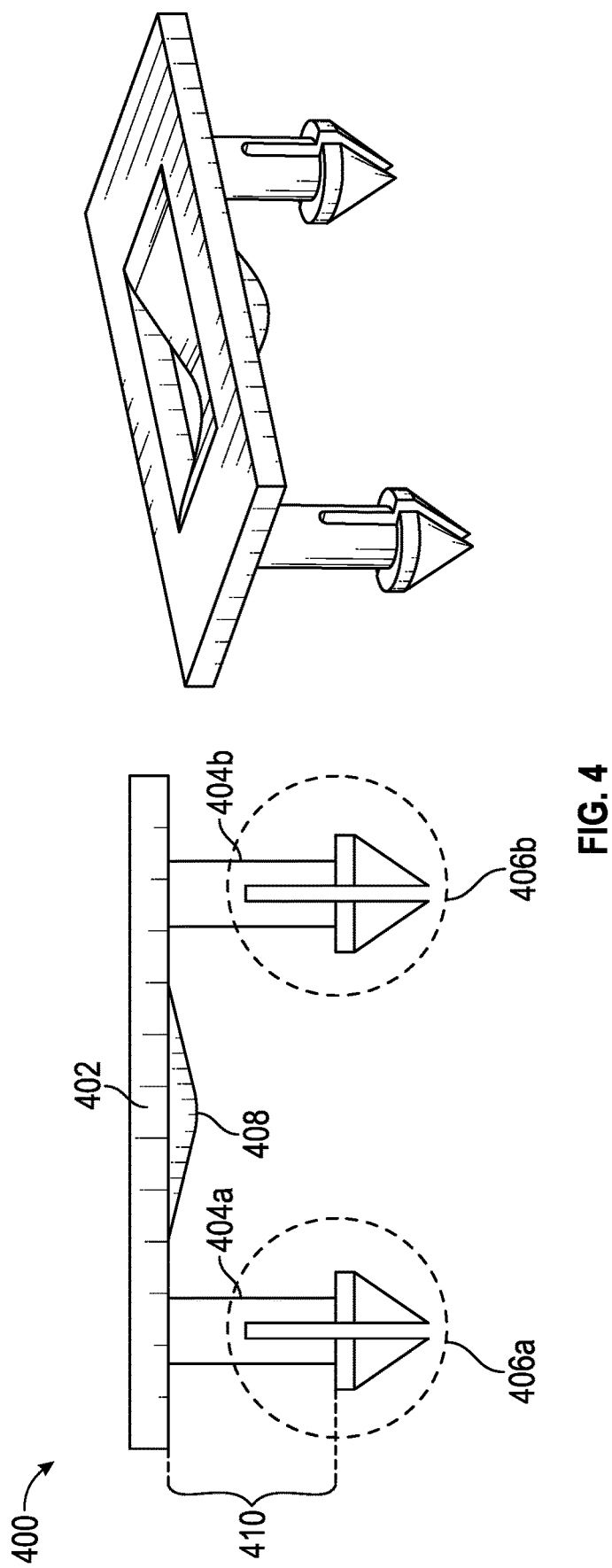
FIG. 4 is an illustration of an example of a bracket including an integrated leaf spring in the body, in accordance with embodiments of the disclosure.

FIG. 4 is an illustration of an example of a bracket 400 including an integrated leaf spring in the body, in accordance with embodiments of the disclosure. The bracket 400 may include a body 402 having an integrated mechanical energy storage component 408. In FIG. 4, the mechanical energy storage component 408 is illustrated as a leaf spring that is integrated into the body 402 and protrudes from the bottom surface of the body 402.

The bracket 400 further includes protrusion 404a and protrusion 404b that protrude from the bottom surface of the body 402. Protrusion 404a may be positioned to the left of the mechanical energy storage component 408 on the bottom surface of the body 402 and protrusion 404b may be positioned to the right of the mechanical energy storage component 408 on the bottom surface of the body 402. Protrusion 404a may include a coupling 406a at an end of protrusion 404a and protrusion 404b may include a coupling 406b at an end of protrusion 404b. Coupling 406a and coupling 406b may be used to couple a printed circuit board (PCB) to a chassis of a computer system when protrusion 404a and protrusion 404b are inserted through an opening in the PCB and the chassis, as previously described. When the bracket 400 is inserted through the opening in the PCB and the chassis, the mechanical energy storage component 408 may be depressed against the PCB or chassis, causing the mechanical energy storage component 408 to exert a force on the PCB or chassis. In embodiments, the PCB and the chassis may be components of a storage system, such as the storage systems previously described at FIGS. 1A-3E.

In some embodiments, coupling 406a and coupling 406b may be pressure fit couplings, as shown in FIG. 4. Coupling 406a and coupling 406b may contract as protrusion 404a and protrusion 404b are inserted into openings of a PCB or chassis, then expand after coupling 406a and coupling 406b have exited the opening. Physical interference between the PCB or chassis and coupling 406a and coupling 406b may then prevent bracket 400 from being removed. In embodiments, other types of couplings may be positioned on protrusion 404a and protrusion 404b.

Protrusion 404a and protrusion 404b may each have a corresponding length 410 between the bottom surface of the body 402 and coupling 406a and coupling 406b, respectively. In embodiments, the length 410 may be determined based on a first height of the chassis and/or a second height of the PCB that the bracket 400 may be coupling. For example, the length 410 may be determined to be greater than the combined heights of the chassis and the PCB, within a determined tolerance value. In another example, the length 410 may be determined to be greater than the height of the PCB.

In embodiments, the body 402, the mechanical energy storage component 408, protrusion 404a, and protrusion 404b of the bracket 400 may be formed of the same material. In some embodiments, the bracket 400 may be formed of a polymeric material. In embodiments, the bracket 400 may be formed of a metallic alloy. In an embodiment, the body 402, the mechanical energy storage component 408, protrusion 404a, and/or protrusion 404b of the bracket 400 may be formed of different materials. For example, the body 402, protrusion 404a, and protrusion 404b may be formed of plastic, while the mechanical energy storage component 408 may be formed of metal.

As previously described, the mechanical energy storage component 408 may provide a force that is greater than the external force that is exerted on the bracket 400 when the bracket 400 is coupling the PCB to the chassis. In embodiments, the external force may correspond to a shock force that may be exerted on the system including the bracket, PCB, and chassis. For example, the external force may correspond to a shock force caused by the dropping of the system. In an embodiment, the external force may correspond to a vibration force that may exerted on the system. In some embodiments, the force may correspond to a spring force of the mechanical energy storage component 408. For example, the force may correspond to the spring force of the leaf spring shown in FIG. 4. In embodiments, the thickness of the leaf spring may be determined to achieve a desired spring force. For example, a leaf spring having a higher spring force may have a higher thickness than a leaf spring having a lower spring force.

Figure 5:
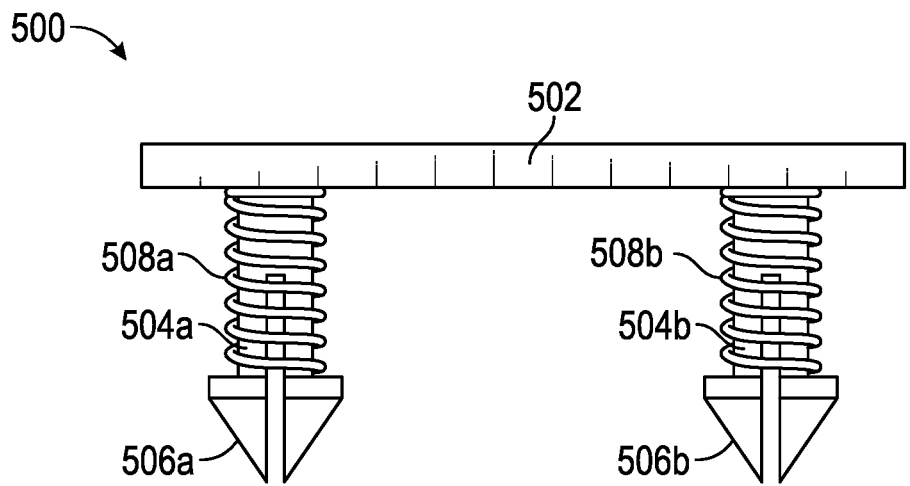
FIG. 5 is an illustration of an example of a bracket including helical springs as mechanical energy storage components, in accordance with embodiments of the disclosure.

FIG. 5 is an illustration of an example of a bracket 500 including helical springs as mechanical energy storage components, in accordance with embodiments of the disclosure. Bracket 500 includes body 502, protrusion 504a, protrusion 504b, coupling 506a, and coupling 506b, which may be similar to the components of bracket 400 of FIG. 4. Bracket 500 further includes mechanical energy storage component 508a and mechanical energy storage component 508b, which are illustrated in FIG. 5 as helical springs. In embodiments, the helical springs may be used instead of or in conjunction with other mechanical energy storage components, such as the leaf spring previously described at FIG. 4.

Mechanical energy storage component 508a may surround protrusion 504a and be positioned between the bottom surface of body 502 and coupling 506a. Mechanical energy storage component 508b may surround protrusion 504b and be positioned between the bottom surface of body 502 and coupling 506b. As previously described, when the bracket 500 is utilized to couple a PCB to a chassis, mechanical energy storage component 508a and mechanical energy storage component 508b may be depressed, causing the mechanical energy storage component 508a and mechanical energy storage component 508b to exert forces on the surfaces they are in contact with (e.g., body 502 and the PCB or chassis). In embodiments, mechanical energy storage component 508a and mechanical energy storage component 508b may each have a corresponding spring force which, when combined, may be greater than an external force that is to be exerted on the system including bracket 500. For example, mechanical energy storage component 508a and mechanical energy storage component 508b may have a combined spring force that is greater than the shock force and/or vibration force that is to be exerted on the system utilizing bracket 500.

Figure 6:
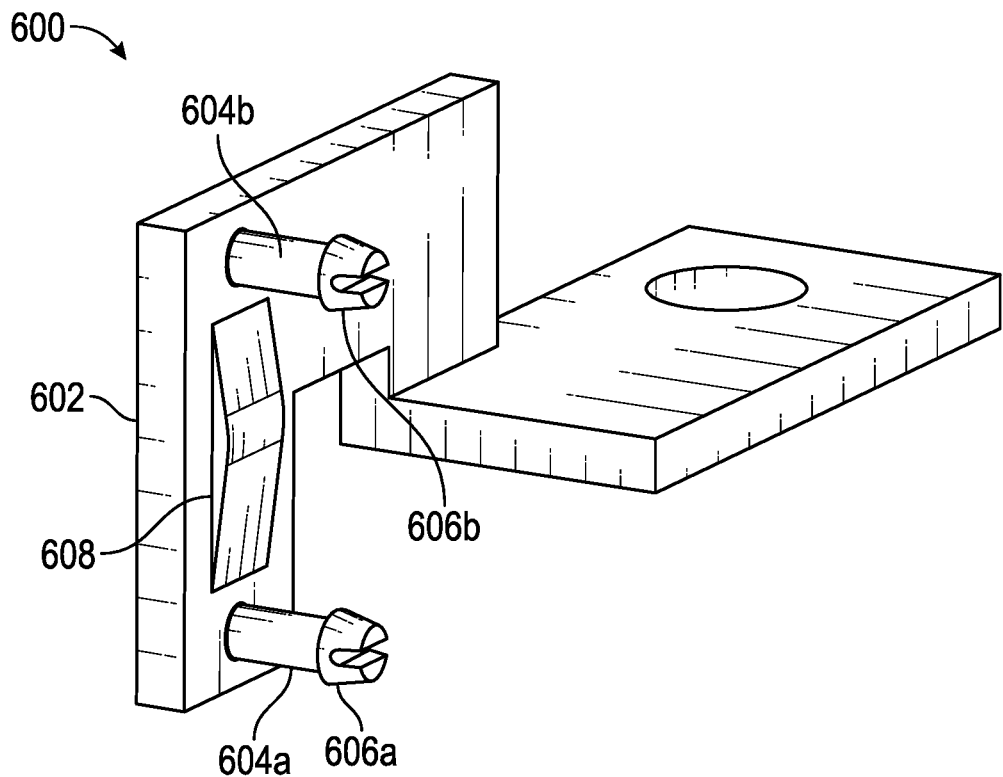
FIG. 6 is an illustration of an example of a bracket having a non-planar body, in accordance with embodiments of the disclosure.

FIG. 6 is an illustration of an example of a bracket 600 having a non-planar body, in accordance with embodiments of the disclosure. Bracket 600 may include protrusion 604a, protrusion 604b, coupling 606a, coupling 606b, and mechanical energy storage component 608, which may be similar to the components of bracket 400 of FIG. 4. Unlike body 402 of FIG. 4, bracket 600 includes a body 602 that has a non-planar geometry. In some embodiments, the physical geometry of the chassis and/or PCB to which the bracket 600 is being coupled may result in the body 602 having a non-planar geometry to sufficiently couple the PCB to the chassis, as will be described It should be noted that the brackets shown in FIGS. 4-6 are shown for illustrative purposes only. Embodiments of the disclosure may include brackets having different geometries, numbers of protrusions, types of couplings, and/or types of mechanical energy storage components.

Figure 7:
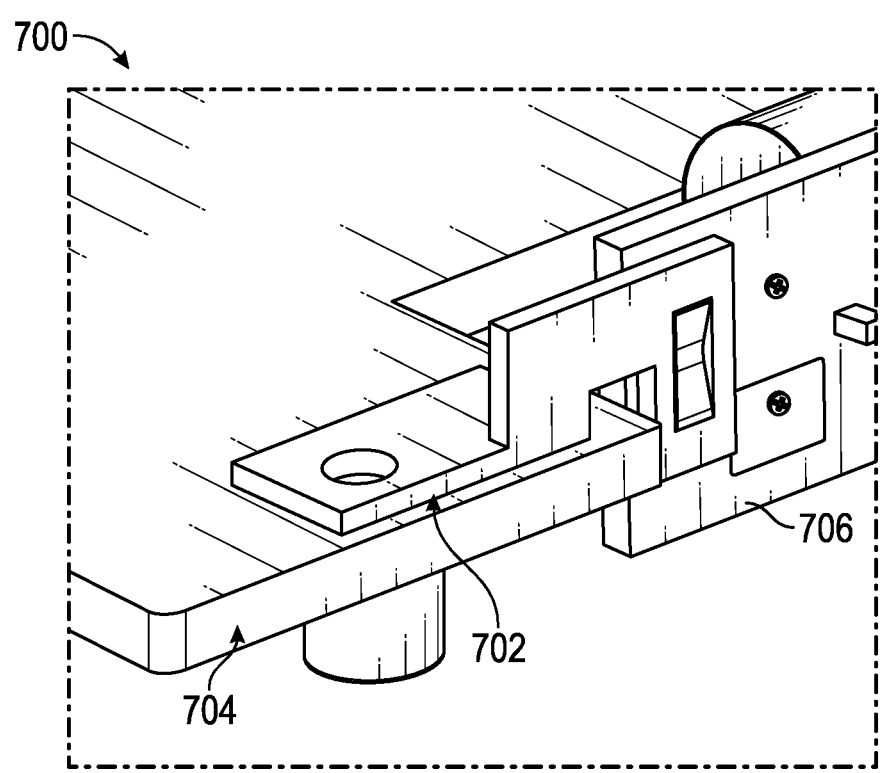
FIG. 7 is an illustration of an example of a system utilizing a mechanical energy absorbing bracket to couple a printed circuit board (PCB) to a chassis, in accordance with embodiments of the disclosure.

FIG. 7 is an illustration of an example of a system 700 utilizing a mechanical energy absorbing bracket to couple a printed circuit board (PCB) to a chassis, in accordance with embodiments of the disclosure. System 700 may include a bracket 702, which may correspond to bracket 600 of FIG. 6. System 700 may further include chassis 704 and PCB 706. As previously described, bracket 702 may be used to couple the chassis 704 to the PCB 706 while minimizing the external forces experienced by the PCB 706.

Referring to FIG. 7, the protrusions (e.g., protrusions 604a and 604b of FIG. 6) have been inserted through openings of PCB 706 and couplings (e.g., coupling 606a and coupling 606b) have secured the bracket 702 to PCB 706. As the bracket 702 is secured to the PCB 706, the mechanical energy storage component (e.g., mechanical energy storage component 608) of bracket 702 may be depressed, causing the mechanical energy storage component to exert a force on PCB 706 to secure the PCB 706 and minimize movement of PCB 706 due to external forces.

A portion of the non-planar body of bracket 702 may be positioned on a top surface of chassis 704, where the bracket 702 is coupled to the chassis 704. In some embodiments, the bracket 702 may be coupled to the chassis using one or more pressure fit couplings. In embodiments, the bracket 702 may be coupled to the chassis 704 using a pressure sensitive adhesive. In an embodiment, the bracket 702 may be coupled to the chassis using one or more screws or bolts. In some embodiments, other types of couplings may be used to secure bracket 702 to chassis 704.

Although FIG. 7 describes bracket 702 being used to couple chassis 704 to PCB 706, in some embodiments bracket 702 may be used to couple a first PCB to a second PCB (or any number of PCBs). In embodiments, the bracket 702 may be used to couple the multiple PCBs to a chassis, such as chassis 704. For example, the first PCB may have a connector that is coupled to the second PCB and the bracket 702 may be used to couple the first PCB to the second PCB, thereby reducing stresses on the connector.

While this specification contains many specific implementation details, these should not be construed as limitations on the scope of any inventions or of what may be claimed, but rather as descriptions of features specific to particular embodiments of particular inventions. Certain features that are described in this specification in the context of separate embodiments can also be implemented in combination in a single embodiment. Conversely, various features that are described in the context of a single embodiment can also be implemented in multiple embodiments separately or in any suitable subcombination. Moreover, although features may be described above as acting in certain combinations and even initially claimed as such, one or more features from a claimed combination can in some cases be excised from the combination, and the claimed combination may be directed to a subcombination or variation of a subcombination.

Similarly, while operations are depicted in the drawings in a particular order, this should not be understood as requiring that such operations be performed in the particular order shown or in sequential order, or that all illustrated operations be performed, to achieve desirable results. In certain circumstances, multitasking and parallel processing may be advantageous. Moreover, the separation of various system components in the embodiments described above should not be understood as requiring such separation in all embodiments, and it should be understood that the described program components and systems can generally be integrated together in a single software product or packaged into multiple software products.

Thus, particular embodiments of the subject matter have been described. Other embodiments are within the scope of the following claims. In some cases, the actions recited in the claims can be performed in a different order and still achieve desirable results. In addition, the processes depicted in the accompanying figures do not necessarily require the particular order shown, or sequential order, to achieve desirable results. In certain implementations, multitasking and parallel processing may be advantageous.

What is claimed is:

1. A system comprising:
   a chassis;
   a printed circuit board (PCB); and
   a bracket apparatus coupling the chassis to the PCB, the bracket apparatus comprising:
   a body comprising a plurality of protrusions from a surface of the body, wherein the plurality of protrusions has a corresponding pressure fit coupling positioned at a corresponding end of the plurality of protrusions, the pressure fit coupling extending through a surface of the PCB; and
   one or more mechanical energy storage components, wherein the one or more mechanical energy storage components provide a force that is greater than an external force exerted on the bracket, wherein the one or more mechanical energy storage components comprise a leaf spring integrated into the body and protrudes from the surface of the body, and wherein a first protrusion of the plurality of protrusions is positioned on a first side of the leaf spring and a second protrusion of the plurality of protrusions is positioned on a second side of the leaf spring that is opposite of the first side, wherein the body comprises a first body extension supporting the plurality of protrusions and a second body extension orthogonal to the first body extension, the second body extension coupled to the chassis.

2. The system of claim 1, wherein the leaf spring has a spring force that is greater than the external force.

3. The system of claim 1, wherein a length of the plurality of protrusions is based on a first height of the chassis and a second height of the printed circuit board (PCB).

4. An apparatus, comprising:
   a body comprising a plurality of protrusions from a surface of the body, wherein each of the plurality of protrusions has a corresponding pressure fit coupling positioned at a corresponding end of the plurality of protrusions, wherein the corresponding pressure fit coupling extends through a surface of a printed circuit board (PCB), wherein the PCB is a component of a storage system and wherein the apparatus is to couple the PCB to a chassis of the storage system; and
   one or more mechanical energy storage components, wherein the one or more mechanical energy storage components provide a force that is greater than an external force exerted on the apparatus, wherein the one or more mechanical energy storage components comprise a leaf spring integrated into the body and protrudes from the surface of the body, and wherein a first protrusion of the plurality of protrusions is positioned on a first side of the leaf spring and a second protrusion of the plurality of protrusions is positioned on a second side of the leaf spring that is opposite of the first side, wherein the body comprises a first body extension supporting the plurality of protrusions and a second body extension orthogonal to the first body extension, the second body extension coupled to the chassis.

5. The apparatus of claim 4, wherein the leaf spring has a spring force that is greater than the external force.

6. The apparatus of claim 5, wherein a thickness of the leaf spring is based on the spring force, wherein the thickness of the leaf spring correlates to the spring force.

7. The apparatus of claim 4, wherein a length of the plurality of protrusions is based on a height of the PCB.

8. The apparatus of claim 4, wherein the body and the plurality of protrusions are comprised of a polymeric material.

9. The apparatus of claim 4, wherein the body and the plurality of protrusions are comprised of a metallic alloy.

10. The apparatus of claim 4, wherein the external force corresponds to a shock force to be exerted on the apparatus.

11. The apparatus of claim 4, wherein the external force corresponds to a vibration force to be exerted on the apparatus.

* * * * *